(12) United States Patent
Yamamoto et al.

(10) Patent No.: US 11,493,363 B2
(45) Date of Patent: Nov. 8, 2022

(54) CAPACITIVE SENSOR

(71) Applicant: HOSIDEN CORPORATION, Yao (JP)

(72) Inventors: Kazuhiro Yamamoto, Yao (JP); Kyung Ho Lee, Yao (JP)

(73) Assignee: Hosiden Corporation, Yao (JP)

( * ) Notice: Subject to any disclaimer, the term of this patent is extended or adjusted under 35 U.S.C. 154(b) by 49 days.

(21) Appl. No.: 17/326,758

(22) Filed: May 21, 2021

(65) Prior Publication Data

US 2021/0381855 A1    Dec. 9, 2021

(30) Foreign Application Priority Data

Jun. 4, 2020    (JP) .............................. JP2020-097813

(51) Int. Cl.
*G01D 5/24*   (2006.01)
*G01R 27/26*  (2006.01)
*G06F 3/044*  (2006.01)

(52) U.S. Cl.
CPC .......... *G01D 5/24* (2013.01); *G01R 27/2605* (2013.01); *G06F 3/0445* (2019.05); *G06F 3/0446* (2019.05); *G06F 3/0448* (2019.05)

(58) Field of Classification Search
CPC ........ G01R 27/00; G01R 27/02; G01R 27/26; G01R 27/2605; G01D 5/00; G01D 5/12;
(Continued)

(56) References Cited

U.S. PATENT DOCUMENTS 9,250,739 B2 * 2/2016 Kwon, II ............... G06F 3/0446
9,342,201 B2 * 5/2016 Murase ............... G06F 3/04166
(Continued)

FOREIGN PATENT DOCUMENTS

EP    3 210 305      8/2017
JP    2019-029166 A  2/2019
(Continued)

OTHER PUBLICATIONS

Extended European Search Report for European Patent Application No. 21177015.1, issued from the European Patent Office, dated Oct. 29, 2021, 13 pages.

*Primary Examiner* — Hoai-An D. Nguyen
(74) *Attorney, Agent, or Firm* — Kilyk & Bowersox, P.L.L.C.

(57) ABSTRACT

A capacitive sensor including a substrate, detection and drive electrodes, and a controller. The substrate includes one or a plurality of insulating layers including first and second faces. The detection electrode includes mutually electrically connected detection lines arrayed at spaced intervals on the first face. The drive electrode includes mutually electrically connected drive lines each arranged on the first or second face and located between adjacent two of the detection lines. When a target approaches the detection electrode being charged and discharged by the controller, the approach causes a change in a first capacitance between the detection electrode and the target. When a target approaches the detection and drive electrodes while the controller is supplying drive pulses to the drive electrode, the approach
(Continued)

causes a change in a second capacitance between the detection electrode and the drive electrode. The controller detects the target referring to changes in the first and second capacitances.

22 Claims, 28 Drawing Sheets

(58) Field of Classification Search
CPC .... G01D 5/14; G01D 5/24; G06F 3/00; G06F 3/01; G06F 3/03; G06F 3/041; G06F 3/0416; G06F 3/04166; G06F 3/041662; G06F 3/044; G06F 3/0445; G06F 3/0446; G06F 3/0448; G06F 2203/00; G06F 2203/041; G06F 2203/04103; G06F 2203/04112; H03K 17/00; H03K 17/94; H03K 17/96; H03K 17/962; H03K 2017/9602; H03K 2217/00; H03K 2217/94; H03K 2217/96; H03K 2217/9607; H03K 2217/960755; H03K 2217/960765; H03K 2217/960775

USPC ....... 324/600, 649, 658, 661, 662, 663, 671, 324/672, 676, 678, 679, 684, 686; 345/156, 173, 174
See application file for complete search history.

(56) References Cited

U.S. PATENT DOCUMENTS

| | | | |
|---|---|---|---|
| 9,524,068 B2 * | 12/2016 | Kita | G06F 3/0412 |
| 9,563,311 B2 * | 2/2017 | Yamaguchi | G06F 3/0446 |
| 2012/0062510 A1 * | 3/2012 | Mo | G06F 3/0446 345/174 |
| 2015/0022500 A1 * | 1/2015 | Kita | G02F 1/134363 345/87 |
| 2017/0199611 A1 | 7/2017 | Brunet et al. | |
| 2018/0120615 A1 * | 5/2018 | Wang | G06F 3/0443 |
| 2019/0102009 A1 | 4/2019 | Takada et al. | |
| 2020/0042118 A1 * | 2/2020 | Mugiraneza | G06F 3/0446 |

FOREIGN PATENT DOCUMENTS

| | | |
|---|---|---|
| KR | 20-2015-0004377 U | 12/2015 |
| WO | 2016064438 A1 | 4/2016 |

* cited by examiner

CAPACITIVE SENSOR

CROSS-REFERENCE TO RELATED APPLICATIONS

The present application claims priority under 35 U.S.C. § 119 of Japanese Patent Application No. 2020-097813 filed on Jun. 4, 2020, the disclosure of which is expressly incorporated by reference herein in its entirety.

BACKGROUND OF THE INVENTION

Technical Field

The invention relates to capacitive sensors.

Background Art

JP 2019-29166 A describes a conventional capacitive sensor. This capacitive sensor includes a detection electrode, a drive electrode, a circuit board, and a controller. The detection electrode and the drive electrode can be configured such that the detection electrode and the drive electrode are arranged side-by-side on a face of the circuit board, such that the detection electrode is provided on a face of the circuit board and the drive electrode surrounds the detection electrode on the face of the circuit board, or such that the detection electrode is provided on a face of the circuit board and the drive electrode is provided on the other face of the circuit board and overlaps the detection electrode.

The controller is configured to perform a self-capacitive sensing, a mutual capacitive sensing, and a combined capacitive sensing combining a self-capacitive sensing and a mutual capacitive sensing in order to determine whether a detection target, which is a human body, has touched a detection face.

In the self-capacitive sensing, the controller activates the detection electrode and deactivates the drive electrode. In this state, when a detection target makes contact with the detection face and approaches the detection electrode, there is a change in a first capacitance between the detection electrode and the detection target. On the basis of the change in the first capacitance, the controller detects the touch by the detection target.

In the mutual capacitive sensing, the controller deactivates the detection electrode and activates the drive electrode, resulting in electrostatic coupling between the drive electrode and the detection electrode. In this state, when a detection target makes contact with the detection face and approaches the drive electrode and the detection electrode, there is a change in a second capacitance between the drive electrode and the detection electrode. On the basis of the change in the second capacitance, the controller detects the touch by the detection target.

In the combined capacitive sensing, the controller activates the detection electrode and the drive electrode. In this state, when a detection target makes contact with the detection face and approaches the drive electrode and the detection electrode, there are a change in a first capacitance between the detection electrode and the detection target and a change a second capacitance between the drive electrode and the detection electrode. On the basis of the changes in the first and second capacitances, the controller detects the touch by the detection target.

Comparing the case where the detection target is in contact with the detection face and exists in the vicinity of the detection electrode and the drive electrode to the case where a conductor deposit, such as water, exists on the detection face and in the vicinity of the detection electrode and the drive electrode, the first capacitance changes in similar manners but the second capacitance changes in different manners. Therefore, the controller can detect the touch by the detection target, distinguishing it from the conductor deposit, on the basis of the changes in the first and second capacitances by the combined capacitive sensing.

SUMMARY OF INVENTION

As described above, the detection electrode and the drive electrode are arranged side-by-side, the drive electrode surrounds the detection electrode, or the detection electrode overlaps the detection electrode. In any of these cases, if a conductor deposit adheres to the detection face to be located above a central portion of the detection electrode, for example, the conductor deposit is located away from the drive electrode. This arrangement can change the capacitance between the conductor deposit and the detection electrode, but not the capacitance between the detection electrode and the drive electrode due to the existence of the conductor deposit. In this case, the controller may erroneously detect the conductor deposit as a detection target only on the basis of the change in the first capacitance.

The invention provides a capacitive sensor with an increased possibility that a conductor deposit causes a change in a capacitance between a detection electrode and a drive electrode.

A capacitive sensor according to an aspect of the invention includes a substrate, a detection electrode, a drive electrode, and a controller. The substrate includes one or a plurality of layers. The one or plurality of layers includes a first face and a second face that are different from each other in a first direction. The or each layer is insulating. The first direction is a thickness direction of the substrate. The detection electrode includes a plurality of first detection lines. The first detection lines are electrically connected to each other and arrayed at spaced intervals on the first face. The drive electrode includes a plurality of first drive lines electrically connected to each other. Each of the first drive lines is arranged on one of the first and second faces such as to be located between adjacent two of the first detection lines as viewed from one side in the first direction. The controller is configured to charge and discharge the detection electrode and supply drive pulses to the drive electrode. When a detection target approaches the detection electrode while the detection electrode is being charged and discharged, the approach causes a change in a first capacitance between the detection electrode and the detection target. When a detection target approaches the detection electrode and the drive electrode while drive pulses are being supplied to the drive electrode, the approach causes a change in a second capacitance between the detection electrode and the drive electrode. The controller is further configured to detect the detection target on the basis of changes in the first and second capacitances.

In the capacitive sensor of this aspect, each of the first drive lines of the drive electrode is located between the adjacent first detection lines. Thus, a conductor deposit is located on a substantially Z-direction side relative to at least one of the first drive lines and the first detection line adjacent thereto, so that it is possible to change a mutual capacitance in the second capacitance which is formed between the at least one first drive line and the first detection line adjacent thereto. Therefore, the possibility that the second capacitance is changed by the conductor deposit is increased, and the possibility that the controller erroneously detects the conductor deposit as the detection target is reduced.

The detection electrode may further include at least one second detection line electrically connected to the first detection lines. The at least one second detection line may be arranged on one of the first and second faces.

The drive electrode may further include at least one second drive line electrically connected to the first drive lines. The at least one second drive line may be arranged on one of the first and second faces.

The first detection lines may extend in a second direction and may be arrayed at spaced intervals in a third direction. The second direction may be substantially orthogonal to the first direction, and the third direction may be substantially orthogonal to the first direction and intersecting the second direction. The at least one second detection line may extend in the third direction and may intersect the first detection lines on the first face. The at least one second detection line may a plurality of second detection lines. In this case, the second detection lines may be arranged on the first face at spaced intervals in the second direction and may intersect the first detection lines.

The first drive lines may extend in the second direction and may be arranged on the second face at spaced intervals in the third direction. The at least one second drive line may extend in the third direction. The at least one second drive line may include a plurality of second drive lines.

Where the at least one second detection line includes a plurality of second detection lines and the at least one second drive line includes a plurality of second drive lines, each of the second drive lines may be arranged on the second face such as to be located between adjacent two of the second detection lines as viewed from the one side in the first direction and intersect the first drive lines.

The drive electrode may further include at least one third drive line electrically connected to the first drive lines and the at least one second drive line. The at least one third drive line may be arranged on the second face such as to extend along, and overlap as viewed from the one side in the first direction, at least one of the first detection lines.

The drive electrode may further include at least one fourth drive line electrically connected to the first drive lines, the at least one second drive line, and the at least one third drive line. In this case, the at least one second detection line may be arranged on the first face. The at least one fourth drive line may be arranged on the second face such as to overlap at least one of the at least one second detection line as viewed from the one side in the first direction.

The at least one third drive line may include a plurality of third drive lines. The third drive lines may be arranged on the second face such as to overlap the corresponding first detection lines as viewed from the one side in the first direction. The third drive lines and the first drive lines may be arranged alternately in an array direction thereof.

Where the at least one second detection line includes a plurality of second detection lines, the at least one fourth drive line may include a plurality of fourth drive lines. The fourth drive lines may be arranged on the second face such as to overlap the corresponding second detection lines as viewed from the one side in the first direction. The fourth drive lines and the second drive lines may be arranged alternately in an array direction thereof.

Where the first detection lines extend in the second direction and are arrayed at spaced intervals in the third direction, each of the first detection lines may include a first end on one side in the second direction and a second end on the other side in the second direction. The first detection lines may include a first detection line on one side in the third direction, which may be one of the first detection lines that is located on the most one side in the third direction, and a first detection line on the other side in the third direction, which may be one of the first detection lines that is located on the most other side in the third direction.

The at least one second detection line may include a pair of second detection lines arranged on the first face. The second detection lines may include one second detection line and the other second detection line, the one second detection line may be coupled to the first end of each of the first detection lines, and the other second detection line may be coupled to the second ends of the first detection lines.

The at least one second drive line may include a main body having a ring shape or a partially discontinuous ring shape and being provided on the second face of the substrate. The main body may include a first portion being an inner perimeter portion of the main body. The first portion of the main body may be located such as to overlap the first detection line on the one side in the third direction, the first detection line on the other side in the third direction, and the pair of second detection lines as viewed from the one side in the first direction.

The first drive lines may each have a first end on the one side in the second direction and a second end on the other side in the second direction.

The at least one second drive line may further include a plurality of first connecting portions and a plurality of second connecting portions. Where the first drive lines are arranged on the first face, each of the first connecting portions may extend on the second face, from the first portion of the main body to a position on the other side in the first direction relative to the first end of a corresponding one of the first drive lines, and a distal end of each of the first connecting portions may be connected to the first end of the corresponding first drive line via a through-hole electrode of the substrate. Each of the second connecting portions may extend on the second face, from the first portion of the main body to a position on the other side in the first direction relative to the second end of a corresponding one of the first drive lines, and a distal end of each of the second connecting portions may be connected to the second end of the corresponding first drive line via another through-hole electrode of the substrate. The first and second connecting portions may be omitted, in which case the first drive lines may extend on the second face, from a portion on the one side in the second direction of the first portion of the main body to a portion on the other side in the first direction of the first portion of the main body.

Where the at least one second detection line includes a plurality of second detection lines, the first detection lines and the second detection lines may mutually intersect forming a mesh pattern on the first face and may be mutually connected electrically at intersections thereof. The mesh constituted by the first detection lines and the second detection lines may have a plurality of first clearances as viewed from the one side in the first direction, each of the first clearances including four spaces. In this case, the four spaces of each first clearance may be defined by adjacent two of the first detection lines, adjacent two of the second detection lines that intersect the adjacent two first detection lines, one of the first drive lines that is located between the adjacent two first detection lines, and one of the second drive lines that is located between the adjacent two second detection lines. Alternatively, the first drive lines and the second drive lines may mutually intersect forming a mesh pattern on the first face and may be mutually electrically connected at intersections thereof. The mesh constituted by the first drive lines and the second drive lines may have a plurality of third clearances as viewed from the one side in the first direction, each of the third clearances including four spaces.

The detection electrode may further include a third detection line. The third detection line may have a ring shape or a partially discontinuous ring shape, may be arranged on the first face such as to surround at least the first detection lines, and may be coupled to opposite ends in a longitudinal direction of the first detection lines. Where the at least one second detection line is provided on the first face, the third detection line may be arranged on the first face such as to surround at least the first detection lines and at least the second detection lines, and may be coupled to opposite ends in a longitudinal direction of the first detection lines and to opposite ends in a longitudinal direction of the second detection lines.

The layers of the substrate may further include a third face. The third face may be different from the first and second faces in the first direction and arranged on the other side in the first direction relative to the second face.

The capacitive sensor of any of the above aspects may further include a ground electrode. The ground electrode may include a plurality of first ground lines and/or at least one second ground line on the third face. The first ground lines may be arranged such as to overlap the respective first detection lines or the respective first drive lines as viewed from the one side in the first direction. The at least one second ground line may be arranged on the third face such as to overlap the at least one second detection line as viewed from the one side in the first direction. The at least one second ground line may include a plurality of second ground lines. The second ground lines may be arranged such as to overlap the respective second detection lines or the respective second drive lines as viewed from the one side in the first direction.

Where the first ground lines and the second ground lines are provided, the first ground lines and the second ground lines may mutually intersect forming a mesh pattern on the third face and may be mutually electrically connected at intersections thereof.

The mesh constituted by the first ground lines and the second ground lines has a plurality of clearances being a plurality of gaps. Each gap is defined by adjacent two of the first ground lines and adjacent two of the second ground lines that intersect the adjacent two first ground lines, and is located on the other side in the first direction relative to the four spaces.

Two spaces may be provided between adjacent two of the first detection lines and one of the first drive lines that is located between the adjacent two first detection lines. Alternatively, two spaces may be provided between adjacent two of the first drive lines and one of the first detection lines that is located between the adjacent two first drive lines as viewed from the one side in the first direction.

A gap may be provided between adjacent two of the first ground lines and may be located on the other side in the first direction relative to the two spaces.

The detection electrode may further include a fifth drive line having a ring shape or a partially discontinuous ring shape. Where the third detection line is provided, the fifth drive line may be arranged on the first face such as to surround the third detection line. Where the third detection line is not provided, the fifth drive line may be provided on the first face such as to surround at least the first detection lines.

The ground electrode may include a third ground line having a ring shape or a partially discontinuous ring shape. The third ground line may be provided on the first face such as to surround the fifth drive line. The third ground line may be provided on the first face such as to surround not the fifth drive line but the first detection lines, the second detection lines, and/or the third detection line.

The ground electrode may further include at least one fourth ground line electrically connected to the first ground lines. The at least one fourth ground line may be arranged on the third face such as to overlap at least one of the first drive lines as viewed from the one side in the first direction. The or each fourth ground line may be located between adjacent two of the first ground lines with gaps between the or each fourth ground line and the adjacent two first ground lines. In this case, the gaps may be located on the other side in the first direction relative to the spaces.

The at least one fourth ground line may include a plurality of fourth ground lines. The fourth ground lines may be arranged on the third face such as to overlap the respective first drive lines as viewed from the one side in the first direction.

The ground electrode may include a plurality of sixth ground lines and a plurality of seventh ground lines. The sixth ground lines and the seventh ground lines may mutually intersect forming a mesh pattern on the third face and may be mutually connected electrically at intersections thereof. The sixth ground lines may include a plurality of first ground lines. The sixth ground lines may further include a plurality of fourth ground lines.

The mesh constituted by the sixth ground lines and the seventh ground lines may have a plurality of clearances being a plurality of gaps. The gaps may include a plurality of gaps located between adjacent two of the first and fourth ground lines and located on the other side in the first direction relative to the spaces.

The detection electrode may further include a plurality of fourth detection lines. Where the first drive lines are arranged on the first face, the fourth detection lines may be arranged on the second face such as to overlap the respective first drive lines as viewed from the one side in the first direction.

The detection electrode may further include at least one fifth detection line electrically connected to the first detection lines, the at least one second detection line, and the fourth detection lines. The at least one fifth detection line may intersect the fourth detection lines on the second face.

Figure 1A:
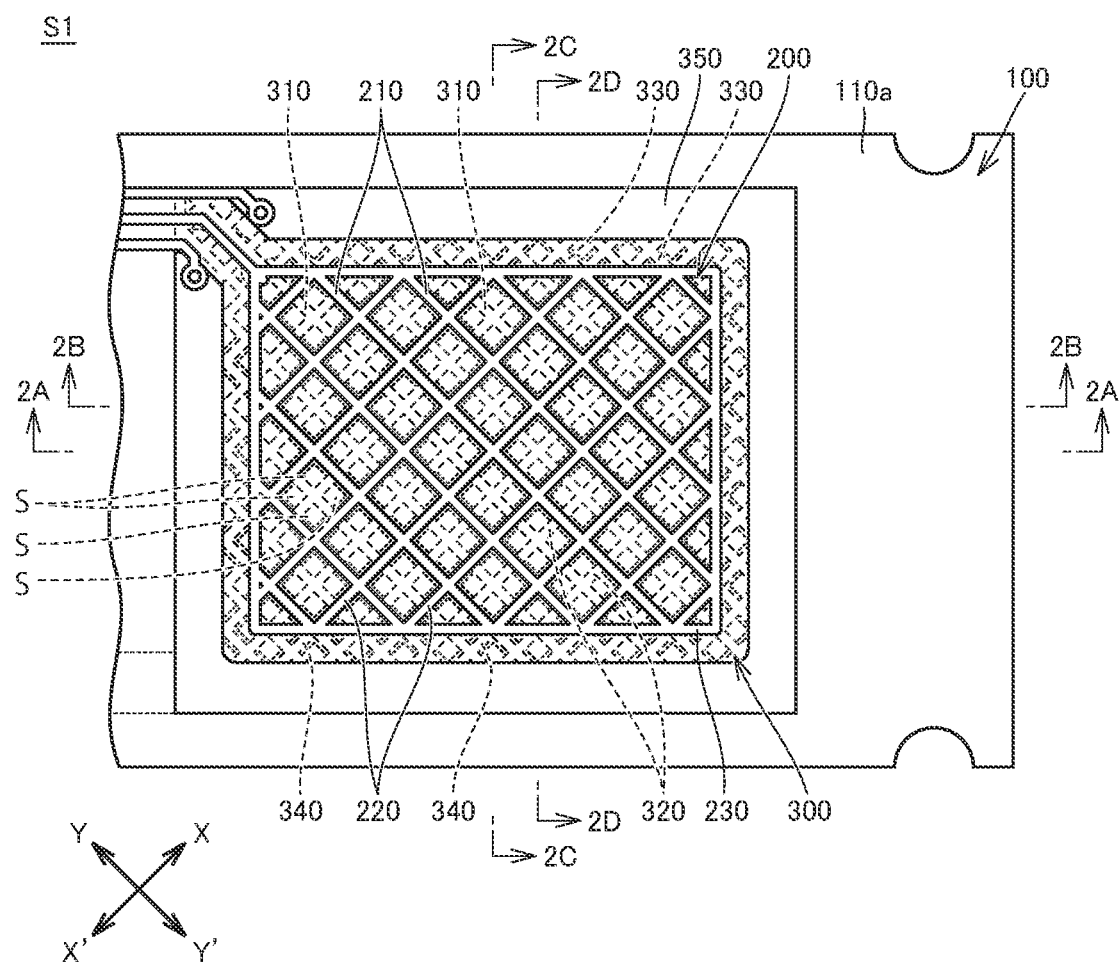
FIG. 1A is a schematic plan view of a capacitive sensor according to a first embodiment of the invention, with a substrate of the capacitive sensor shown as transparent, showing a superposition relationship between a detection electrode, a drive electrode, and a ground electrode.
Figure 1B:
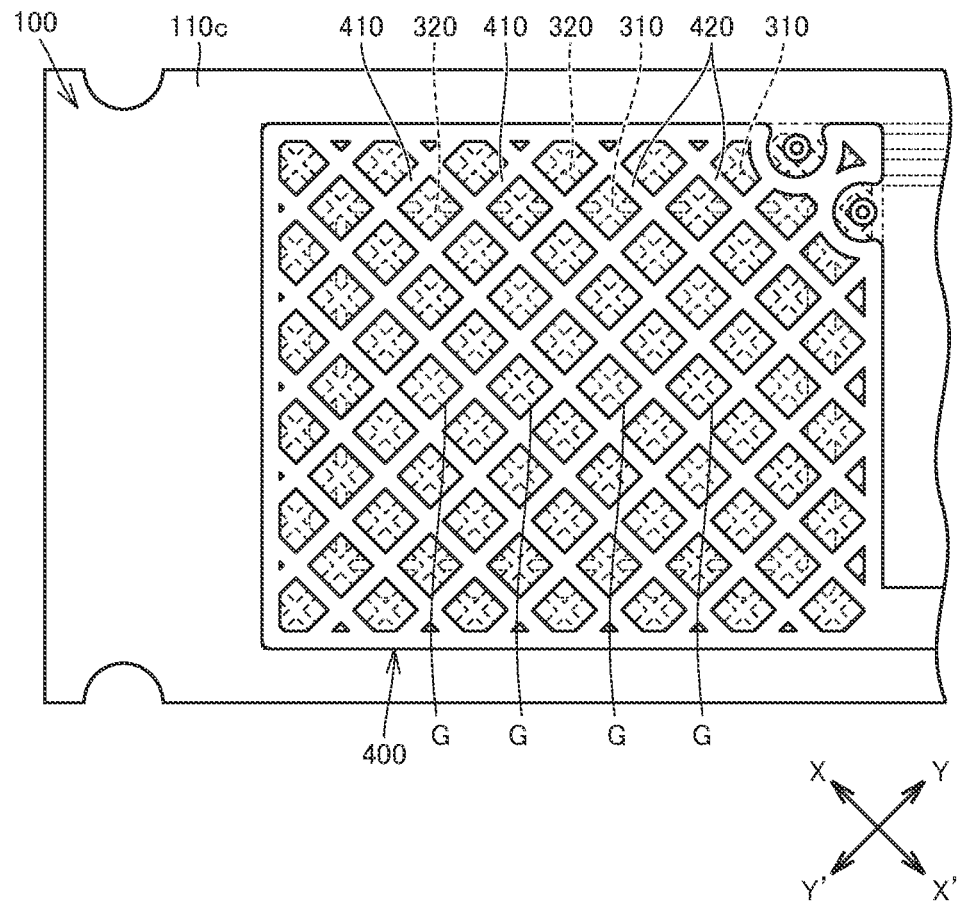
FIG. 1B is a schematic bottom view of the capacitive sensor of the first embodiment, with the substrate of the capacitive sensor shown as transparent, showing a superposition relationship between the detection electrode, the drive electrode, and the ground electrode.

In the brief description of the drawings above and the description of embodiments which follows, relative spatial terms such as "upper", "lower", "top", "bottom", "left", "right", "front", "rear", etc., are used for the convenience of the skilled reader and refer to the orientation of the capacitive sensors and their constituent parts as depicted in the drawings. No limitation is intended by use of these terms, either in use of the invention, during its manufacture, shipment, custody, or sale, or during assembly of its constituent parts or when incorporated into or combined with other apparatus.

DESCRIPTION OF EMBODIMENTS

Hereinafter, first, second, and third embodiments of the invention and variants thereof will be described. It should be noted that components of embodiments and the variants described later can be mutually combined as long as there is no contradiction. It should be also noted that materials, shapes, dimensions, numbers, arrangements, etc. constituting each component in each of aspects of the embodiments and the variants described later are merely examples and may be designed and modified in any manner as long as the same functions are realized.

First Embodiment

Hereinafter described is a capacitive sensor S1 (which may be referred to simply as a sensor S1) according to a plurality of embodiments, including a first embodiment and variants thereof, of the invention, with reference to FIGS. 1A to 8H. FIGS. 1A to 3C show the sensor S1 of the first embodiment. FIGS. 4A to 6C show a first variant of the sensor S1 of the first embodiment. FIGS. 7A and 7B show a second variant of the sensor S1 of the first embodiment. FIGS. 8A to 8H show third to tenth variants of the sensor S1 of the first embodiment. FIGS. 2A to 2D and FIGS. 5A to 5D indicates a Z-Z' direction (first direction). The Z-Z' direction corresponds to a thickness direction of a substrate 100 of the sensor S1 and includes a Z direction (one side in the first direction) and a Z' direction (the other side in the first direction). FIGS. 1A, 1B, 3A to 3C, 4A, 4B, and 6A to 8H show a Y-Y' direction (second direction) and an X-X' direction (third direction). The Y-Y' and X-X' directions are substantially orthogonal to the Z-Z' direction. The Y-Y' direction includes a Y direction (one side in the second direction) and a Y' direction (the other side in the second direction). The X-X' direction is only required to cross the Y-Y' direction and may be substantially orthogonal to the Y-Y' direction. The X-X' direction includes an X direction (one side in the third direction) and an X' direction (the other side in the third direction).

The sensor S1 is configured to detect a touch from the Z-direction side by a detection target, such as a finger of a user, on a detection face distinguishing the detection target from a conductor deposit, such as water, that may adhere to the detection face. In use, the sensor S1 is housed in a housing of a vehicle or an electronic device. The detection face may be provided in the housing, on the Z-direction side relative to the sensor S1. Alternatively, the detection face may be a face on the most Z-direction side of the substrate 100. These two detection faces will be herein described without making a distinction therebetween, but it should be noted that the detection face may be provided in the housing as described above, i.e., may not be a constituent of the sensor S1.

The sensor S1 includes the substrate 100 mentioned above. The substrate 100 includes at least one layer 110. The or each layer 110 is insulating. Where the at least one layer 110 include the single layer 110 (not shown), the substrate 100 is constituted by the layer 110. In this case, the layer 110 is constituted by a single-phase board or a synthetic resin film, for example. Where the at least one layer 110 include the plurality of layers 110 (see FIGS. 2A to 2D and 5A to 5D), the substrate 100 is constituted by the plurality of layers 110 laminated in the Z-Z' direction. In this case, the substrate 100 is constituted by a multilayer board or a multilayer film, for example, and the plurality of layers 110 are constituted by a plurality of layers, laminated in the Z-Z' direction, of the multilayer board, or alternatively a plurality of synthetic resin films, laminated in the Z-Z' direction, of the multilayer film. The synthetic resin film is made of, e.g., one of the following materials or a polymer alloy in which a plurality of materials is selected from the following materials and mixed: polycarbonate (PC), polystyrene (PS), cycloolefin copolymer (COC), cycloolefin polymer (COP), polymethyl methacrylate (PMMA), or polypropylene (PP). The substrate 100 may be flat, or may be partly or entirely bent to form a curved surface.

The one or plurality of layers 110 have a first face 110a and a second face 110b. The or each layer 110 has a face on the Z-direction side and a face on the Z'-direction side. The first face 110a is one of the faces on the Z- and Z'-direction sides of the one or plurality of layers 110. The second face 110b is one of the faces on the Z- and Z'-direction sides of the one or plurality of layers 110 that is different from the first face 110a. The second face 110b may be one of the faces on the Z- and Z'-direction sides of the one or plurality of layers 110 that is located on the Z'-direction side relative to the first face 110a. The one or plurality of layers 110 may further include a plurality of through-hole electrodes (not shown). The plurality of through-hole electrodes can be omitted.

Where the at least one layer 110 include the plurality of layers 110, the layers 110 may further include a third face 110c in addition to the first face 110a and the second face 110b. The third face 110c is one of the faces on the Z- and Z'-direction sides of the layers 110 that is different from, and located on the Z'-direction side relative to, the first face 110a and the second face 110b.

The sensor S1 further includes a detection electrode 200. The detection electrode 200 serves dual functions of a detection electrode for self-capacitive sensing and a detection electrode for mutual capacitive sensing. The detection electrode 200 includes a plurality of first detection lines 210 electrically connected to each other. The first detection lines 210 are made of an electrically conductive material. For example, the first detection lines 210 may be: (a) constituted by a conductor formed on the first face 110a of the substrate 100 by a well-known printing method, photolithography, or other means; or (b) formed by forming a conductor on the first face 110a of the substrate 100 by spattering, electroless plating, or vapor deposition and thereafter removing unnecessary portions of the conductor by laser etching or chemical etching. The first detection lines 210 may extend straight in the Y-Y' direction, or may curve party or entirely but extend generally in the Y-Y' direction. The Y-Y' direction may be, but is not required to be, a direction in which a conductor deposit adhering to the detection face falls under its own weight (where the conductor deposit is water, a direction in which the water moves under its own weight). The first detection lines 210 are arrayed at spaced intervals in the X-X' direction on the first face 110a of the substrate 100. The Y-Y' direction corresponds to the longitudinal direction of the first detection lines 210, and the X-X' direction corresponds to an array direction of the first detection lines 210.

The sensor S1 further includes a drive electrode 300. The drive electrode 300 is a drive electrode for mutual capacitive sensing. The drive electrode 300 includes a plurality of first drive lines 310 electrically connected to each other. The first drive lines 310 are made of a material that is the same or similar to that of the first detection lines 210. The first drive lines 310 may extend straight in the Y-Y' direction, or may curve party or entirely but extend generally in the Y-Y' direction. The first drive lines 310 are arranged on one of the first face 110a and the second face 110b of the substrate 100 and each located between adjacent two of the first detection lines 210 as viewed from the Z-direction side. In other words, the first drive lines 310 and the first detection lines 210 are arranged alternately one after the other in the X-X' direction as viewed from the Z-direction side. Where the first drive lines 310 are provided on the first face 110a (see FIGS. 8B, 8D, 8E, and 8G), each of the first drive lines 310 is spaced from corresponding adjacent two of the first detection lines 210. Accordingly, the first drive lines 310 are not electrically connected to any of first detection lines 210. Where the first drive lines 310 are provided on the second face 110b (see FIGS. 8A, 8C, 8F, and 8H), the first drive lines 310 are provided on the second face 110b, which is different from the first face 110a on which the first detection lines 210 are provided. Accordingly, the first drive lines 310 are not electrically connected to any of the first detection lines 210. FIGS. 8B, 8D, 8E, and 8G show the first detection lines 210 and the first drive lines 310 on the first face 110a in solid lines. FIGS. 8A, 8C, 8F, and 8H show the first detection lines 210 on the first face 110a in solid lines, and the first drive lines 310 on the second face 110b in broken lines.

The first drive lines 310 have a dimension in the Y-Y' direction that may be larger than, substantially the same as, or smaller than, that of the first detection lines 210.

The detection electrode 200 may further include at least one second detection line 220. The one or plurality of second detection lines 220 are electrically connected to the plurality of first detection lines 210, but not to the plurality of first drive lines 310. The one or plurality of second detection lines 220 are made of a material that is the same or similar to that of the first detection lines 210. The one or plurality of second detection lines 220 may extend straight in the X-X' direction, or may curve party or entirely but extend generally in the X-X' direction. The one or plurality of second detection lines 220 are arranged on one of the first face 110a and the second face 110b of the substrate 100. For example, the one or plurality of second detection lines 220 may have one of the following configurations (1) to (4). FIGS. 8A to 8D show the second detection lines 220 on the first face 110a are shown in solid lines, and FIGS. 8E to 8H show the second detection lines 220 on the second face 110b in broken lines.

(1) The at least one second detection line 220 include the single second detection line 220 arranged on the first face 110a of the substrate 100. The second detection line 220 intersects the plurality of first detection lines 210 and is electrically connected to the first detection lines 210 at the intersections.

(2) The at least one second detection line 220 include the plurality of second detection lines 220 arranged on the first face 110a of the substrate 100 at spaced intervals in the Y-Y' direction (see FIGS. 8A to 8D). The second detection lines 220 intersect the plurality of first detection lines 210 and are electrically connected to the first detection lines 210 at the intersections. For example, the first detection lines 210 and the second detection lines 220 may mutually intersect forming a mesh pattern (see FIGS. 1A to 7B). In this case, the first detection lines 210 and the second detection lines 220 may be constituted by the conductor described above or by a mesh-patterned metal plate.

(3) The at least one second detection line 220 include the single second detection line 220 arranged on the second face 110b of the substrate 100. The second detection line 220 intersects the plurality of first detection lines 210 as viewed from the Z-direction side and is electrically connected to the first detection lines 210 via the through-hole electrodes of the substrate 100.

(4) The at least one second detection line 220 include the plurality of second detection lines 220 arranged on the second face 110b of the substrate 100 at spaced intervals (see FIGS. 8E to 8H). The second detection lines 220 intersect the plurality of first detection lines 210 as viewed from the Z-direction side and are electrically connected to the first detection lines 210 via the corresponding through-hole electrodes of the substrate 100.

Where the at least one second detection line 220 and the plurality of first drive lines 310 are provided on the same face (first face 110a or second face 110b) of the substrate 100, the at least one second detection line 220 is arranged away from the first drive lines 310 (see FIGS. 8B, 8D, 8F, and 8H). For example, the at least one second detection line 220 may intersect one end portions in the longitudinal direction of the first detection lines 210 as viewed from the Z-direction side, and the first drive lines 310 may be arranged between the other end portions in the longitudinal direction of the first detection lines 210.

The drive electrode 300 may further include at least one second drive line 320. The one or plurality of second drive lines 320 are electrically connected to the plurality of first drive lines 310, but are not to the plurality of first detection lines 210 nor the one or plurality of second detection lines 220. The one or plurality of second drive lines 320 are made of a material that is the same or similar to that of the first detection lines 210. The one or plurality of second drive lines 320 may extend straight in the X-X' direction, or may curve party or entirely but extend generally in the X-X' direction. The one or plurality of second drive lines 320 are arranged on one of the first face 110a and the second face 110b of the substrate 100. For example, the at least one second drive line 320 may have one of the following configurations (5) to (12). FIGS. 8C, 8D, 8E, and 8F show the second drive lines 320 on the first face 110a in solid lines, and FIGS. 8A, 8B, 8G, and 8H shown the second drive lines 320 on the second face 110b in broken lines.

(5) On the precondition that the one or plurality of second detection lines 220 are provided on the first face 110a of the substrate 100 and the plurality of first drive lines 310 are provided on the second face 110b of the substrate 100 (see FIG. 8A), the one or plurality of second drive lines 320 is arranged on the second face 110b of the substrate 100, intersects the first drive lines 310, and is electrically connected to the first drive lines 310 at the intersections. Where the at least one second drive line 320 includes the plurality of second drive lines 320 and the at least one second detection line 220 includes the plurality of second detection lines 220, the first detection lines 210 and the second detection lines 220 may mutually intersect forming a mesh pattern on the first face 110a, and the first drive lines 310 and the second drive lines 320 may mutually intersect forming a mesh pattern on the second face 110b (see FIGS. 4A to 7B). In this case, each of the first drive lines 310 is arranged on the second face 110b to be located between adjacent two of the first detection lines 210 as viewed from the Z-direction side, and each of the second drive lines 320 is arranged on the second face 110b to be located between adjacent two of the second detection lines 220 as viewed from the Z-direction side. In other words, the first drive lines 310 and the first detection lines 210 are arranged alternately one after the other in the X-X' direction as viewed from the Z-direction side, and the second drive lines 320 and the second detection lines 220 are arranged alternately one after the other in the Y-Y' direction as viewed from the Z-direction side. The first drive lines 310 and the second drive lines 320 intersecting in a mesh pattern may be constituted by the conductor described above or by a mesh-patterned metal plate, similarly to the of first detection lines 210 and the second detection lines 220 intersecting in a mesh pattern.

(6) On the precondition that the one or plurality of second detection lines 220 are provided on the second face 110b of the substrate 100 and the plurality of first drive lines 310 are provided on the first face 110a of the substrate 100 (see FIG. 8G), the one or plurality of second drive lines 320 is arranged away from the one or plurality of second detection lines 220 on the second face 110b of the substrate 100 and intersects the first drive lines 310 as viewed from the Z-direction side. The one second drive line 320 is electrically connected to the first drive lines 310 at the intersections via through-hole electrodes of the substrate 100, or alternatively the plurality of second drive lines 320 is electrically connected to the first drive lines 310 at the intersections via the corresponding through-hole electrodes of the substrate 100.

(7) On the precondition that the one or plurality of second detection lines 220 are provided on the first face 110a of the substrate 100, and the plurality of first drive lines 310 are provided on the second face 110b of the substrate 100 (see FIG. 8C), the one or plurality of second drive lines 320 is arranged away from the first detection lines 210 and the one or plurality of second detection lines 220 on the first face 110a of the substrate 100 and intersects the first drive lines 310 as viewed from the Z-direction side. The one second drive line 320 is electrically connected to the first drive lines 310 at the intersections via through-hole electrodes of the substrate 100, or alternatively the plurality of second drive lines 320 is electrically connected to the first drive lines 310 at the intersections via the corresponding through-hole electrodes of the substrate 100.

(8) On the precondition that the one or plurality of second detection lines 220 are provided on the second face 110b of the substrate 100, and the plurality of first drive lines 310 is provided on the first face 110a of the substrate 100 (see FIG. 8E), the one or plurality of second drive lines 320 is arranged away from the first detection lines 210 on the first face 110a of the substrate 100, intersects the first drive lines 310, and is electrically connected to the first drive lines 310 at the intersections.

(9) On the precondition that the one or plurality of second detection lines 220 and the plurality of first drive lines 310 are provided on the first face 110a of the substrate 100 (see FIG. 8B), the one or plurality of second drive lines 320 is arranged on the second face 110b of the substrate 100 and intersects the first drive lines 310 as viewed from the Z-direction side. The one second drive line 320 is electrically connected to the first drive lines 310 at the intersections via through-hole electrodes of the substrate 100, or alternatively the plurality of second drive lines 320 is electrically connected to the first drive lines 310 via the corresponding through-hole electrodes of the substrate 100.

(10) On the precondition that the one or plurality of second detection lines 220 and the plurality of first drive lines 310 are provided on the first face 110a of the substrate 100 (see FIG. 8D), the one or plurality of second drive lines 320 are arranged away from the plurality of first detection lines 210 and the one or plurality of second detection lines 220 on the first face 110a of the substrate 100, intersect the first drive lines 310, and are electrically connected to the first drive lines 310 at the intersections.

(11) On the precondition that the one or plurality of second detection lines 220 are provided on the second face 110b of the substrate 100, and the plurality of first drive lines 310 is provided on the second face 110b of the substrate 100 (see FIG. 8F), the one or plurality of second drive lines 320 is arranged away from the plurality of first detection lines 210 on the first face 110a of the substrate 100 and intersects the first drive lines 310 as viewed from the Z-direction side. The one second drive line 320 is electrically connected to the first drive lines 310 at the intersections via through-hole electrodes of the substrate 100, or alternatively the plurality of second drive lines 320 is electrically connected to the first drive lines 310 via the corresponding through-hole electrodes of the substrate 100.

(12) On the precondition that the one or plurality of second detection lines 220 are provided on the second face 110b of the substrate 100 and the plurality of first drive lines 310 are provided on the second face 110b of the substrate 100 (see FIG. 8H), the one or plurality of second drive lines 320 are arranged away from the one or plurality of second detection lines 220 on the second face 110b of the substrate 100, intersect the first drive lines 310, and are electrically connected to the first drive lines 310 at the intersections.

The or each second drive line 320 has a dimension in the X-X' direction that may be larger than, substantially the same as, or smaller than, that of the at least one second detection line 220.

The drive electrode 300 may further include at least one third drive line 330. The one or plurality of third drive lines 330 are electrically connected to the plurality of first drive lines 310 and the one or plurality of second drive lines 320, but not to the plurality of first detection lines 210 nor the one or plurality of second detection lines 220. The one or plurality of third drive lines 330 are made of a material that is the same or similar to that of the first detection lines 210.

Where the at least one third drive line 330 include the single third drive line 330, the third drive line 330 is arranged on the second face 110b of the substrate 100 such as to extend generally along, and overlap as viewed from the Z-direction side, one of the first detection lines 210.

Where the at least one third drive line 330 include the plurality of third drive lines 330, the third drive lines 330 are arranged on the second face 110b of the substrate 100 such as to extend generally along, and overlap as viewed from the Z-direction side, the respective first detection lines 210. In this case, the third drive lines 330 and the first drive lines 310 are arranged alternately one after the other in the array direction thereof (X-X' direction).

The or each third drive line 330 may, but is not required to, has a width dimension (dimension in the X-X' direction) that is substantially the same as that of the overlapping first detection line 210. Where the one or plurality of second detection lines 220 are provided on the second face 110b, the one or plurality of third drive lines 330 are arranged away from the one or plurality of second detection lines 220 on the second face 110b. The or each third drive line 330 has a dimension in the Y-Y' direction that may be larger than, substantially the same as, or smaller than, that of the overlapping first detection line 210.

The drive electrode 300 may further include at least one fourth drive line 340. In this case, the at least one second detection line 220 is arranged on the first face 110a of the substrate 100. The one or plurality of fourth drive lines 340 are electrically connected to the plurality of first drive lines 310, the one or plurality of second drive lines 320, and the one or plurality of third drive lines 330, but not to the plurality of first detection lines 210 nor the one or plurality of second detection lines 220. The one or plurality of fourth drive lines 340 are made of a material that is the same or similar to that of the first detection lines 210.

Where the at least one fourth drive line 340 include the single fourth drive line 340, the fourth drive line 340 is arranged on the second face 110b of the substrate 100 such as to extend generally along the second detection line 220 or one of the second detection lines 220, overlap the second detection line 220 or the one second detection line 220 as viewed from the Z-direction side. The fourth drive line 340 intersects at least the one or plurality of third drive lines 330 and is electrically connected to the one or plurality of third drive lines 330 at the intersection or intersections.

Where the at least one fourth drive line 340 includes the plurality of fourth drive lines 340 and the at least one second detection line 220 includes the plurality of second detection lines 220(see FIGS. 1A to 2D and 3B), the fourth drive lines 340 are arranged on the second face 110b of the substrate 100 such as to extend along, and overlap as viewed from the Z-direction side, the respective second detection lines 220. The fourth drive lines 340 intersect at least the one or plurality of third drive lines 330 and are electrically connected to the one or plurality of third drive lines 330 at the intersections.

The or each fourth drive line 340 may, but is not required to, have a width dimension (dimension in the Y-Y' direction) that is substantially the same as that of the overlapping second detection line 220. The or each fourth drive line 340 has a dimension in the X-X' direction that that may be larger than, substantially the same as, or smaller than, that of the overlapping second detection line 220.

Where the plurality of second detection lines 220 are provided on the first face 110a of the substrate 100 and the plurality of first drive lines 310, the plurality of second drive lines 320, the plurality of third drive lines 330, and the plurality of fourth drive lines 340 are provided on the second face 110b, the plurality of first detection lines 210 and the second detection lines 220 may mutually intersect forming a mesh pattern on the first face 110a, and the first drive lines 310, the second drive lines 320, the third drive lines 330, and the fourth drive lines 340 may be arranged to form a mesh pattern on the second face 110b (FIGS. 1A to 3C). Also in this case, each of the first drive lines 310 is located between adjacent two of the first detection lines 210 as viewed from the Z-direction side, and each of the second drive lines 320 is located between adjacent two of the second detection lines 220 as viewed from the Z-direction side. The first drive lines 310 and the third drive lines 330 are arranged alternately one after the other in the array direction thereof (X-X' direction), and the second drive lines 320 and the fourth drive lines 340 are arranged alternately one after the other in the array direction thereof (Y-Y' direction).

Regardless of whether the plurality of third drive lines 330 and the plurality of fourth drive lines 340 are provided, where the plurality of first detection lines 210 and the plurality of second detection lines 220 mutually intersect forming a mesh pattern on the first face 110a and the plurality of first drive lines 310 and the plurality of second drive lines 320 mutually intersect forming a mesh pattern on the second face 110b (see FIGS. 1A and 4A), the mesh constituted by the first detection lines 210 and the second detection lines 220 as viewed from the Z direction has a plurality of clearances, each of which include four spaces S. In other words, there are a plurality of sets of four spaces S. The four spaces S of each set are defined by adjacent two of the first detection lines 210, adjacent two of the second detection lines 220 that intersect the adjacent two first detection lines 210, one of the first drive lines 310 that is located between the adjacent two first detection lines 210, and one of the second drive lines 320 that is located between the adjacent two second detection lines 220.

The detection electrode 200 may further include a third detection line 230 (see FIGS. 1A, 3A, 4A, 6A, 7A and 7B). The third detection line 230 is electrically connected to the plurality of first detection lines 210 and the one or plurality of second detection lines 220, but not to the plurality of first drive lines 310, the one or plurality of second drive lines 320, the one or plurality of third drive lines 330, nor the one or plurality of fourth drive lines 340. The third detection line 230 has a ring shape or a partially discontinuous ring shape, and is made of a material that is the same or similar to that of the first detection lines 210. The third detection line 230 is provided on the first face 110a of the substrate 100, surrounds at least the first detection lines 210, and is coupled to opposite ends in the longitudinal direction of the first detection lines 210. Where the one or plurality of second detection lines 220 are provided on the first face 110a of the substrate 100, and the plurality of first drive lines 310 and the one or plurality of second drive lines 320 are provided on the second face 110b of the substrate 100, the third detection line 230 is provided on the first face 110a of the substrate 100, surrounds the first detection lines 210 and the one or plurality of second detection lines 220, and is coupled to opposite ends in the longitudinal direction of the first detection lines 210 and opposite ends in the longitudinal direction of the one or plurality of second detection lines 220 (see FIGS. 3A, 6A, and 7B). The third detection line 230 can be omitted.

Where the third detection line 230 is provided, the drive electrode 300 may further include a fifth drive line 350 (see FIGS. 1A, 3A, 4A, 6A, 7A and 7B). The fifth drive line 350 has a ring shape or a partially discontinuous ring shape, and is made of a material that is the same or similar to that of the first detection lines 210. The fifth drive line 350 is arranged on the first face 110a of the substrate 100 and surrounds the third detection line 230. The fifth drive line 350 is electrically connected to the plurality of first drive lines 310, the one or plurality of second drive lines 320, the one or plurality of third drive lines 330, and the one or plurality of fourth drive lines 340, but not to the first detection lines 210, the one or plurality of second detection lines 220, and the third detection line 230. For example, where the plurality of first drive lines 310, the one or plurality of second drive lines 320, the one or plurality of third drive lines 330, and/or the one or plurality of fourth drive lines 340 are provided on the second face 110b of the substrate 100, the fifth drive line 350 is electrically connected to the plurality of first drive lines 310, the one or plurality of second drive lines 320, the one or plurality of third drive lines 330, and/or the one or plurality of fourth drive lines 340 via the corresponding through-hole electrodes of the substrate 100. The fifth drive line 350 can be omitted.

In any of the above aspects, the at least one second detection line 220 can be omitted. Further, in any of the above aspects, the at least one second drive line 320, the at least one third drive line 330, and/or the at least one fourth drive line 340 can be omitted. The sensor S1 of the first embodiment and the sensor S1 of the first variant have substantially the same configuration except for the presence or absence of the plurality of third drive lines 330 and the plurality of fourth drive lines 340. As such, it is suggested to refer to FIGS. 4A to 6C showing the sensor S1 of the first variant for the reference to the aspects in which the third drive lines 330 and the fourth drive lines 340 are omitted.

The sensor S1 may further include a ground electrode 400 electrically connected to a ground of the substrate 100. The ground electrode 400 includes a plurality of first ground lines 410 electrically connected to each other. The first ground lines 410 are made of a material that is the same or similar to that of the first detection lines 210. The first ground lines 410 extend generally along the respective first detection lines 210. Where the at least one third drive line 330 is not provided, the first ground lines 410 are arranged on the third face 110c of the substrate 100 such as to overlap the respective first detection lines 210 as viewed from the Z-direction side. Each of the first ground lines 410 has a width dimension (dimension in the X-X' direction) that may be slightly larger than, substantially the same as, or smaller than, that of the overlapping first detection line 210. Where the at least one third drive line 330 include a plurality of third drive lines 330, the first ground lines 410 are arranged on the third face 110c of the substrate 100 such as to overlap the respective first detection lines 210 and the respective third drive lines 330 as viewed from the Z-direction side. In this case, the width dimension (dimension in the X-X' direction) of each of the first ground lines 410 may be slightly larger than, or substantially the same as, that of each of the overlapping first detection line 210 and the overlapping third drive line 330.

The ground electrode 400 may further include at least one second ground line 420. The or each second ground line 420 is made of a material that is the same or similar to that of the first detection lines 210. The or each second ground line 420 extends along the at least one second detection line 220, intersects the plurality of first ground lines 410, and is electrically connected to the first ground lines 410 at the intersections.

Where the at least one second ground line 420 include the single second ground line 420 and the at least one fourth drive line 340 is not provided, the second ground line 420 is arranged on the third face 110c of the substrate 100 such as to overlap the single second detection line 220 or one of the second detection lines 220 as viewed from the Z-direction side.

Where the at least one second ground line 420 include the plurality of second ground lines 420, the at least one second detection line 220 include the plurality of second detection lines 220, and the plurality of fourth drive lines 340 is not provided, the second ground lines 420 are arranged on the third face 110c of the substrate 100 such as to overlap the respective second detection lines 220 as viewed from the Z-direction side.

The or each second ground line 420 has a width dimension (dimension in the X-X' direction) that may be slightly larger than, substantially the same as, or smaller than, that of the overlapping second detection line 220.

Where the at least one second ground line 420 include the single second ground line 420, and the at least one fourth drive line 340 is provided, the second ground line 420 is arranged on the third face 110c of the substrate 100 such as to overlap the single second detection line 220 and the single fourth drive line 340 as viewed from the Z-direction side, or alternatively overlap one of the second detection lines 220 and one of the fourth drive lines 340 as viewed from the Z-direction side.

Where the at least one second ground line 420 include the plurality of second ground lines 420, the at least one second detection line 220 include the plurality of second detection lines 220, and the plurality of fourth drive lines 340 are provided, the second ground lines 420 are arranged on the third face 110c of the substrate 100 such as to overlap the respective second detection lines 220 and the respective fourth drive lines 340 as viewed from the Z-direction side.

Figure 3A:
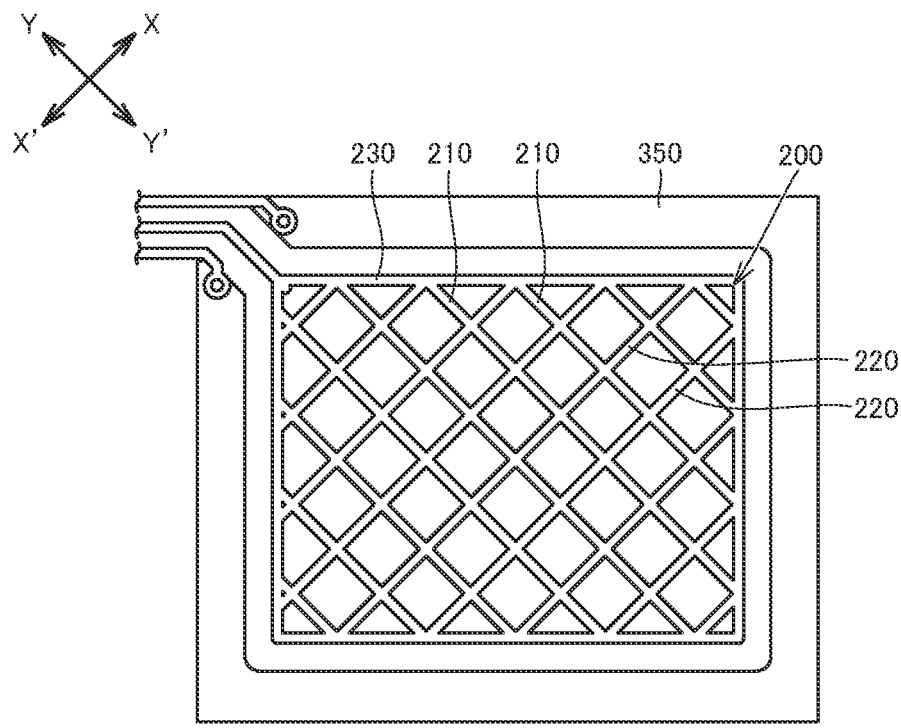
FIG. 3A is a schematic plan view showing relative positions of first to third detection lines of the detection electrode and a fifth drive line of the drive electrode on a first face of the substrate of the capacitive sensor of the first embodiment.
Figure 3B:
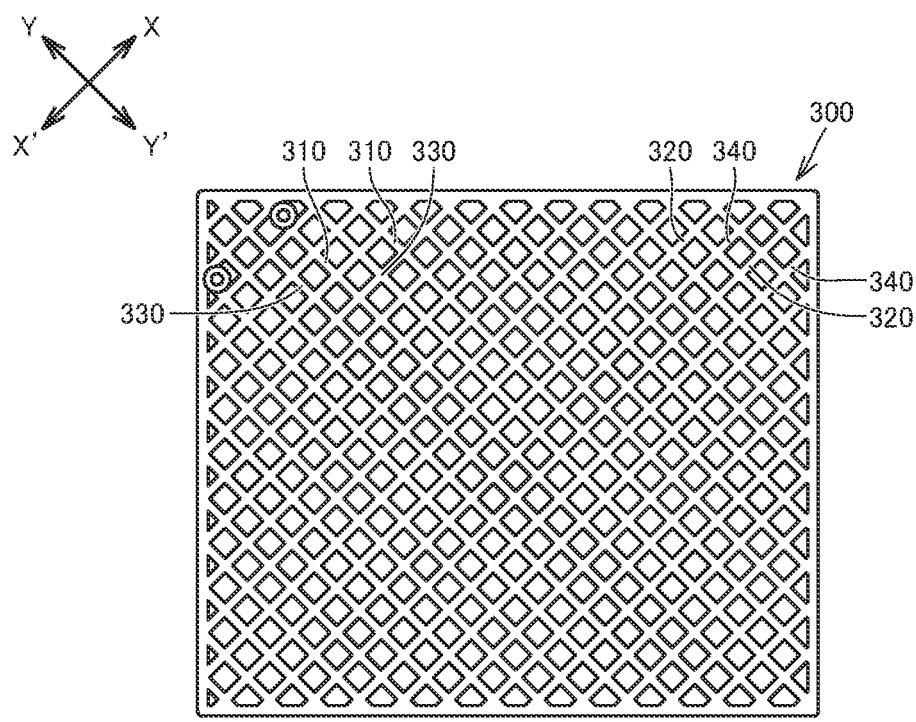
FIG. 3B is a schematic plan view showing relative positions of first to fourth drive lines of the drive electrode on a second face of the substrate of the capacitive sensor of the first embodiment.
Figure 3C:
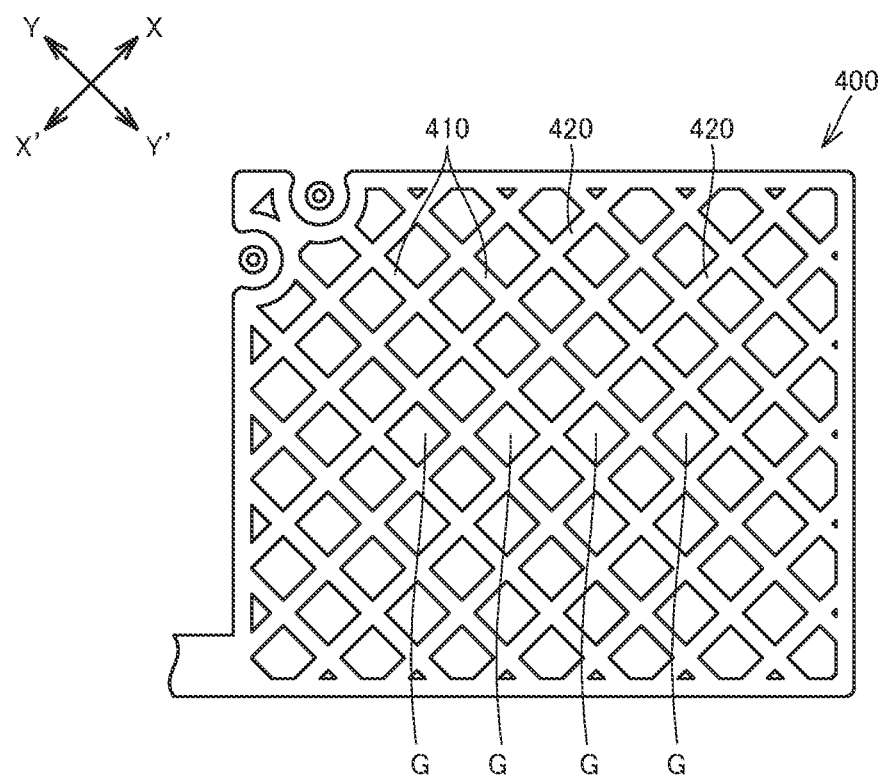
FIG. 3C is a schematic plan view showing relative positions of first and second ground lines of the ground electrode on a third face of the substrate of the capacitive sensor of the first embodiment.
Figure 4A:
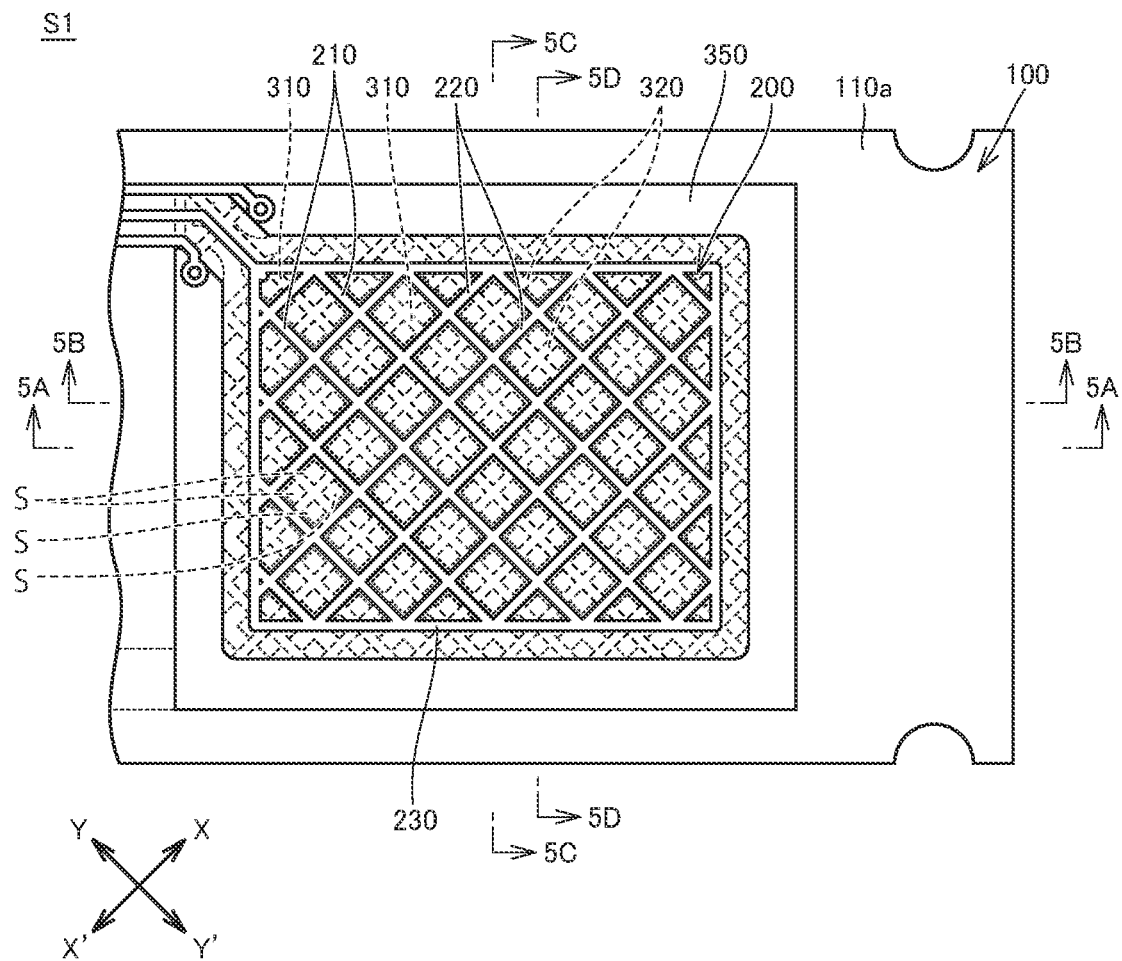
FIG. 4A is a schematic plan view of a first variant of the capacitive sensor of the first embodiment, with a substrate of the capacitive sensor shown as transparent, showing a superposition relationship between a detection electrode, a drive electrode, and a ground electrode.
Figure 4B:
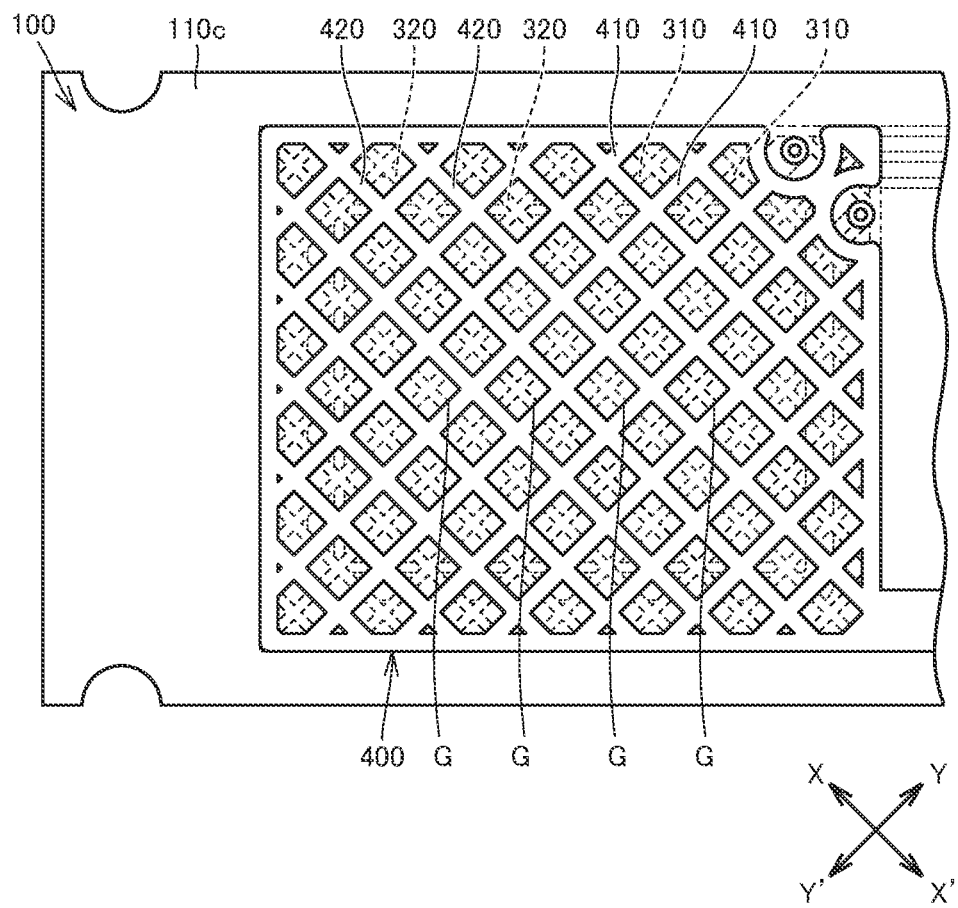
FIG. 4B is a schematic bottom view of the capacitive sensor of the first variant, with the substrate of the capacitive sensor shown as transparent, showing a superposition relationship between a detection electrode, a drive electrode, and a ground electrode.
Figure 5A:
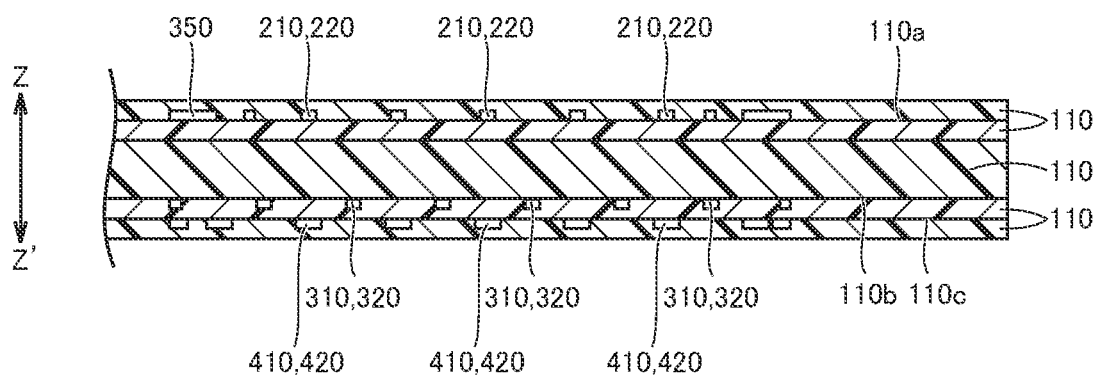
FIG. 5A is a cross-sectional view, taken along line 5A-5A in FIG. 4A, of the capacitive sensor of the first variant.
Figure 5B:
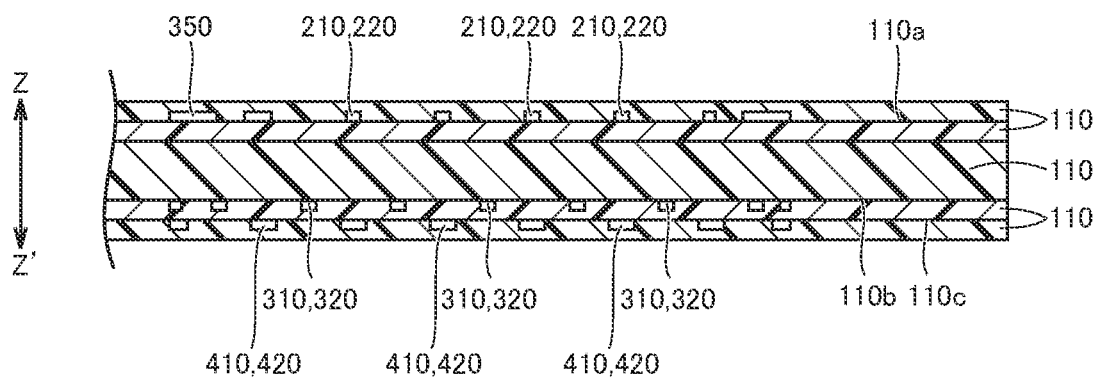
FIG. 5B is a cross-sectional view, taken along line 5B-5B in FIG. 4A, of the capacitive sensor of the first variant.
Figure 5C:
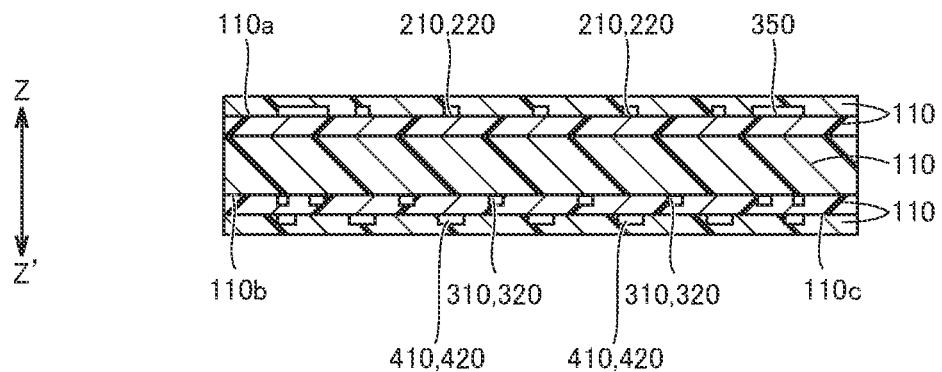
FIG. 5C is a cross-sectional view, taken along line 5C-5C in FIG. 4A, of the capacitive sensor of the first variant.
Figure 5D:
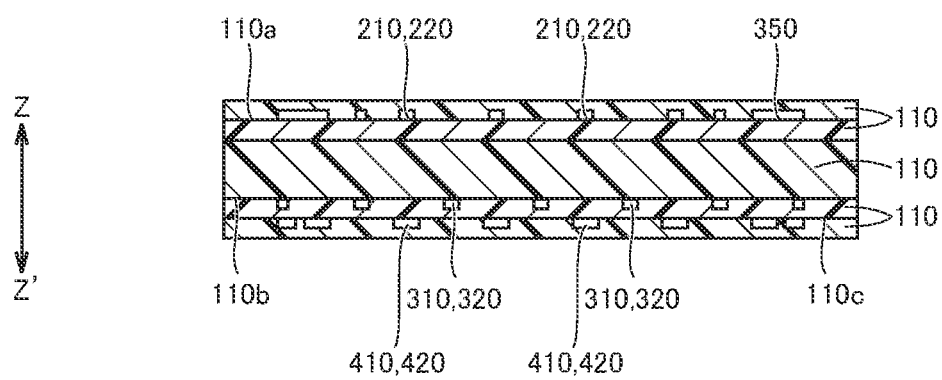
FIG. 5D is a cross-sectional view, taken along line 5D-5D in FIG. 4A, of the capacitive sensor of the first variant.
Figure 6A:
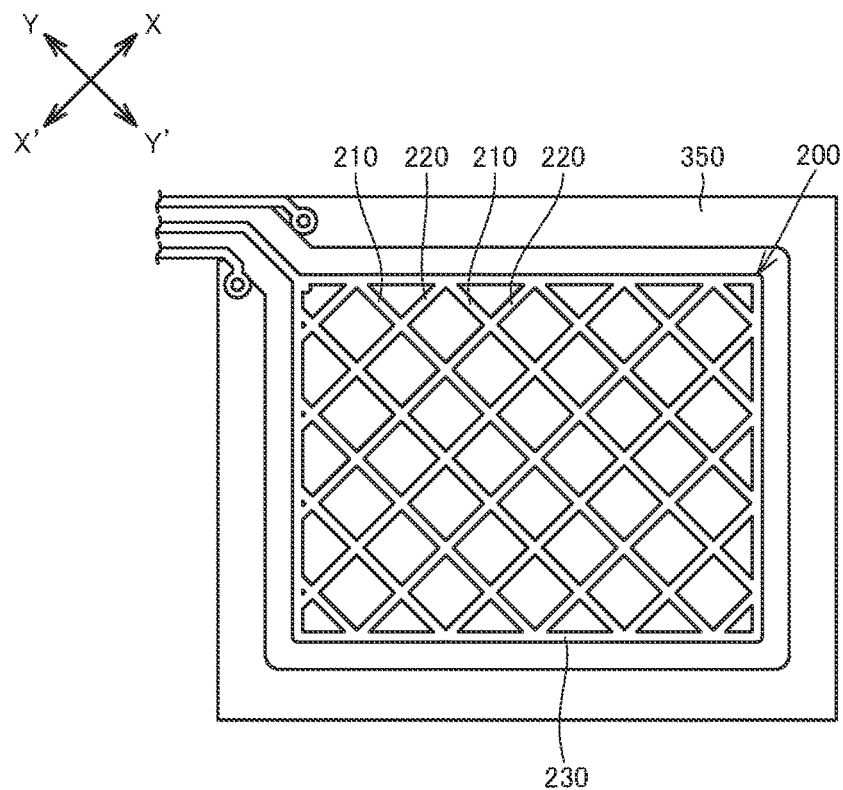
FIG. 6A is a schematic plan view showing relative positions of first to third detection lines of the detection electrode and a fifth drive line of the drive electrode on a first face of the substrate of the capacitive sensor of the first variant.
Figure 6B:
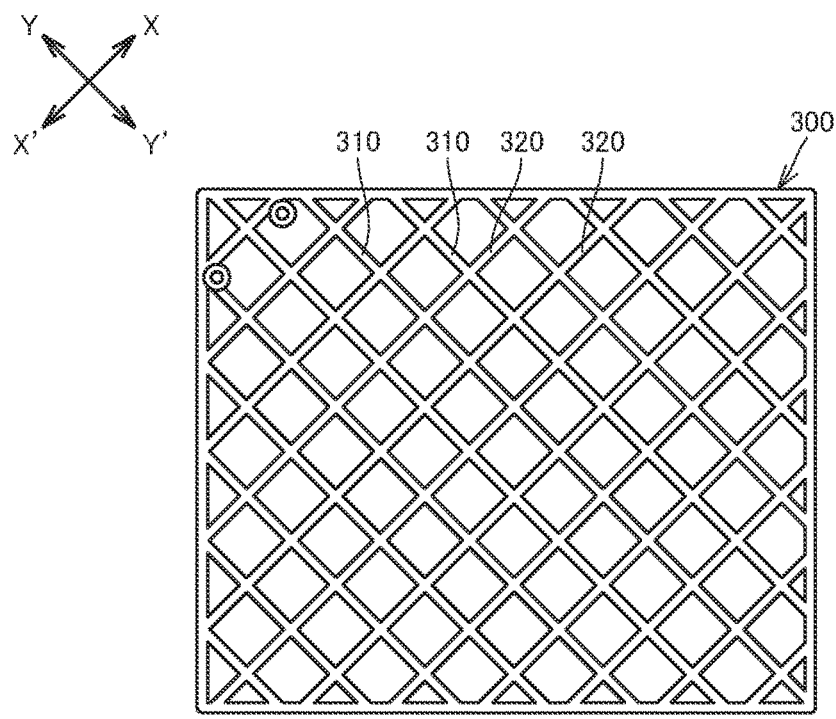
FIG. 6B is a schematic plan view showing relative positions of the first and second drive lines of the drive electrode on a second face of the substrate of the capacitive sensor of the first variant.
Figure 6C:
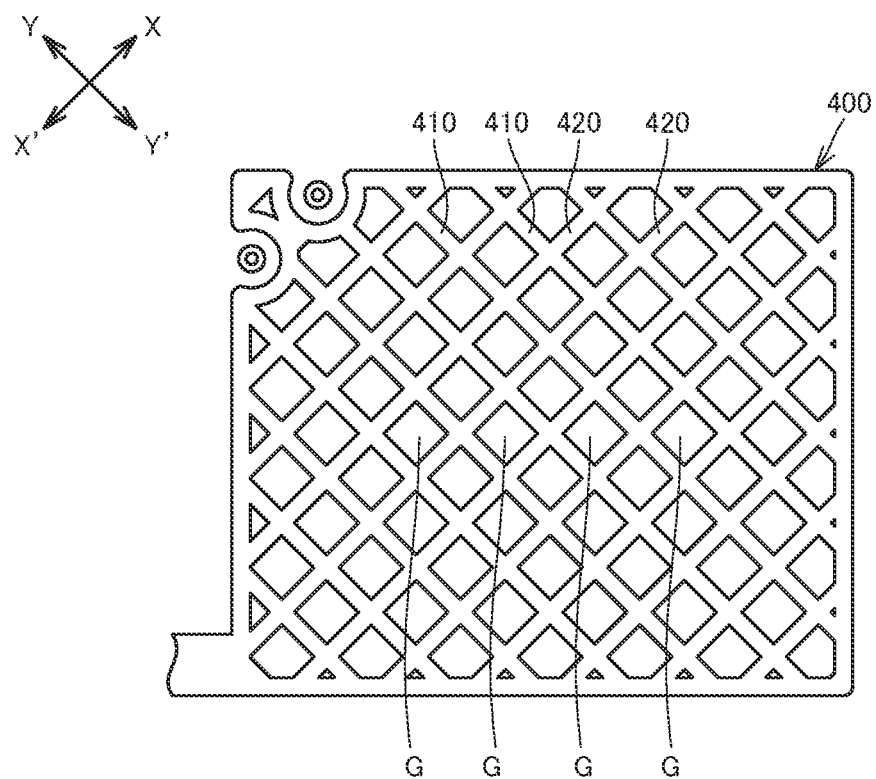
FIG. 6C is a schematic plan view showing relative positions of first and second ground lines of the ground electrode on a third face of the substrate of the capacitive sensor of the first variant.
Figure 7A:
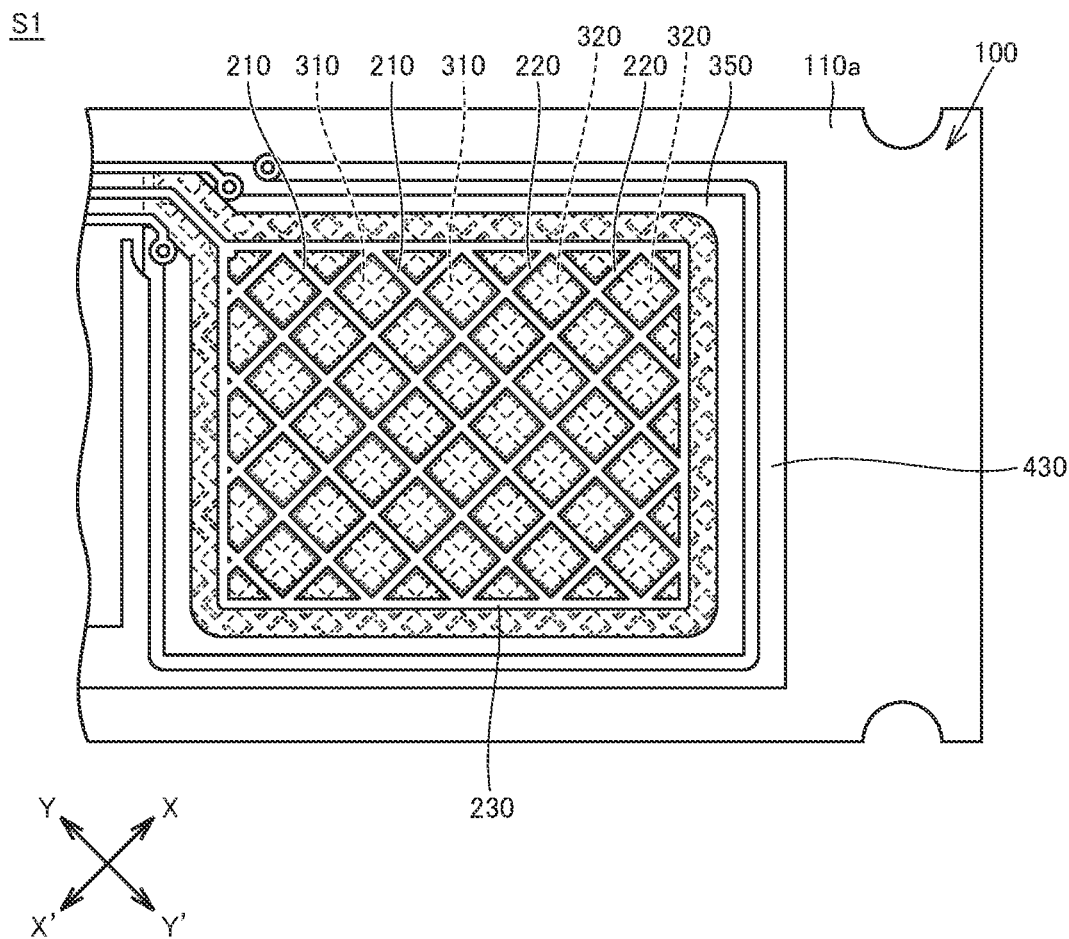
FIG. 7A is a schematic plan view of a second variant of the capacitive sensor of the first embodiment, with a substrate of the capacitive sensor shown as transparent, showing a superposition relationship between a detection electrode, a drive electrode, and a ground electrode.
Figure 7B:
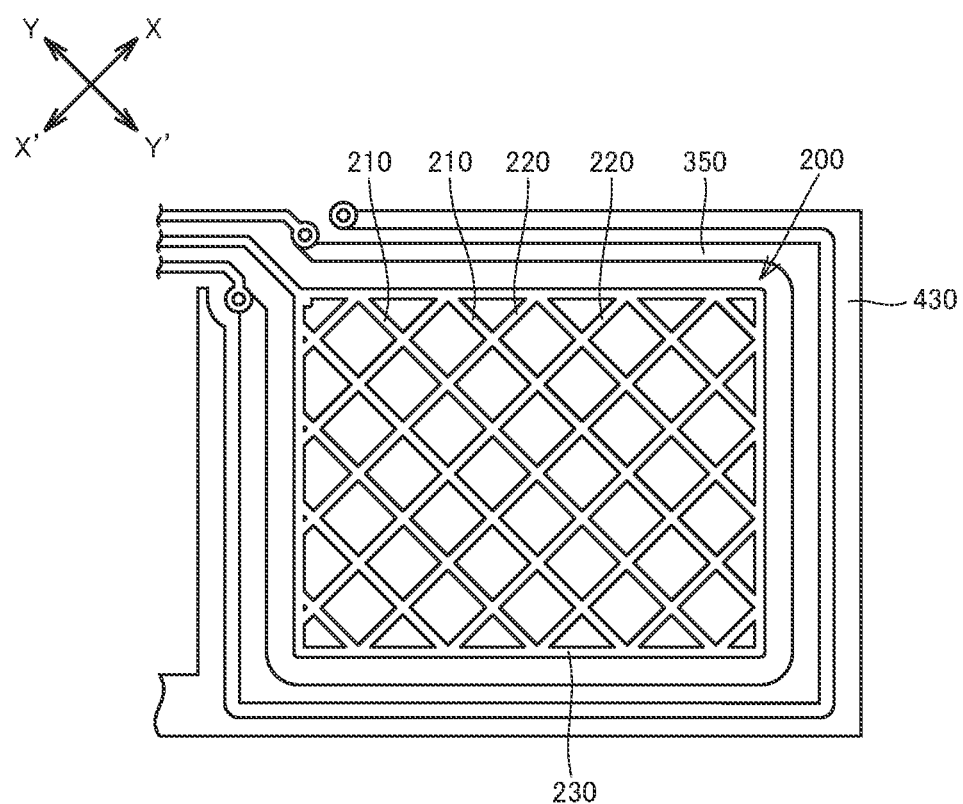
FIG. 7B is a schematic plan view of the capacitive sensor of the second variant, showing a positional relationship between first and second detection lines of the detection electrode, a fifth drive line of the drive electrode, and a third ground line of the ground electrode on the first face of the substrate.
Figure 8A:
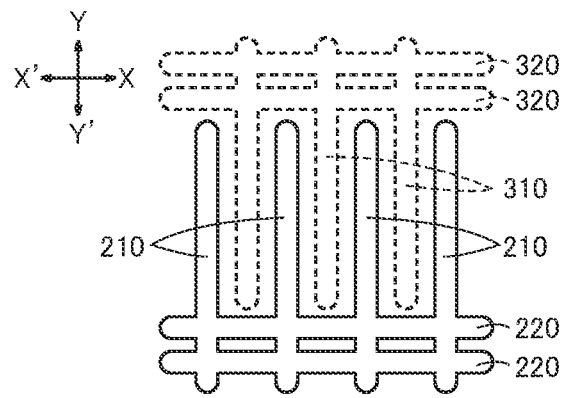
FIG. 8A is a schematic plan view of a third variant of the capacitive sensor of the first embodiment, showing a positional relationship between first and second detection lines on a first face of a substrate of the capacitive sensor and first and second drive lines on a second face of the substrate.
Figure 8B:
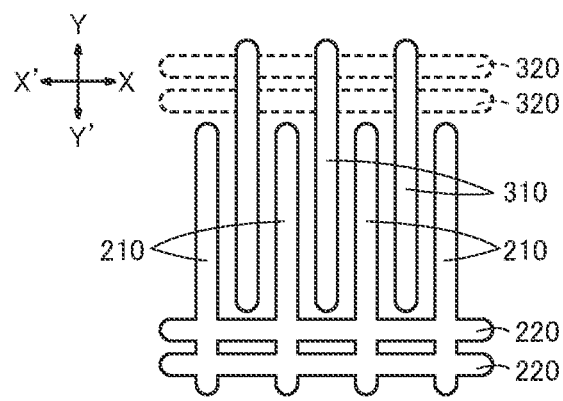
FIG. 8B is a schematic plan view of a fourth variant of the capacitive sensor of the first embodiment, showing a positional relationship between first and second detection lines and first drive lines on a first face of a substrate of the capacitive sensor and a second drive line on a second face of the substrate.
Figure 8C:
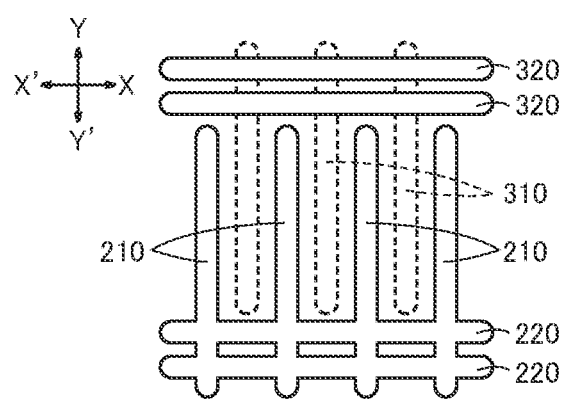
FIG. 8C is a schematic plan view of a fifth variant of the capacitive sensor of the first embodiment, showing a positional relationship between first and second detection lines and second drive lines on a first face of a substrate of the capacitive sensor and first drive lines on a second face of the substrate.
Figure 8D:
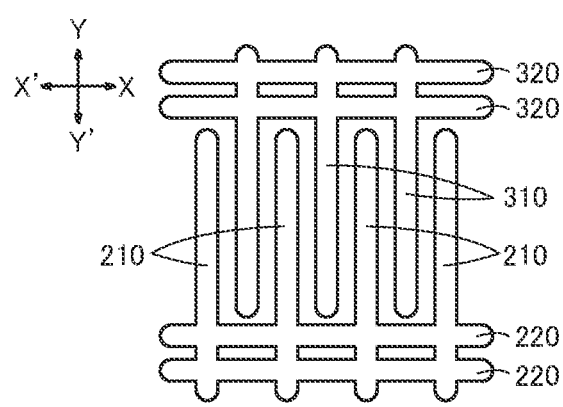
FIG. 8D is a schematic plan view of a sixth variant of the capacitive sensor of the first embodiment, showing a positional relationship between first and second detection lines and first and second drive lines on a first face of a substrate of the capacitive sensor.
Figure 8E:
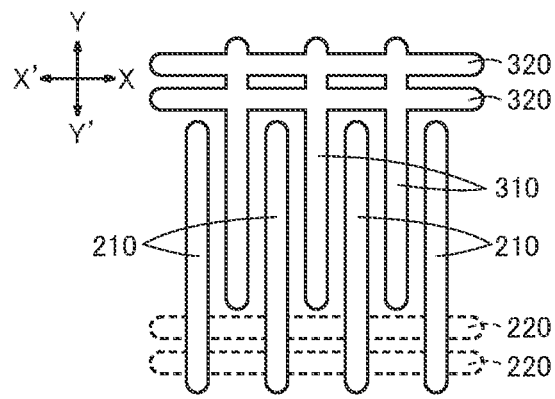
FIG. 8E is a schematic plan view of a seventh variant of the capacitive sensor of the first embodiment, showing a positional relationship between first detection lines and first and second drive lines on a first face of a substrate of the capacitive sensor and first detection lines on a second face of the substrate.
Figure 8F:
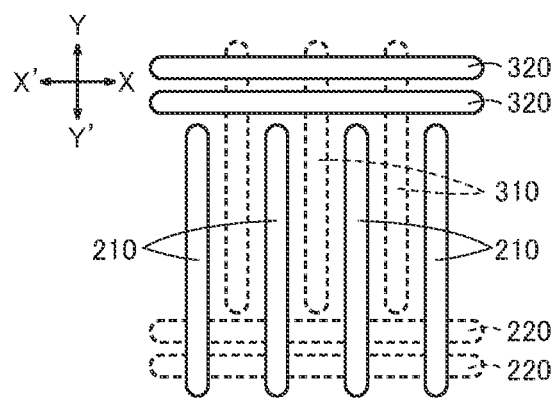
FIG. 8F is a schematic plan view of an eighth variant of the capacitive sensor of the first embodiment, showing a positional relationship between first detection lines and second drive lines on a first face of a substrate of the capacitive sensor and second detection lines and first drive lines on a second face of the substrate.
Figure 8G:
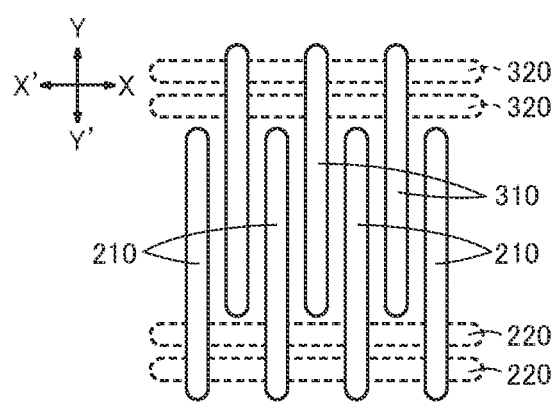
FIG. 8G is a schematic plan view of a ninth variant of the capacitive sensor of the first embodiment, showing a positional relationship between first detection lines and first drive lines on a first face of a substrate of the capacitive sensor and second detection lines and second drive lines on a second face of the substrate.
Figure 8H:
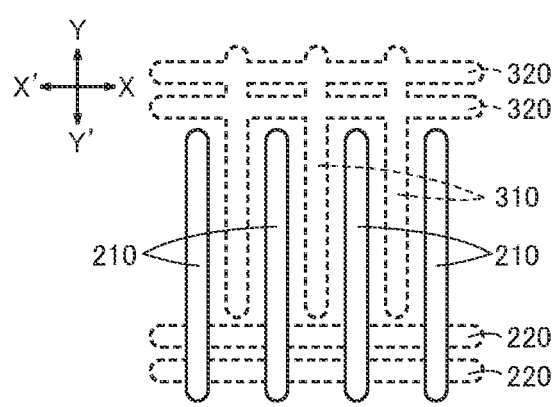
FIG. 8H is a schematic plan view of a tenth variant of the capacitive sensor of the first embodiment, showing a positional relationship between first detection lines on a first face of a substrate of the capacitive sensor and second detection lines and first and second drive lines on a second face of the substrate.

The width dimension (dimension in the Y-Y' direction) of the or each second ground line 420 may be slightly larger than, substantially the same as, or smaller than, that of each of the overlapping second detection line 220 and the overlapping fourth drive line 340.

Where the plurality of first detection lines 210 and the plurality of second detection lines 220 mutually intersect forming a mesh pattern on the first face 110a, the plurality of first ground lines 410 and the plurality of second ground lines 420 may also mutually intersect forming a mesh pattern on the third face 110c (see FIGS. 1A to 7B). The first ground lines 410 and/or the at least one second ground line 420 can be omitted. Where the first ground lines 410 and the at least one second ground line 420 are both omitted, the third face 110c of the substrate 100 can also be omitted. The plurality of first ground lines 410 and the plurality of second ground lines 420 intersecting in a mesh pattern may be constituted by the conductor described above or by a mesh-patterned metal plate, similarly to the first detection lines 210 and the second detection lines 220 intersecting in a mesh pattern.

Where the plurality of first ground lines 410 and the plurality of second ground lines 420 mutually intersect forming a mesh pattern, the mesh constituted by the first ground lines 410 and the second ground lines 420 has a plurality of clearances (second clearances) being a plurality of gaps G (see FIGS. 3C and 6C). Each gap G is defined by adjacent two of the first ground lines 410, and adjacent two of the second ground lines 420 that intersect the adjacent two first ground lines 410. Each gap G is located on the Z'-direction side relative to the four spaces S of the corresponding set (see FIGS. 1B and 4B).

The ground electrode 400 may further include a third ground line 430. The third ground line 430 has a ring shape or a partially discontinuous ring shape, and is made of a material that is the same or similar to that of the first detection lines 210. Where the fifth drive line 350 is provided, the third ground line 430 is arranged on the first face 110a of the substrate 100 such as to surround the fifth drive line 350 (see FIGS. 7A and 7B). Where the fifth drive line 350 is not provided, the third ground line 430 is provided on the first face 110a of the substrate 100 and surrounds at least the first detection lines 210. The third ground line 430 can be omitted (see FIGS. 1A to 6C).

The sensor S1 may further include a controller 500. The controller 500 is only required to be constituted by a logic circuit, such as a detection IC, software to processed by a processor, or the like and electrically connected to the detection electrode 200 and the drive electrode 300. The controller 500 may be, but is not required to be, mounted on the substrate 100 or provided in the substrate 100. The controller 500 is configured to charge and discharge the detection electrode 200 and supply drive pulses to the drive electrode 300. When a detection target approaches the detection electrode 200 while the detection electrode 200 is being charged and discharged, the approach causes a change in a first capacitance between the detection electrode 200 and the detection target. When a detection target approaches the detection electrode 200 and the drive electrode 300 while drive pulses are being supplied to the drive electrode 300 (which may be referred to simply as "during drive pulses supply"), the approach causes a change in a second capacitance between the detection electrode 200 and the drive electrode 300. The controller 500 is further configured to detect the detection target on the basis of changes in the first and second capacitances.

Figure 1C:
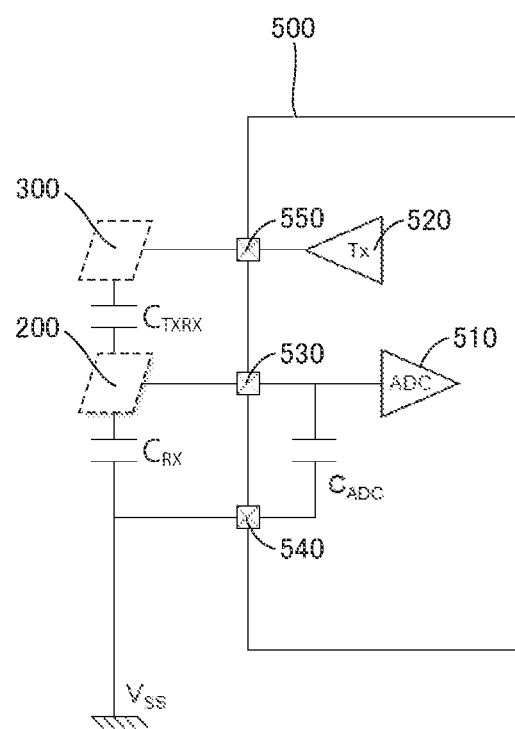
FIG. 1C is a diagram explaining a relationship between the detection electrode, the drive electrode, and a controller of the capacitive sensor of the first embodiment.
Figure 2A:
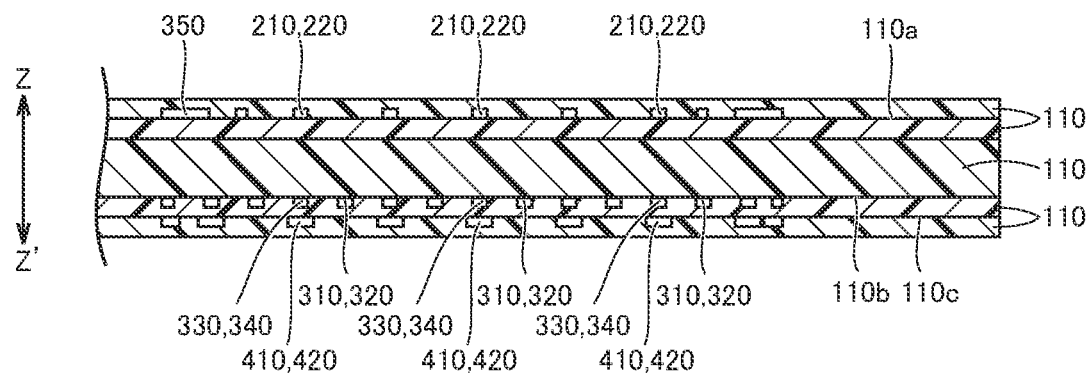
FIG. 2A is a cross-sectional view, taken along line 2A-2A in FIG. 1A, of the capacitive sensor of the first embodiment.
Figure 2B:
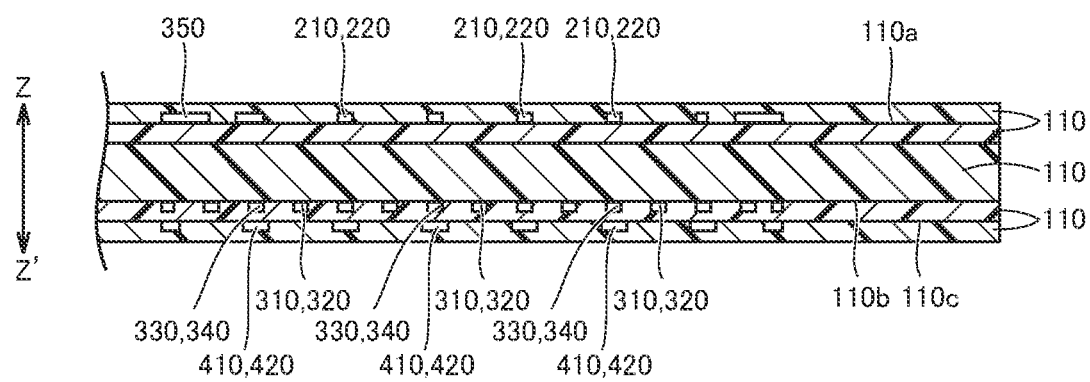
FIG. 2B is a cross-sectional view, taken along line 2B-2B in FIG. 1A, of the capacitive sensor of the first embodiment.
Figure 2C:
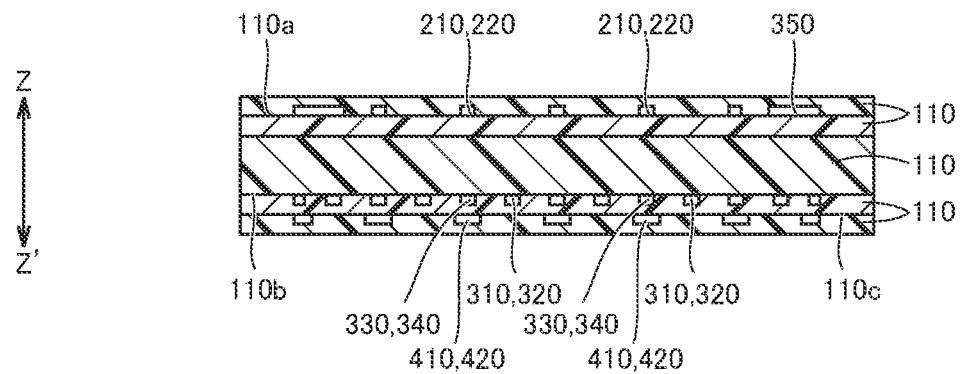
FIG. 2C is a cross-sectional view, taken along line 2C-2C in FIG. 1A, of the capacitive sensor of the first embodiment.
Figure 2D:
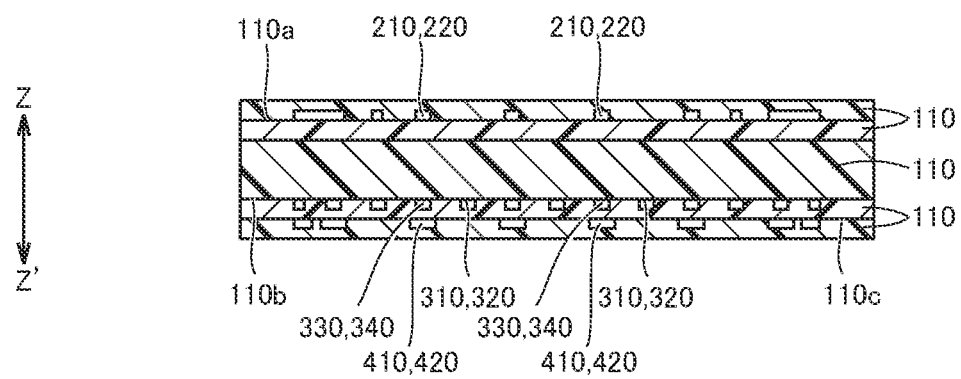
FIG. 2D is a cross-sectional view, taken along line 2D-2D in FIG. 1A, of the capacitive sensor of the first embodiment.

The controller 500 may include an internal capacitor CADC, an analog-to-digital converter (ADC) 510, an I/O port 520, an external pin 530, an external pin 540, and an external pin 550, for example (see FIG. 1C). The internal capacitor CADC may be connected to the external pins 530 and 540. The external pin 540 may be connected to the ground of the substrate 100. The external pin 530 may be connected to the detection electrode 200, and an external capacitor CRX may be provided between the detection electrode 200 and the ground. The I/O port 520 may be connected to the drive electrode 300 via the external pin 550, and drive pulses may be supplied to the drive electrode 300 from the I/O port 520. By supplying drive pulses to the drive electrode 300, a mutual capacitance CTXRX (which may be referred to as a second capacitance CTXRX) is formed between the drive electrode 300 and the detection electrode 200. The controller 500 includes a memory (not shown), which stores first and second threshold values.

The second capacitance CTXRX includes at least a first mutual capacitance. Since each of the first drive lines 310 of the drive electrode 300 is located between adjacent two of the first detection lines 210 of the detection electrode 200 as viewed from the Z-direction side, during drive pulses supply, a first mutual capacitance is formed between the first drive lines 310 and the first detection lines 210 adjacent thereto.

Where the plurality of first detection lines 210 and the plurality of second detection lines 220 of the detection electrode 200 mutually intersect forming a mesh pattern, the plurality of first drive lines 310 and the plurality of second drive lines 320 of the drive electrode 300 mutually intersect forming a mesh pattern, and each of the second drive lines 320 is located between adjacent two of the second detection lines 220 as viewed from the Z-direction side, the second capacitance CTXRX further includes a second mutual capacitance, a third mutual capacitance, and a fourth mutual capacitance. During drive pulses supply, a second mutual capacitance is formed between the second drive lines 320 and the second detection lines 220 adjacent thereto, a third mutual capacitance is formed between the first drive lines 310 and portions on the X- and X'-direction sides relative to a plurality of intersecting portions of the plurality of second detection lines 220, and a fourth mutual capacitance is formed between the second drive lines 320 and portions on the Y- and Y'-direction sides relative to a plurality of intersecting portions of the plurality of first detection lines 210. The intersecting portions of the second detection lines 220 are portions of the second detection lines 220 where the second detection lines 220 intersects the first drive lines 310 as viewed from the Z direction. The intersecting portions of the first detection lines 210 are portions of the first detection lines 210 where the first detection lines 210 intersect the second drive lines 320 as viewed from the Z direction.

Where the third detection line 230 and the fifth drive line 350 are provided, the second capacitance CTXRX further includes a fifth mutual capacitance. Since the fifth drive line 350 surrounds the third detection line 230 in spaced relation to each other, During drive pulses supply, a fifth mutual capacitance is formed between the third detection line 230 and the fifth drive line 350.

Where the third detection line 230 is provided, and the dimension in the Y-Y' direction of each of the first drive lines 310 are larger than that of each of the first detection lines 210, the second capacitance CTXRX further includes a sixth mutual capacitance. In this case, each of the first drive lines 310 includes first and second portions located on the Y- and Y'-direction sides, respectively, relative to the third detection line 230 (the first and second portions of each first drive line 310 are located outside the third detection line 230). During drive pulses supply, a sixth mutual capacitance is formed between the third detection line 230 and the first and second portions of first drive lines 310. Where the third detection line 230 is provided, and the dimension in the X-X' direction of the or each second drive line 320 is larger than that of the or each second detection line 220, the second capacitance CTXRX further includes a seventh mutual capacitance. In this case, the or each second drive line 320 includes first and second portions located on the X- and X'-direction sides, respectively, relative to the third detection line 230 (the first and second portions of the or each second drive line 320 are located outside the third detection line 230). During drive pulses supply, a seventh mutual capacitance is formed between the third detection line 230 and the first and second portions of the at least one second drive line 320. Where the third detection line 230 is provided, and the dimension in the Y-Y' direction of the or each third drive line 330 is larger than that of the overlapping one of the first detection lines 210, the second capacitance CTXRX further includes an eighth mutual capacitance. In this case, the or each third drive line 330 includes first and second portions located on the Y- and Y'-direction sides, respectively, relative to the third detection line 230 (the first and second portions of the or each third drive line 330 are located outside the third detection line 230). During drive pulses supply, an eighth mutual capacitance is formed between the third detection line 230 and the first and second portions of the at least one third drive line 330. Where the third detection line 230 is provided, and the dimension in the X-X' direction of the or each fourth drive line 340 is larger than that of the or each second detection line 220, the second capacitance CTXRX further includes a ninth mutual capacitance. In this case, the or each fourth drive line 340 includes first and second portions located on the X- and X'-direction sides, respectively, relative to the third detection line 230 (the first and second portions of the or each fourth drive line 340 are located outside the third detection line 230). During drive pulses supply, a ninth mutual capacitance is formed between the third detection line 230 and the first and second portions of the at least one fourth drive line 340.

The controller 500 is configured to supply drive pulses to the drive electrode 300 and repeat the following process steps (A) to (D).

(A) The controller 500 charges the internal capacitor CADC to a level VDD and discharge the external capacitor CRX to a level VSS.

(B) After step (A), the controller 500 connects the internal capacitor CADC to the external capacitor CRX and make voltages of these two capacitors stable at a midpoint. At this time, the electric charge moves from the internal capacitor CADC to the external capacitor CRX. After the stabilization of the voltages of the capacitors, the controller 500 disconnects the internal capacitor CADC from the external capacitor CRX. Then, the voltage of the internal capacitor CADC is input into the ADC 510, which timing will be referred to as a first timing.

(C) After step (B), the controller 500 charges the external capacitor CRX to the level VDD and discharge the internal capacitor CADC to the level VSS.

(D) After step (C), the controller 500 connects the internal capacitor CADC to the external capacitor CRX and make voltages of these two capacitors stable at a midpoint. At this time, the electric charge moves from the external capacitor CRX to the internal capacitor CADC. After the stabilization of the voltages of the capacitors, the controller 500 disconnects the internal capacitor CADC from the external capacitor CRX. Then, the voltage of the internal capacitor CADC is input into the ADC 510, which timing will be referred to as a second timing.

The signal of the drive pulses is at a low level in step (A) above, changes from the low level to a high level in step (B) above, is maintained at the high level in step (C) above, and changes from the high level to the low level in step (D) above. At the first timing in step (B) above, since the signal of the drive pulses is at the high level, the voltage of the internal capacitor CADC input into the ADC 510 is increased compared to a case where the drive pulses are not supplied. At the second timing (D) above, since the signal of the drive pulses is at the low level, the voltage of the internal capacitor CADC input to the ADC 510 is decreased compared to the case where the drive pulse is not supplied.

When a detection target touches the detection face (i.e., the detection target approaches the detection electrode 200 and the drive electrode 300 from the Z-direction side), the first capacitance between the detection target and the detection electrode 200 is added to the external capacitor CRX, whereas the electric charge of the second capacitance CTXRX between the drive electrode 300 and the detection electrode 200 moves to earth through the detection target, so that the second capacitance CTXRX decreases. At the first timing, the voltage of the internal capacitor CADC decreases as the first capacitance increases, and the voltage of the internal capacitor CADC decreases as the second capacitance CTXRX decreases. In other words, at the first timing, the voltage of the internal capacitor CADC decreases in accordance with both a change in the first capacitance and a change in the second capacitance CTXRX. Thus, the voltage of the internal capacitor CADC is significantly decreased compared to a case where the voltage of the internal capacitor CADC is decreased in accordance with a change in the first capacitance only or a change in the second capacitance CTXRX only. At the second timing, the voltage of the internal capacitor CADC increases as the first capacitance increases, and the voltage of the internal capacitor CADC increases as the second capacitance CTXRX decreases. In other words, at the second timing, the voltage of the internal capacitor CADC increases in accordance with both a change in the first capacitance and a change in the second capacitance CTXRX. Thus, the voltage of the internal capacitor CADC is significantly increased as compared to the case where voltage of the internal capacitor CADC is increased in accordance with a change in the first capacitance only or a change in the second capacitance CTXRX only.

The controller 500 is configured to compare the voltage of the internal capacitor CADC at the first timing with the first threshold value, and makes a first determination of whether or not the voltage of the internal capacitor CADC at the first timing is equal to or smaller than the first threshold value. The controller 500 compares the voltage of the internal capacitor CADC at the second timing with the second threshold value, and makes a second determination of whether or not the voltage of the internal capacitor CADC at the second timing is equal to or larger than the second threshold value. If the controller 500 determines that the voltage of the internal capacitor CADC is equal to or smaller than the first threshold value as a result of the first determination and/or determines that the voltage of the internal capacitor CADC is equal to or larger than the second threshold value as a result of the second determination, then the controller 500 determines that the detection target has touched the detection face.

On the other hand, when a conductor deposit, such as water, adheres to the detection face (i.e., when the conductor deposit exists on the Z-direction side relative to the detection electrode 200), the first capacitance between the conductor deposit and the detection electrode 200 is added to the external capacitor CRX. Since the conductor deposit electrically floats from earth, the capacitance of the conductor deposit is added to second capacitance CTXRX between the drive electrode 300 and the detection electrode 200, and accordingly the second capacitance CTXRX increases by the capacitance of the conductor deposit. In this case, at the first timing, the voltage component of the internal capacitor CADC that should decrease as the first capacitance increases is cancelled by the voltage component of the internal capacitor CADC that should increase as the second capacitance CTXRX increases. Such cancellation results in that the voltage of the internal capacitor CADC changes hardly or slightly at the first timing. At the second timing, the voltage component of the internal capacitor CADC that should increase as the first capacitance increases is cancelled by the voltage component of the internal capacitor CADC that should decrease as the second capacitance CTXRX increases. Such cancellation results in that the voltage of the internal capacitor CADC changes hardly or slightly at the second timing. Accordingly, when the conductor deposit, such as water, adheres to the detection face, the voltage of the internal capacitor CADC at the first timing does not fall to or below the first threshold value, and the voltage of the internal capacitor CADC at the second timing does not reach or exceed the second threshold value. Therefore, the controller 500 will not erroneously determine that the conductor deposit is a detection target in the results of the first and/or second determinations. The controller 500 is thus able to detect a touch on the detection face by the detection target distinguishing the detection target from the conductor deposit.

The spacing between the first drive lines 310 in the X-X' direction may be adjusted such that the first capacitance is substantially the same as the second capacitance CTXRX. For example, where the first capacitance is larger than the second capacitance CTXRX, the second capacitance CTXRX can be decreased, by reducing the spacing between the first drive lines 310 of the drive electrode 300 in the X-X' direction, such that the first capacitance is substantially the same as the second capacitance CTXRX. In this case, the spacing between the first drive lines 310 in the X-X' direction may be smaller than the spacing between the first detection lines 210 in the X-X' direction. This arrangement can be reversed in a case where the second capacitance CTXRX is larger than the first capacitance. More particularly, the second capacitance CTXRX is can be increased, by enlarging the spacing between the first drive lines 310 of the drive electrode 300 in the X-X' direction, such that the first capacitance is substantially the same as the second capacitance CTXRX.

Where the plurality of second detection lines 220 and the plurality of second drive lines 320 are provided, the spacing between the first drive lines 310 in the X-X' direction and the spacing between the second drive lines 320 in the Y-Y' direction may be adjusted such that the first capacitance is substantially the same as the second capacitance CTXRX. For example, where the first capacitance is larger than the second capacitance CTXRX, the second capacitance CTXRX can be decreased, by reducing the spacing between the first drive lines 310 of the drive electrode 300 in the X-X' direction and the spacing between the second drive lines 320 in the Y-Y' direction, such that the first capacitance is substantially the same as the second capacitance CTXRX. In this case, the spacing between the first drive lines 310 in the X-X' direction may be smaller than the spacing between the first detection lines 210 in the X-X' direction, and the spacing between the second drive lines 320 in the Y-Y' direction may be smaller than the spacing between the second detection lines 220 in the Y-Y' direction. This arrangement can be reversed in a case where the second capacitance CTXRX is larger than the first capacitance. More particularly, the second capacitance CTXRX can be increased, by enlarging the spacing between the first drive lines 310 of the drive electrode 300 in the X-X' direction and the spacing between the second drive lines 320 in the Y-Y' direction, such that the first capacitance is substantially the same as the second capacitance CTXRX.

The sensor S1 as described above provides the following technical features and effects.

Technical Feature and Effect (1): Each of the first drive lines 310 of the drive electrode 300 is located between adjacent two of the first detection lines 210 of the detection electrode 200 as viewed from the Z-direction side. With this arrangement, a conductor deposit adhering to the detection face is located substantially on the Z-direction side relative to at least one of the first drive lines 310 and the first detection line(s) 210 adjacent thereto, making it possible to change the first mutual capacitance of the second capacitance CTXRX, formed between the at least one of the first drive lines 310 and the first detection line(s) 210 adjacent thereto. Such change in the first mutual capacitance increases the possibility that the conductor deposit adhering to the detection face changes the second capacitance CTXRX, thereby reducing the possibility that the controller 500 erroneously detects the conductor deposit as a detection target.

Where the plurality of first detection lines 210 and the plurality of second detection lines 220 of the detection electrode 200 mutually intersect forming a mesh pattern, the plurality of first drive lines 310 and the plurality of second drive lines 320 of the drive electrode 300 mutually intersect forming a mesh pattern, each of the first drive lines 310 is located between adjacent two of the first detection lines 210 of the detection electrode 200 as viewed from the Z-direction side, and each of the second drive lines 320 is located between adjacent two of the second detection lines 220 as viewed from the Z-direction side, a conductor deposit adhering to the detection face is located substantially on the Z-direction side relative to at least one of the first drive lines 310 and the first detection line(s) 210 adjacent thereto and/or at least one of the second drive lines 320 and the second detection line(s) 220 adjacent thereto, making it possible to change the first, second, third, and/or fourth mutual capacitance of the second capacitance CTXRX. The first mutual capacitance is formed between the at least one of the first drive lines 310 and the first detection line(s) 210 adjacent thereto, the second mutual capacitance is formed between the at least one of the second drive lines 320 and the second detection line(s) 220 adjacent thereto. The third mutual capacitance is between each of the first drive lines 310 and the portions on the X- and X'-direction sides relative to the intersecting portions of the second detection lines 220. The fourth mutual capacitance is formed between each of the second drive lines 320 and the portions on the Y- and Y'-direction sides relative to the intersecting portions of the first detection lines 210. Such change(s) in the mutual capacitance(s) increases the possibility that the conductor deposit adhering to the detection face further changes the second capacitance CTXRX, thereby further reducing the possibility that the controller 500 erroneously detects the conductor deposit as a detection target.

Where the third detection line 230 of the detection electrode 200 and the fifth drive line 350 of the drive electrode 300 are provided, a conductor deposit adhering to the detection face is located substantially on the Z-direction side relative to the fifth drive line 350 and the third detection line 230, making it possible to change the fifth mutual capacitance of the second capacitance CTXRX, formed between the fifth drive line 350 and the third detection line 230. Such change in the fifth mutual capacitance increases the possibility that the conductor deposit adhering to the detection face changes the second capacitance CTXRX, thereby further reducing the possibility that the controller 500 erroneously detects the conductor deposit as a detection target.

Where the third detection line 230 of the detection electrode 200 is provided, and the plurality of first drive lines 310, the at least one second drive line 320, the at least one third drive line 330, and/or the at least one fourth drive lines 340 of the drive electrode 300 each include the first and second portions located outside the third detection line 230, a conductor deposit adhering to the detection face is located substantially on the Z-direction side relative to the first and/or second portions of at least one of the first drive lines 310, the second drive line(s) 320, the third drive line(s) 330 and/or the fourth drive line(s) 340 and the third detection line 230, making it possible to change the sixth, seventh, eighth, and/or nineth mutual capacitance of the second capacitance CTXRX. The sixth mutual capacitance is formed between the third detection line 230 and the first and/or second portions of the at least one first drive line 310. The seventh mutual capacitance is formed between the third detection line 230 and the first and/or second portions of the at least one second drive line 320. The eighth mutual capacitance is formed between the third detection line 230 and the first and/or second portions of the at least one third drive line 330. The ninth mutual capacitance is formed between the third detection line 230 and the first and/or second portions of the at least one fourth drive line 340. Such change(s) in the mutual capacitance(s) increases the possibility that the conductor deposit adhering to the detection face changes the second capacitance CTXRX, thereby further reducing the possibility that the controller 500 erroneously detects the conductor deposit as a detection target.

Technical Feature and Effect (2): Where the at least one third drive line 330 is provided, the or each third drive line 330 on the second face 110b of the substrate 100 overlaps a corresponding one of the first detection lines 210 on the first face 110a of the substrate 100 and thereby functions as an electromagnetic shield to shield the corresponding first detection line 210 from the Z'-direction side. Therefore, the at least one first detection line 210 is less susceptible to electromagnetic influence from the Z'-direction side. Also, where the at least one fourth drive line 340 is provided, the or each fourth drive line 340 on the second face 110b of the substrate 100 overlaps the second detection line 220 or a corresponding one of the second detection lines 220 on the first face 110a of the substrate 100 and thereby functions as an electromagnetic shield to shield the corresponding second detection line 220 from the Z'-direction side. Therefore, the at least one second detection line 220 is less susceptible to electromagnetic influence from the Z'-direction side.

Technical Feature and Effect (3): Where the plurality of first ground lines 410 is provided, the or each first ground line 410 on the third face 110c of the substrate 100 overlaps a corresponding one of the first detection lines 210 on the first face 110a of the substrate 100 and thereby functions as an electromagnetic shield to shield the corresponding first detection line 210 from the Z'-direction side. Therefore, the at least one first detection line 210 is less susceptible to electromagnetic influence from the Z'-direction side. Also, where the at least one second ground line 420 is provided, the or each second ground line 420 on the third face 110c of the substrate 100 overlaps the second detection line 220 or a corresponding one of the second detection lines 220 on the first face 110a or the second face 110b of the substrate 100 and thereby functions as an electromagnetic shield to shield the corresponding second detection line 220 from the Z'-direction side. Therefore, the at least one second detection line 220 is less susceptible to electromagnetic influence from the Z'-direction side.

Technical Feature and Effect (4): Where the plurality of first detection lines 210 and the plurality of second detection lines 220 of the detection electrode 200 mutually intersect forming a mesh pattern, the plurality of first drive lines 310 and the plurality of second drive lines 320 of the drive electrode 300 mutually intersect forming a mesh pattern, the plurality of sets of four spaces S are provided as described above, and the gaps G are provided which are the plurality of clearances in the mesh constated by the plurality of first ground lines 410 and the plurality of second ground lines 420, each gap G is present on the Z'-direction side relative the four spaces S of the corresponding set. With such arrangement, during drive pulses supply, part of the electric charge from the first and second drive lines 310 and 320 does not move to the plurality of gaps G but to the adjacent first and second detection lines 210 and 220, suppressing the reduction in the first to fourth mutual capacitances.

Second Embodiment

Hereinafter described is a capacitive sensor S2 (which may be referred to simply as a sensor S2) according to a plurality of embodiments, including a second embodiment and variants thereof, of the invention, with reference to FIGS. 9A to 11C. FIGS. 9A to 11C show the sensor S2 of the second embodiment. FIGS. 10A to 10D also show the Z-Z' direction as in the sensor S1. FIGS. 9A and 9B and FIGS. 11A to 11C also show the X-X' and Y-Y' directions as in the sensor S1.

The sensor S2 has a configuration similar to that of the sensor S1 but different in the following points: (1) a detection electrode 200' includes a plurality of first detection lines 210 and a pair of second detection lines 220 on a first face 110a of a substrate 100; and (2) a drive electrode 300' includes a plurality of first drive lines 310 on the first face 110a of the substrate 100 and a second drive line 320' on a second face 110b of the substrate 100. These differences will be described in detail, omitting descriptions of the sensor S2 on overlaps with the sensor S1.

Figure 9A:
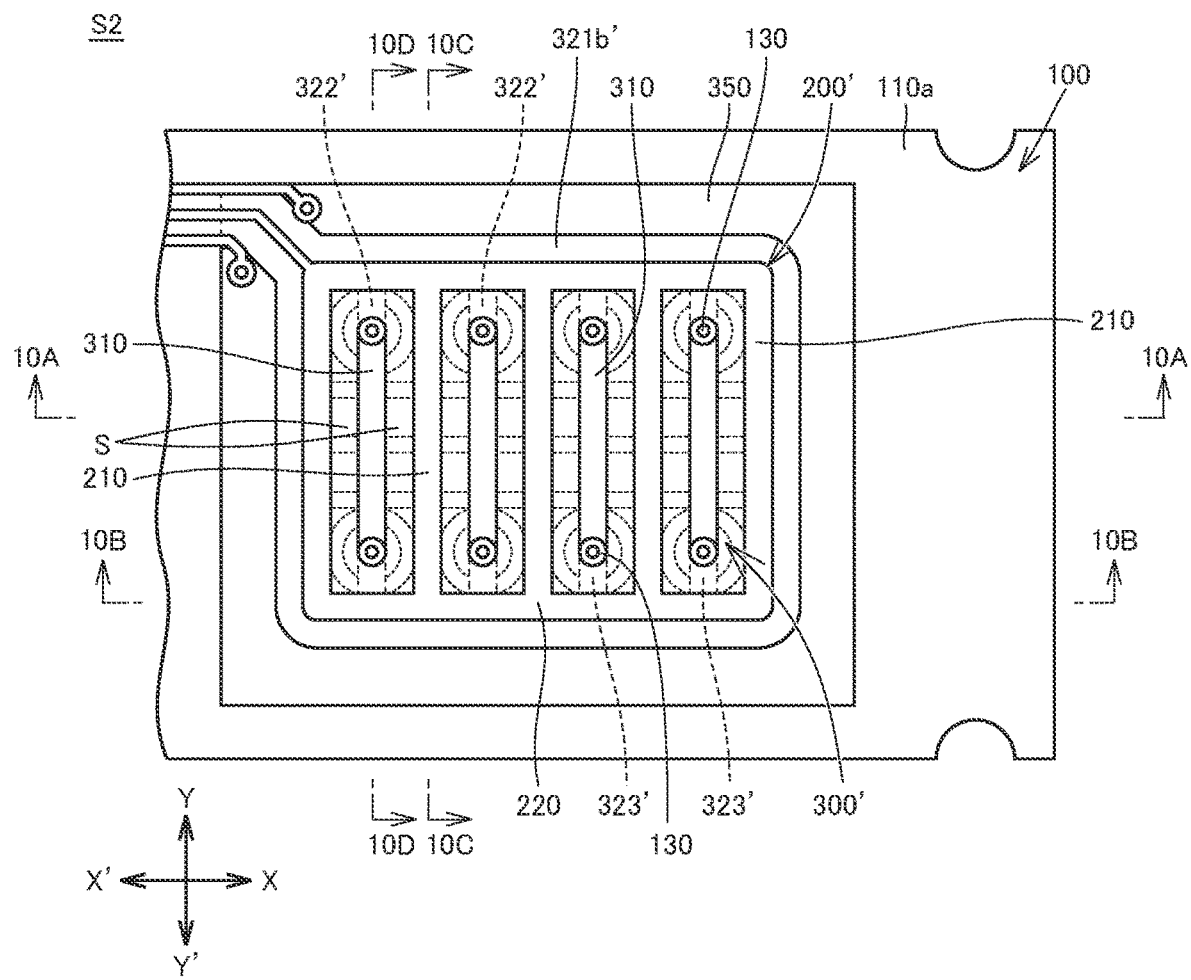
FIG. 9A is a schematic plan view of a capacitive sensor according to a second embodiment of the invention, with a substrate of the capacitive sensor shown as transparent, showing a superposition relationship between a detection electrode, a drive electrode, and a ground electrode.
Figure 9B:
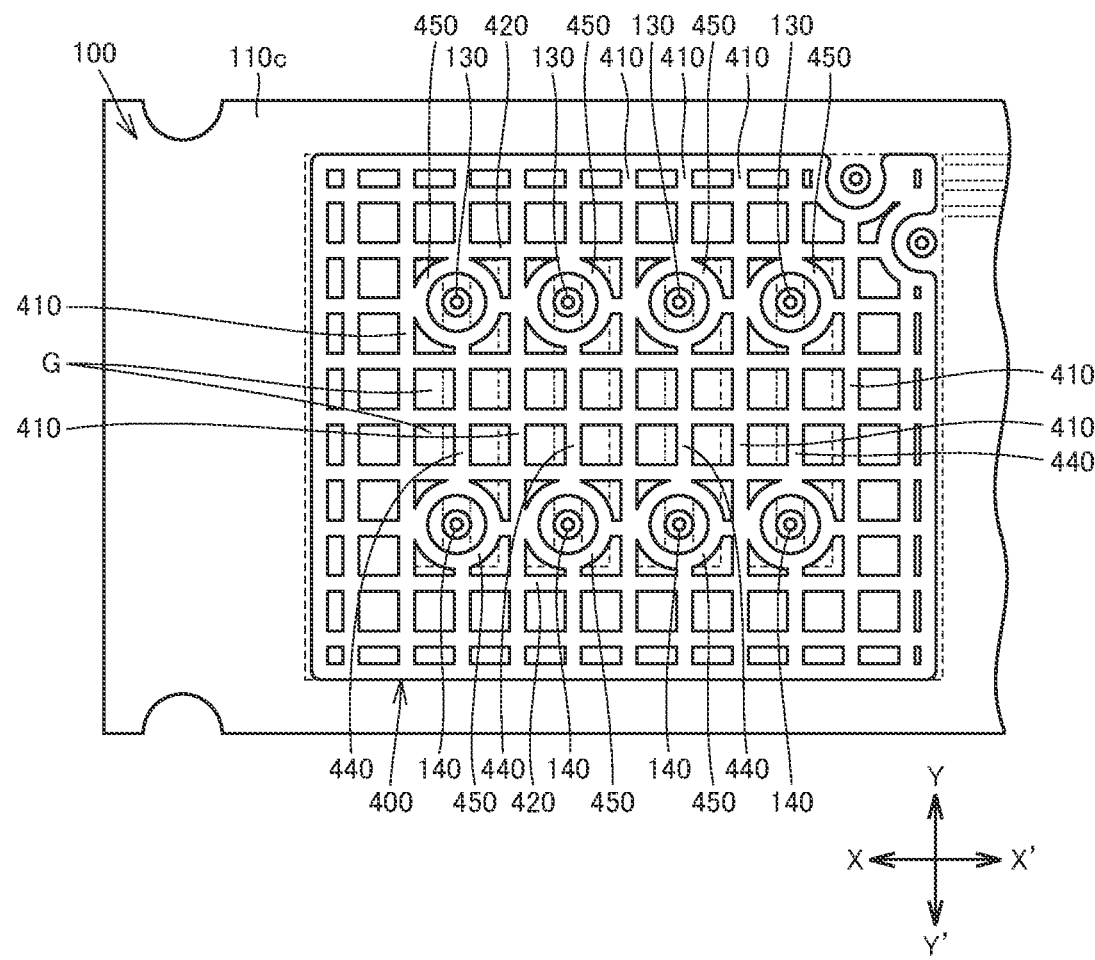
FIG. 9B is a schematic bottom view of the capacitive sensor of the second embodiment, with the substrate of the capacitive sensor shown as transparent, showing a superposition relationship between the detection electrode, the drive electrode, and the ground electrode.
Figure 11A:
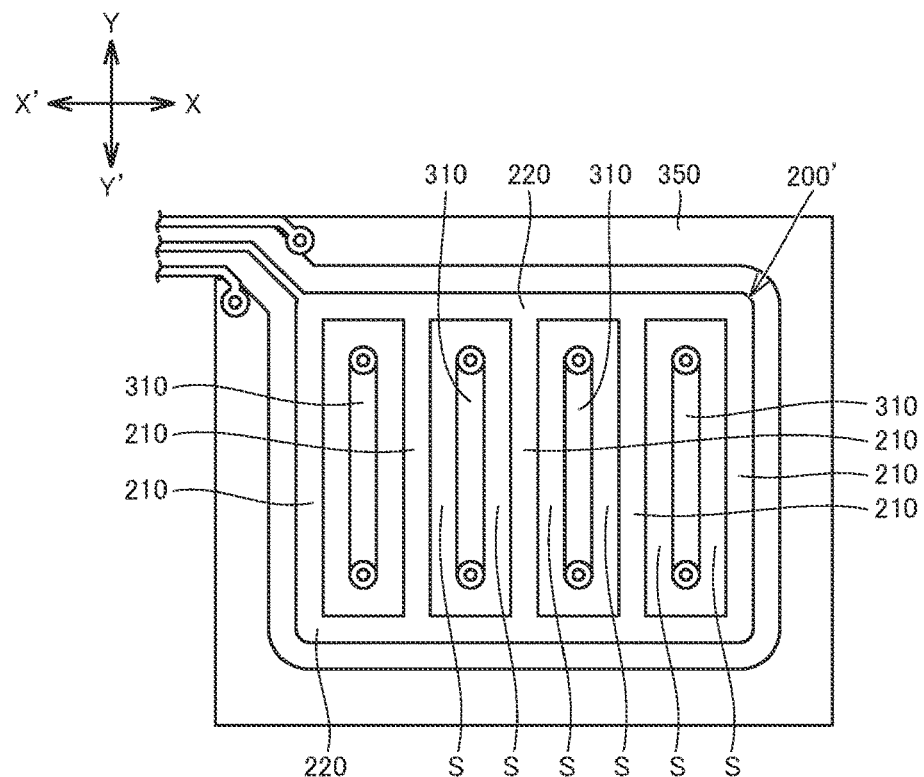
FIG. 11A is a schematic plan view showing relative positions of first and second detection lines of the detection electrode and first and fifth drive lines of the drive electrode on a first face of the substrate of the capacitive sensor of the second embodiment.
Figure 11B:
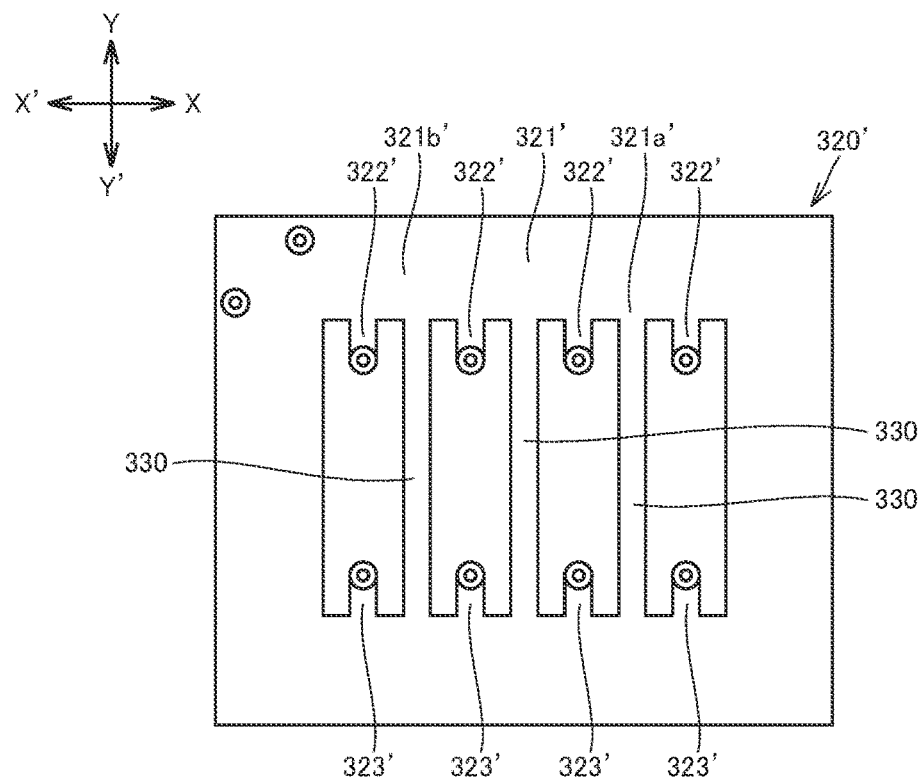
FIG. 11B is a schematic plan view showing relative positions of second and third drive lines of the drive electrode on a second face of the substrate of the capacitive sensor of the second embodiment.
Figure 11C:
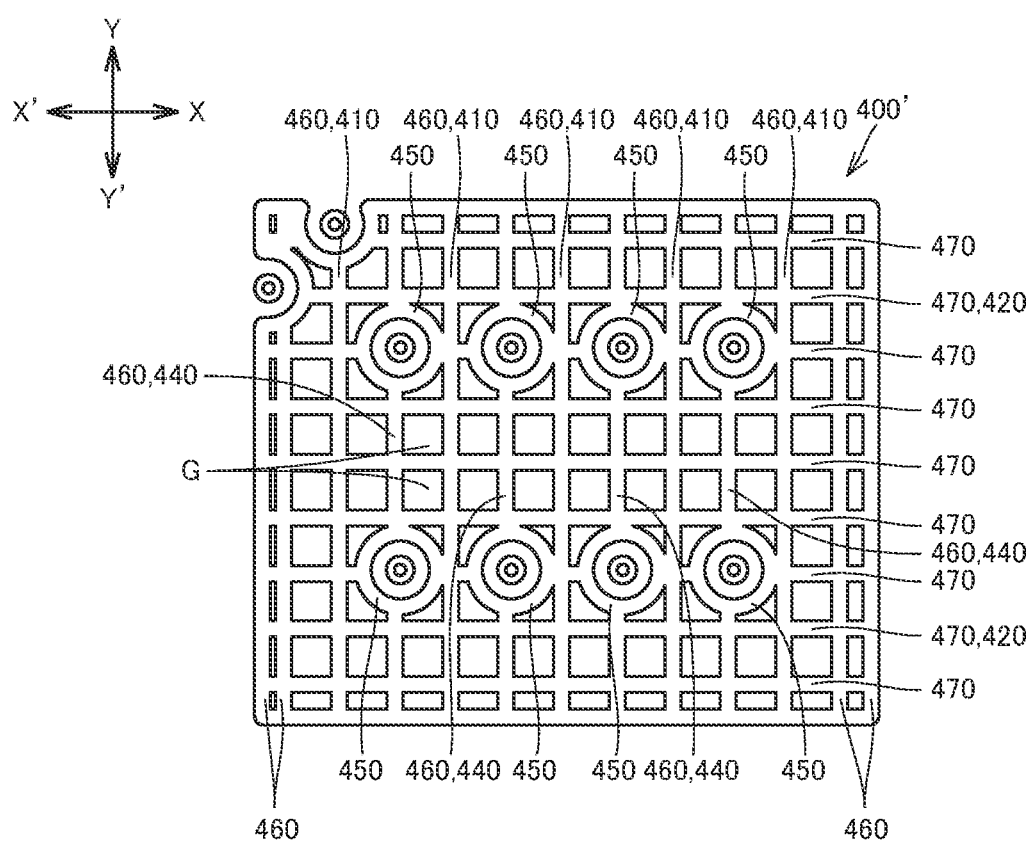
FIG. 11C is a schematic plan view showing relative positions of first and second ground lines and fourth and fifth ground lines of the ground electrode on a third face of the substrate of the capacitive sensor of the second embodiment.

The plurality of first detection lines 210 of the detection electrode 200' extend in the Y-Y' direction and are arrayed at spaced intervals in the X-X' direction (see FIGS. 9A and 11A). The first detection lines 210 each have a first end on the Y-direction side and a second end on the Y'-direction side. The first detection lines 210 include a first detection line 210 on the X-direction side and a first detection line 210 on the X'-direction side. The first detection line 210 on the X-direction side is the one of the first detection lines 210 that is located on the most X-direction side. The first detection line 210 on the X'-direction side is the one of the first detection lines 210 that is located on the most X'-direction side.

The pair of second detection lines 220 of the detection electrode 200' includes one and the other of the second detection lines 220. The one second detection line 220 extends in the X-X' direction and is coupled to the first ends of the first detection lines 210. The other second detection line 220 extends in the X-X' direction and is coupled to the second ends of the first detection lines 210. The first detection line 210 on the X-direction side, the first detection line 210 on the X'-direction side, and the pair of second detection lines 220 form a detection line of generally rectangular ring shape. This detection line may be referred to as a "ring-shaped detection line". It should be noted that only one of the pair of second detection lines 220 may be provided.

The plurality of first drive lines 310 of the drive electrode 300' extend in the Y-Y' direction. Each of the first drive lines 310 is arranged between adjacent two of the first detection lines 210 as viewed from the Z-direction side. The first drive lines 310 each have a first end in the Y direction and a second end in the Y' direction. Each of the first drive lines 310 has a dimension in the Y-Y' direction that is smaller than that of each of the first detection lines 210. The first ends of the first drive lines 310 are spaced from the one second detection line 220 in the Y-Y' direction, and the second ends of the first drive lines 310 are spaced from the other second detection line 220 in the Y-Y direction. Accordingly, the first drive lines 310 are not electrically connected to the second detection lines 220.

The drive electrode 300' may further include the fifth drive line 350 described above. In this case, the fifth drive line 350 surrounds the ring-shaped detection line in spaced relation to each other on the first face 110a of the substrate 100. The fifth drive line 350 can be omitted.

The second drive line 320' of the drive electrode 300' includes a main body 321' having a ring shape or a partially discontinuous ring shape. The main body 321' includes a first portion 321a' and/or a second portion 321b'. Where the first portion 321a' is provided, the first portion 321a' is an inner perimeter portion of the main body 321' and is located such as to overlap the ring-shaped detection line as viewed from the Z-direction side, and the second portion 321b' is a portion of the main body 321' that has a ring shape or a partially discontinuous ring shape and is located outside the first portion 321a' of the main body 321' and outside the ring-shaped detection line. Where the first portion 321a' is not provided, the second portion 321b' is a portion of the main body 321' that has a ring shape or a partially discontinuous ring shape and is located outside the ring-shaped detection line. Where the fifth drive line 350 is provided, whether or not the first portion 321a' is provided, the second portion of the main body 321' is located between the fifth drive line 350 and the ring-shaped detection line as viewed from the Z-direction side. Where the fifth drive line 350 is provided, the main body 321' is connected to the fifth drive line 350 via a through-hole electrode of the substrate 100. The second portion of the main body 321' can be omitted.

The second drive line 320' may further include a plurality of first connecting portions 322' and a plurality of second connecting portions 323'. In this case, the substrate 100 include a plurality of through-hole electrodes 130 and a plurality of through-hole electrodes 140. Each first connecting portion 322' extends in the Y' direction, from a portion on the Y-direction side of the first portion 321a' of the main body 321' to a position on the Z'-direction side relative to the first end of a corresponding one of the first drive lines 310. The distal end of each first connecting portion 322' is connected to the first end of the corresponding first drive line 310 via a corresponding one of the through-hole electrodes 130 of the substrate 100. When viewed from the Z-direction side, each first connecting portions 322' is arranged between adjacent two of the first detection lines 210 and also between the first end of the corresponding first drive line 310 and the one second detection line 220. Each second connecting portion 323' extends in the Y direction, from a portion on the Y'-direction side of the first portion 321a' of the main body 321' to a position on the Z'-direction side relative to the second end of a corresponding one of the first drive lines 310. The distal end of the second connecting portion 323' is connected to the second end of the corresponding first drive line 310 via a corresponding one of the corresponding through-hole electrodes 140 of the substrate 100. When viewed from the Z-direction side, each second connecting portion 323' is arranged between adjacent two of the first detection lines 210 and also between the second end of the corresponding first drive line 310 and the other second detection line 220.

The first drive lines 310 may be provided not on the first face 110a of the substrate 100, but on the second face 110b of the substrate 100. In this case, the first connecting portions 322' and the second connecting portions 323' can be omitted, and the first and second ends of the first drive lines 310 may extend to, and be coupled to, the main body 321'.

Irrespective of whether the plurality of first drive lines 310 are provided on the first face 110a or the second face 110b of the substrate 100, two elongated spaces S exist between adjacent two of the first detection lines 210 and one of the first drive lines 310 that is located between the adjacent two first detection lines as viewed from the Z direction. The two spaces S exist for each set of the two adjacent first detection lines 210. In other words, there is a plurality of sets of the two spaces S.

The drive electrode 300' may further include at least one third drive line 330. The or each third drive line 330 extends from the portion on the Y-direction side to the portion on the Y'-direction side of the first portion 321a' of the main body 321'. The one or plurality of third drive lines 330 of the drive electrode 300' is arranged on the second face 110b of the substrate 100 such as to extend along, and overlap as viewed from the Z-direction side, the one or plurality of first detection lines 210. The at least one third drive line 330 can be omitted.

The sensor S2 may further include a ground electrode 400' electrically connected to a ground of the substrate 100. The ground electrode 400' may include the plurality of first ground lines 410 and/or the at least one second ground line 420 described above. The at least one second ground line 420 may include two second ground lines 420 arranged such as to each overlap one of the pair of second detection lines 220. The two second ground lines 420 include a second ground line 420 on the Y-direction side and a second ground line 420 on the Y'-direction side.

Where the at least one third drive line 330 is provided, the ground electrode 400' may further include at least one fourth ground line 440 electrically connected to at least the plurality of first ground lines 410. The least one fourth ground line 440 is made of a material that is the same or similar to that of the first detection lines 210. The at least one fourth ground line 440 is arranged on the third face 110c of the substrate 100 such as to extend along, and overlap as viewed from the Z-direction side, at least one of the first drive lines 310. The at least one fourth ground line 440 may include a plurality of fourth ground lines 440 arranged on the third face 110c of the substrate 100 such as to overlap the corresponding first drive lines 310. In this case, the fourth ground lines 440 and the first ground lines 410 are arranged alternately one after the other in the X-X' direction.

The ground electrode 400' may include a plurality of sixth ground lines 460 and a plurality of seventh ground lines 470. The sixth ground lines 460 and the seventh ground lines 470 are made of a material that is the same or similar to that of the first detection lines 210. The sixth ground lines 460 are provided on the third face 110c of the substrate 100, extend in the Y-Y' direction, and arrayed at spaced intervals in the X-X' direction. The seventh ground lines 470 are provided on the third face 110c of the substrate 100, extend in the X-X' direction, and are arrayed at spaced intervals in the Y-Y' direction. The sixth ground lines 460 and the seventh ground lines 470 mutually intersect forming a mesh pattern and are mutually connected electrically at the intersections. The sixth ground lines 460 include the plurality of first ground lines 410 and the at least one fourth ground line 440, and the plurality of seventh ground lines 470 include the at least one second ground line 420.

Figure 10A:
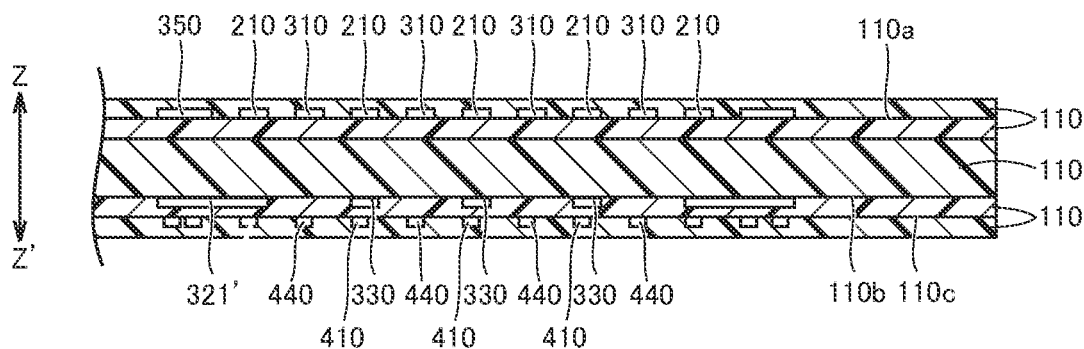
FIG. 10A is a cross-sectional view, taken along line 10A-10A in FIG. 9A, of the capacitive sensor of the second embodiment.
Figure 10B:
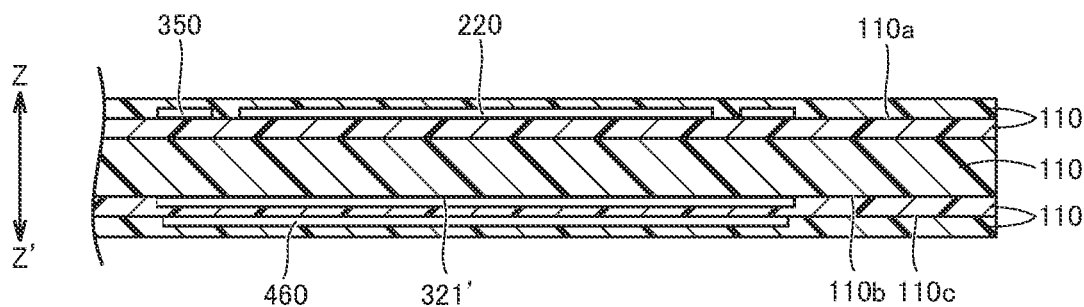
FIG. 10B is a cross-sectional view, taken along line 10B-10B in FIG. 9A, of the capacitive sensor of the second embodiment.
Figure 10C:
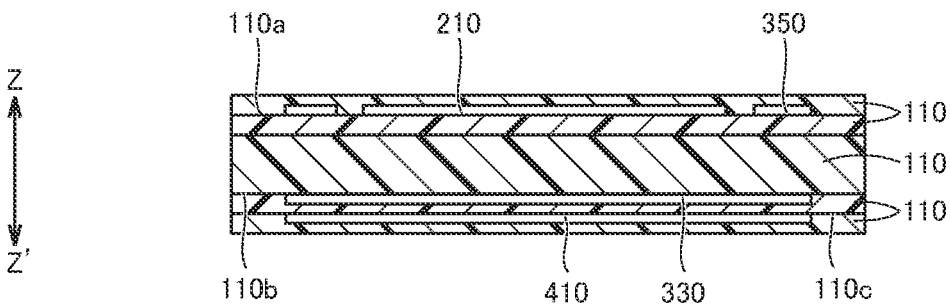
FIG. 10C is a cross-sectional view, taken along line 10C-10C in FIG. 9A, of the capacitive sensor of the second embodiment.
Figure 10D:
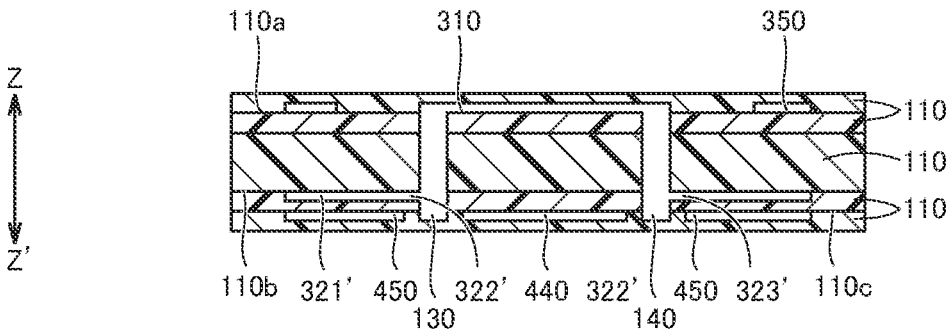
FIG. 10D is a cross-sectional view, taken along line 10D-10D in FIG. 9A, of the capacitive sensor of the second embodiment.

The plurality of through-hole electrodes 130 and the plurality of through-hole electrodes 140 of the substrate 100 may reach the third face 110c of the substrate 100 (see FIG. 10D). In this case, the ground electrode 400' may further include a plurality of fifth ground lines 450 generally of ring shape, made of a material that is the same or similar to that of the first detection lines 210.

Each of the fifth ground lines 450 is arranged on the third face 110c of the substrate 100 such as to be located between, and coupled to, adjacent two of the plurality of first ground lines 410. The fifth ground lines 450 include a plurality of fifth ground lines 450 on the Y-direction side, each surrounding one of the through-hole electrodes 130, and a plurality of fifth ground lines 450 on the Y'-direction side, each surrounding one of the through-hole electrodes 140. The fifth ground lines 450 on the Y-direction side are located on the Y'-direction side adjacently to, and coupled to, the second ground line 420 on the Y-direction side. The fifth ground lines 450 on the Y-direction side divide, and are coupled to, one of the seventh ground lines 470 that is located on the Y'-direction side relative to the second ground line 420 on the Y-direction side. The fifth ground lines 450 on the Y'-direction side are located on the Y-direction side adjacently to, and coupled to, the second ground line 420 on the Y'-direction side. The fifth ground lines 450 on the Y'-direction side divide, and are coupled to, one of the seventh ground lines 470 that is located on the Y-direction side relative to the second ground line 420 on the Y'-direction side. Further, each of the fifth ground lines 450 on the Y-direction side and each of the fifth ground lines 450 on the Y'-direction side divide, and are coupled to, a corresponding one of the fourth ground lines 440.

It is possible to omit the plurality of first ground lines 410, the at least one second ground line 420, the at least one fourth ground line 440, the plurality of fifth ground lines 450, and/or the at least one sixth ground line 460. On the other hand, the ground electrode 400' may further include the third ground line 430 described above as in the ground electrode 400 of the sensor S1.

Where the at least one fourth ground line 440 is not provided, an elongated gap may be provided to extend between, and along, each adjacent two of the first ground lines 410. In this case, each gap is located on the Z'-direction side relative to the two spaces S of the corresponding set.

Where the plurality of fourth ground lines 440 are provided, an elongated gap may be provided to extend between, and along, each of the fourth ground lines 440 and one of the first ground lines 410 that is adjacent to the fourth ground line 440. Each gap exists for each set of the adjacent fourth ground line 440 and first ground line 410. Each gap is located on the Z'-direction side relative to a corresponding one of the spaces S.

Where the plurality of sixth ground lines 460 and the plurality of seventh ground lines 470 mutually intersect forming a mesh pattern, the mesh constituted by the sixth ground lines 460 and the seventh ground lines 470 has a plurality of clearances being a plurality of gaps. Each gap is defined by adjacent two of the sixth ground lines 460 and adjacent two of the seventh ground lines 470 which intersect the adjacent two sixth ground lines 460. The gaps in the mesh include a plurality of sets of gaps G, and the gap G of each set is located between adjacent two of the first ground lines 410 and fourth ground lines 440 of the sixth ground lines 460. Each gap G is located on the Z'-direction side relative to a corresponding one of the spaces S.

Similarly to the controller 500 of the sensor S1, a controller 500 of the sensor S2 is configured to charge and discharge the detection electrode 200' and supply drive pulses to the drive electrode 300'. When a detection target approaches the detection electrode 200' while the detection electrode 200' is being charged and discharged, the approach causes a change in a first capacitance between the detection electrode 200' and the detection target. When a detection target approaches the detection electrode 200' and the drive electrode 300' while drive pulses are being supplied to the drive electrode 300' (which may be referred to simply as "during drive pulses supply"), the approach causes a change in a second capacitance between the detection electrode 200' and the drive electrode 300'. Similarly to the controller 500 of the sensor S1, the controller 500 of the sensor S2 is further configured to detect the detection target on the basis of the change in the first capacitance between the detection electrode 200' and the detection target and the change in the second capacitance between the detection electrode 200' and the drive electrode 300'.

A second capacitance CTXRX of the sensor S2 includes at least a first mutual capacitance as described above. Where the second portion 321b' of the main body 321' of the second drive line 320' is arranged outside the ring-shaped detection line, the second capacitance CTXRX further includes a tenth mutual capacitance. During drive pulses supply, a tenth mutual capacitance is formed between the second portion 321b' of the main body 321' and the ring-shaped detection line. Where the plurality of first connecting portions 322' and the plurality of second connecting portions 323' of the second drive line 320' are provided, the second capacitance CTXRX further includes an eleventh mutual capacitance, a twelfth mutual capacitance, a thirteenth mutual capacitance, and a fourteenth mutual capacitance. During drive pulses supply, an eleventh mutual capacitance is formed between the first connecting portions 322' and the first detection lines 210 adjacent thereto, a twelfth mutual capacitance is formed between the second connecting portions 323' and the first detection lines 210 adjacent thereto, a thirteenth mutual capacitance is formed between the first connecting portions 322' and the one second detection line 220, and a fourteenth mutual capacitance is formed between the second connecting portions 323' and the other second detection line 220. Where the fifth drive line 350 surrounds the ring-shaped detection line in spaced relation to each other, the second capacitance CTXRX further includes a fifteenth mutual capacitance. During drive pulses supply, a fifteenth mutual capacitance is formed between the fifth drive line 350 and the ring-shaped detection line.

The sensor S2 as described above provides the following technical features and effects.

Technical Feature and Effect (1): Each of the first drive lines 310 of the drive electrode 300' is located between adjacent two of the first detection lines 210 of the detection electrode 200' as viewed from the Z-direction side. With this arrangement, a conductor deposit adhering to the detection face is located substantially on the Z-direction side relative to at least one of the first drive lines 310 and the first detection line(s) 210 adjacent thereto, making it possible to change the first mutual capacitance of the second capacitance CTXRX, formed between the at least one of the first drive lines 310 and the first detection line(s) 210 adjacent thereto. Such change in the first mutual capacitance increases the possibility that the conductor deposit adhering to the detection face changes the second capacitance CTXRX, thereby reducing the possibility that the controller 500 erroneously detects the conductor deposit as a detection target.

Where the second portion 321b' of the body 321' of the second drive line 320' surrounds the ring-shaped detection line, the conductor deposit adhering to the detection face is located substantially on the Z-direction side relative to the second portion 321b' of the main body 321' of the second drive line 320' and the ring-shaped detection line, making it possible to change the tenth mutual capacitance of the second capacitance CTXRX, formed between the second portion 321b' of the main body 321' and the ring-shaped detection line. Such change in the tenth mutual capacitance increases the possibility that the conductor deposit adhering to the detection face changes the second capacitance CTXRX, thereby reducing the possibility that the controller 500 erroneously detects the conductor deposit as a detection target.

Where the plurality of first connecting portions 322' and the plurality of second connecting portions 323' of the second drive line 320' are provided, a conductor deposit adhering to the detection face is located substantially on the Z-direction side relative to at least one of the first and second connecting portions 322' and 323', making it possible to change the eleventh, twelfth, thirteenth and/or fourteenth mutual capacitance of the second capacitance CTXRX. The eleventh mutual capacitance is formed between each of the first connecting portions 322' and the first detection line(s) 210 adjacent thereto. The twelfth mutual capacitance is formed between each of the second connecting portions 323' and the first detection line(s) 210 adjacent thereto. The thirteenth mutual capacitance is formed between each of the first connecting portions 322' and the one second detection line 220. The fourteenth mutual capacitance formed between each of the second connecting portions 323' and the other second detection line 220. Such change(s) in the mutual capacitance(s) increases the possibility that the conductor deposit adhering to the detection face changes the second capacitance CTXRX, thereby reducing the possibility that the controller 500 erroneously detects the conductor deposit as a detection target.

Where the fifth drive line 350 surrounds the ring-shaped detection line in spaced relation to each other, a conductor deposit adhering to the detection face is located substantially on the Z-direction side relative to the fifth drive line 350 and the ring-shaped detection line, making it possible to change the fifteenth mutual capacitance of the second capacitance CTXRX, formed between the fifth drive line 350 and the ring-shaped detection line. Such change in the fifteenth mutual capacitance increases the possibility that the conductor deposit adhering to the detection face changes the second capacitance CTXRX, thereby reducing the possibility that the controller 500 erroneously detects the conductor deposit as a detection target.

Technical Feature and Effect (2): The first portion 321a' of the main body 321' of the second drive line 320' overlaps the ring-shaped detection line as viewed from the Z-direction side and thereby functions as an electromagnetic shield to shield the ring-shaped detection line (namely, the first detections 210 on the X- and X'-direction side and the pair of second detection lines 220) from the Z'-direction side. Therefore, the ring-shaped detection line is less susceptible to electromagnetic influence from the Z'-direction side.

Further, where the at least one third drive line 330 is provided, the one or plurality of third drive lines 330 on the second face 110b of the substrate 100 overlaps at least one of the first detection lines 210 on the first face 110a of the substrate 100 and thereby function an electromagnetic shield to shield the at least one first detection line 210 from the Z'-direction side. Therefore, the at least one first detection line 210 is susceptible to electromagnetic influence from the Z'-direction side.

Technical Feature and Effect (3): Where the plurality of sets of two spaces S exist, with two spaces S of each set located between adjacent two of the first detection lines 210 and the first drive line 310 located therebetween as viewed from the Z direction, the at least one fourth ground line 440 is not provided, and the plurality of gaps exists, each located between adjacent two of the first ground lines 410 of the ground electrode 400', each gap is located on the Z'-direction side relative to the two spaces S of the corresponding set. In this case, part of the electric charge from the first drive lines 310 does not move to the gaps but moves to the adjacent first detection lines 210, suppressing the reduction in the first mutual capacitance.

Also, where the plurality of sets of two spaces S are provided, the plurality of fourth ground lines 440 is provided, and the plurality of gaps exits each between one of the fourth ground lines 440 and one of the first ground lines 410 that is adjacent to the fourth ground line 440, each gap is located on the Z'-direction side relative to a corresponding one of the spaces S. In this case, during drive pulses supply, part of the electric charge from the first drive lines 310 does not move to the gaps but moves to the adjacent first detection lines 210, suppressing the reduction in the first mutual capacitance.

Further, where the plurality of sets of the two spaces S exist, the plurality of sixth ground lines 460 and the plurality of seventh ground lines 470 mutually intersect forming a mesh pattern, the mesh constituted by the sixth ground lines 460 and the seventh ground lines 470 has the plurality of clearances being the plurality of gaps including the plurality of sets of gaps G, and the gaps G of each set is located between adjacent two of the first ground lines 410 and fourth ground lines 440, each gap G is located on the Z'-direction side relative to the corresponding space S. In this case, part of the electric charge from the first drive lines 310 does not move to the gaps G, suppressing the reduction in the first mutual capacitance.

Where the first ground lines 410 and/or the second ground line 420 of the ground electrode 400' is provided, the sensor S2 exhibits the same technical feature and effect as the technical feature and effect (3) of the sensor S1.

Third Embodiment

Hereinafter described is a capacitive sensor S3 (which may be referred to simply as a sensor S3) according to a plurality of embodiments, including a third embodiment and variants thereof, of the invention, with reference to FIGS. 12A to 14C. FIGS. 12A to 14C show the capacitive sensor S3 of the second embodiment. FIGS. 13A to 13D also show the Z-Z' direction as in the sensor S1. FIGS. 12A and 12B and FIGS. 14A to 14C also show the X-X' and Y-Y' directions as in the sensor S1.

The sensor S3 has a configuration similar to that of the sensor S1 but different in the following points: (1) a detection electrode 200" includes a plurality of first detection lines 210 and at least one second detection line 220 on the first face 110a of a substrate 100, and a plurality of fourth detection lines 240 on the second face 110b of the substrate 100, and that (2) a drive electrode 300'' includes a plurality of first drive lines 310 on the first face 110a of the substrate 100 and a plurality of third drive lines 330 on the second face 110b of the substrate 100. These differences will be described in detail, omitting descriptions of the sensor S3 on overlaps with the sensor S1.

Figure 12A:
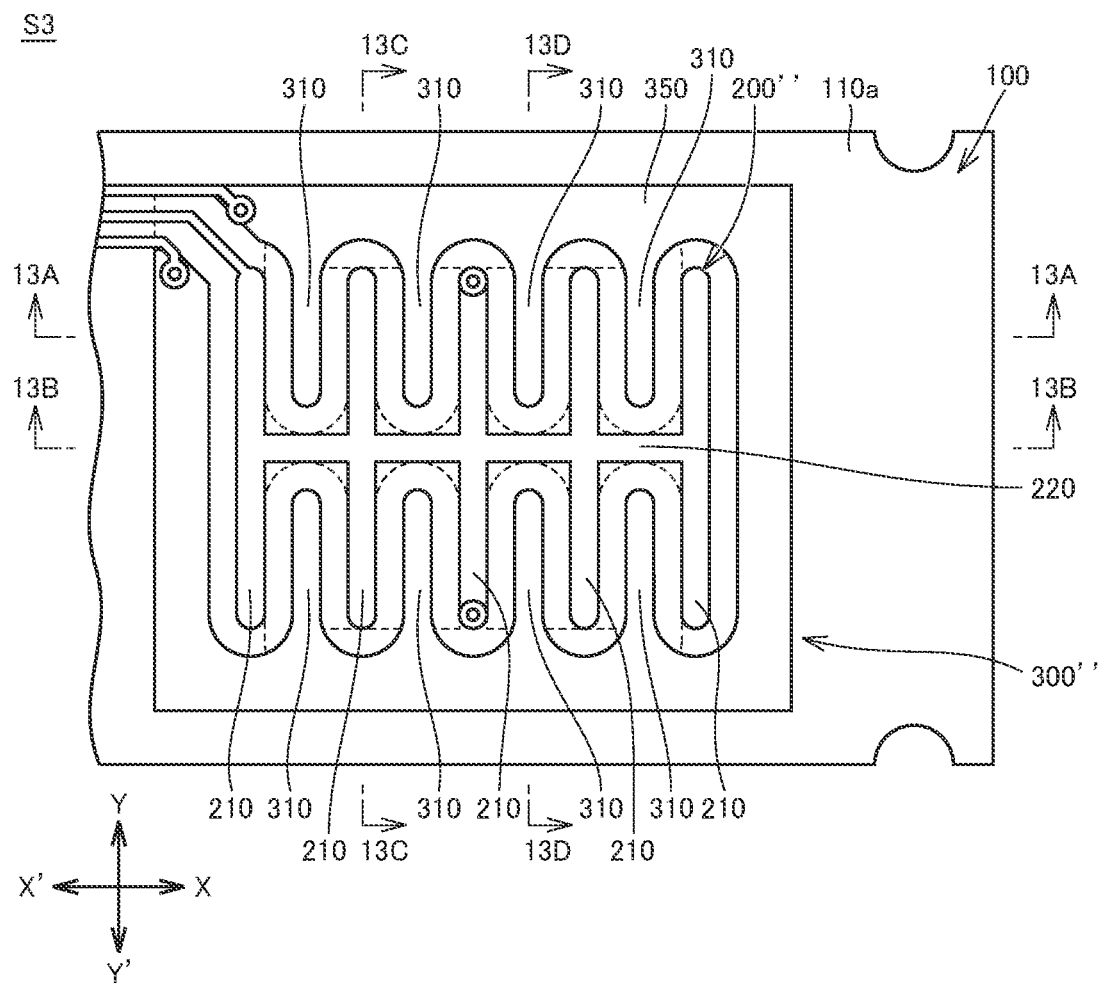
FIG. 12A is a schematic plan view of a capacitive sensor according to a third embodiment of the invention, with a substrate of the capacitive sensor shown as transparent, showing a superposition relationship between a detection electrode and a drive electrode.
Figure 12B:
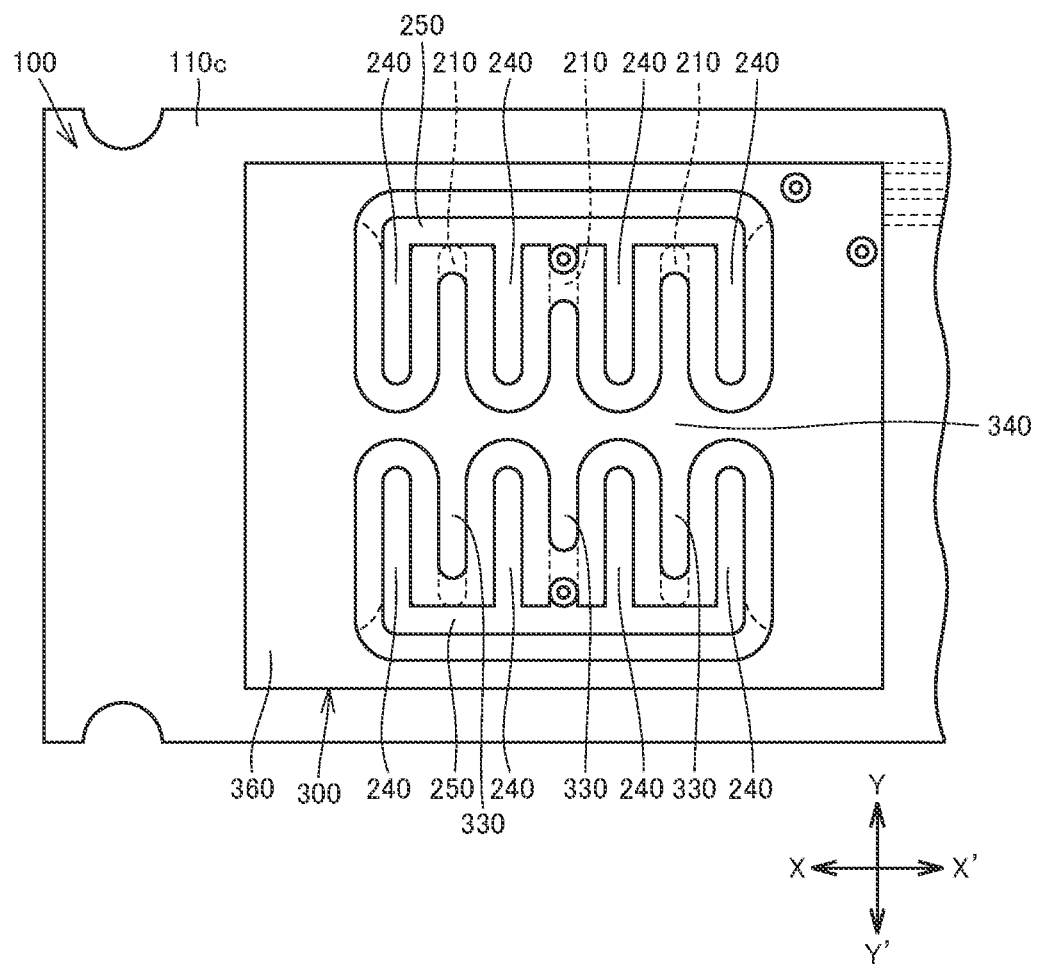
FIG. 12B is a schematic bottom view of the capacitive sensor of the third embodiment, with the substrate of the capacitive sensor shown as transparent, showing a superposition relationship between the detection electrode and the drive electrode.
Figure 13A:
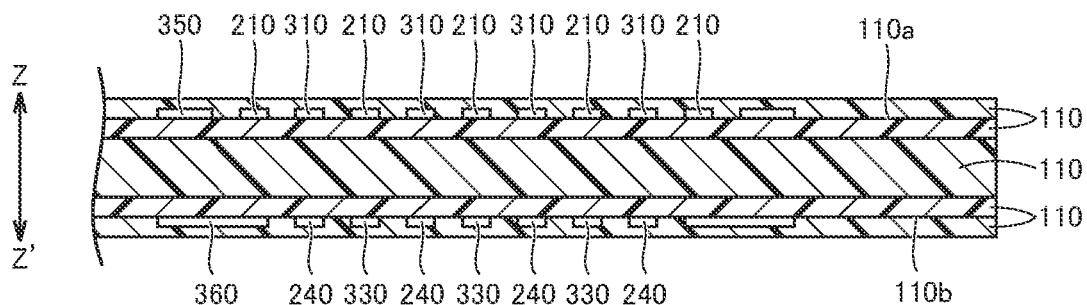
FIG. 13A is a cross-sectional view, taken along line 13A-13A in FIG. 12A, of the capacitive sensor of the third embodiment.
Figure 13B:
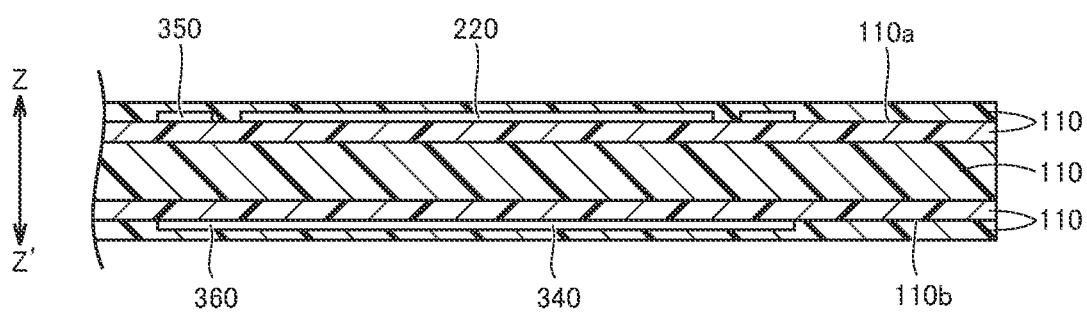
FIG. 13B is a cross-sectional view, taken along line 13B-13B in FIG. 12A, of the capacitive sensor of the third embodiment.
Figure 13C:
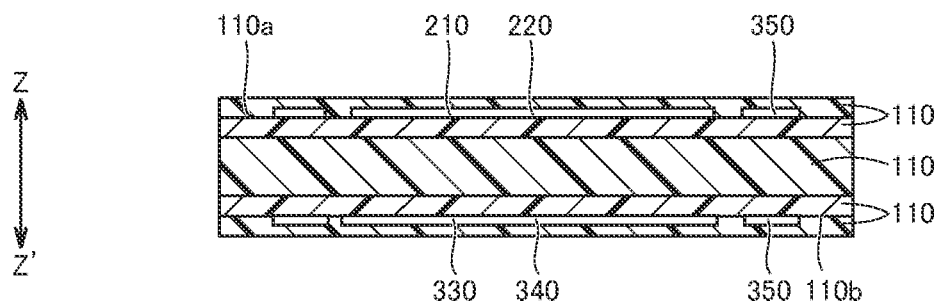
FIG. 13C is a cross-sectional view, taken along line 13C-13C in FIG. 12A, of the capacitive sensor of the third embodiment.
Figure 13D:
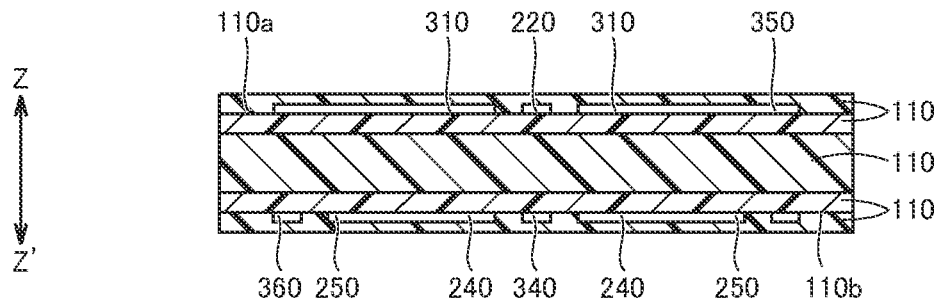
FIG. 13D is a cross-sectional view, taken along line 13D-13D in FIG. 12A, of the capacitive sensor of the third embodiment.
Figure 14A:
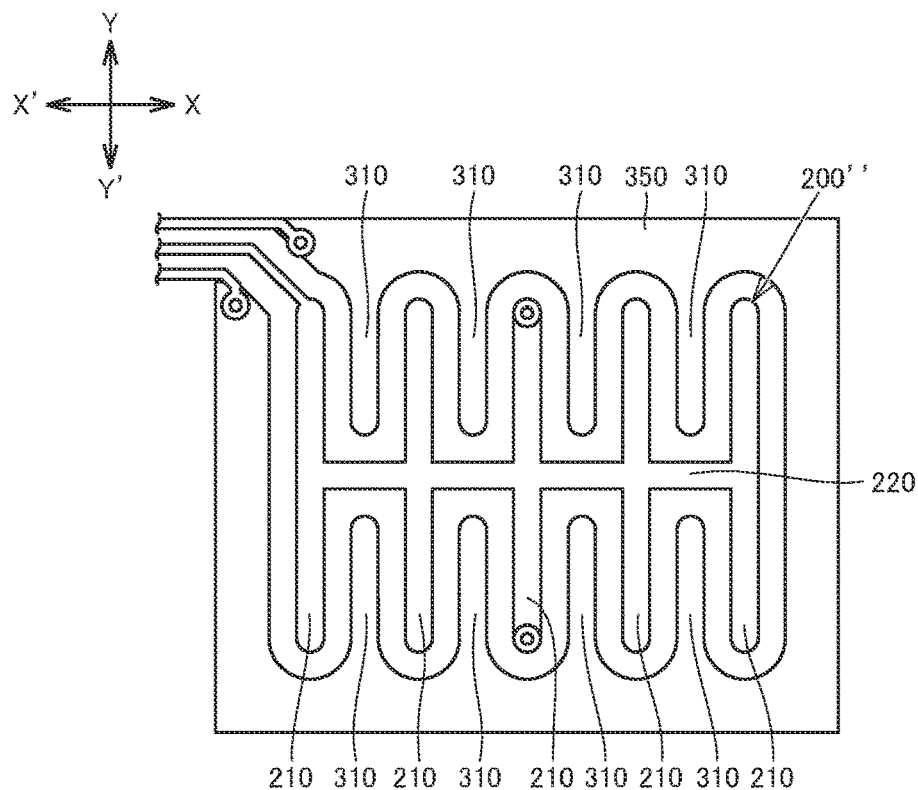
FIG. 14A is a schematic plan view showing relative positions of first and second detection lines of the detection electrode and first and fifth drive lines of the drive electrode on a first face of the substrate of the capacitive sensor of the third embodiment.
Figure 14B:
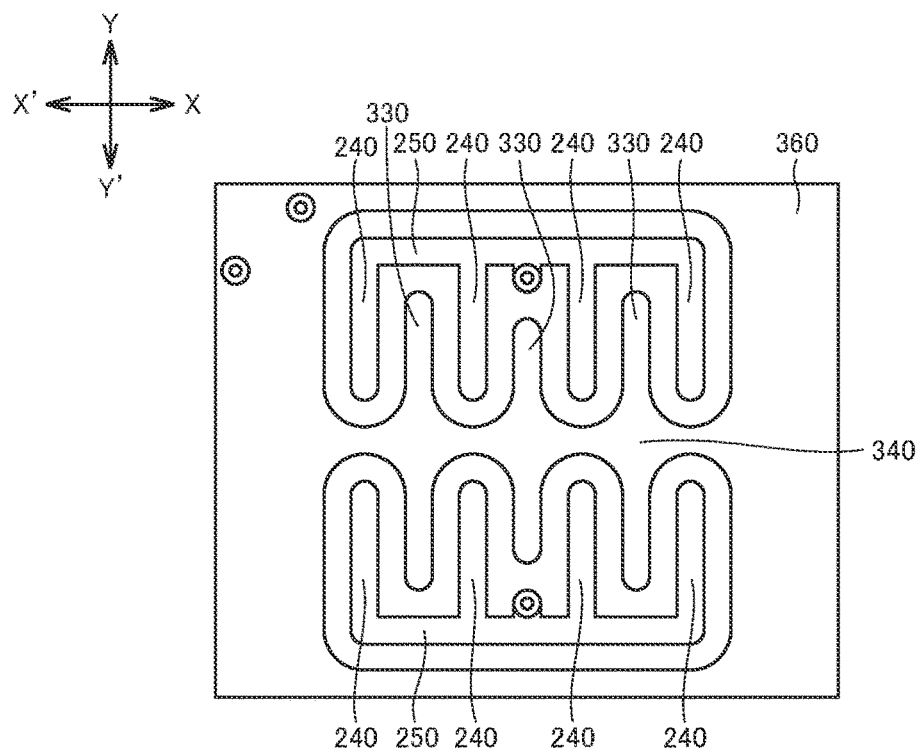
FIG. 14B is a schematic plan view showing relative positions of fourth and fifth detection lines of the detection electrode and third and fourth drive lines of the drive electrode on a second face of the substrate of the capacitive sensor of the third embodiment.

The plurality of first detection lines 210 of the detection electrode 200'' extend in the Y-Y' direction and are arrayed at spaced intervals in the X-X' direction (see FIGS. 12A and 14A). The first detection lines 210 each include a first end portion on the Y-direction side, a second end portion on the Y'-direction side, and an intermediate portion between the first and second end portions. The at least one second detection line 220 of the detection electrode 200'' extends in the X-X' direction, intersects the intermediate portions of the first detection lines 210, and is electrically connected to the first detection lines 210 at the intersections. Where the at least one second detection line 220 include a plurality of second detection lines 220, the second detection lines 220 may be arrayed at spaced intervals in the Y-Y' direction.

The plurality of first drive lines 310 of the drive electrode 300'' extend in the Y-Y' direction. Each of the first drive lines 310 has a dimension in the Y-Y' direction that is smaller than that of each of the first detection lines 210. The first drive lines 310 are provided on the first face 110a of the substrate 100. The first drive lines 310 include a plurality of first drive lines 310 on the Y-direction side, each located between the first end portions of adjacent two of the first detection lines 210 as viewed from the Z-direction side, and a plurality of first drive lines 310 on the Y'-direction side, each located between the second end portions of adjacent two of the first detection lines 210 as viewed from the Z-direction side. The first drive lines 310 each have a first end and a second end on the opposite side, and each first end being located closer to the at least one second detection line 220 than the corresponding second end is. The first ends of the first drive lines 310 are located in spaced relation to the at least one second detection line 220 in the Y-Y' direction. Accordingly, the first drive lines 310 are not electrically connected to the at least one second detection line 220.

The drive electrode 300'' may further include the fifth drive line 350 described above. The fifth drive line 350 surrounds the plurality of first detection lines 210, the at least one second detection line 220, and the plurality of first drive lines 310 on the first face 110a of the substrate 100. The second ends of the first drive lines 310 are coupled to the fifth drive line 350. The fifth drive line 350 is arranged in spaced relation to the plurality of first detection lines 210 and the at least one second detection line 220.

The plurality of third drive lines 330 of the drive electrode 300'' is electrically connected to the plurality of first drive lines 310, but are not to the plurality of first detection lines 210 nor the at least one second detection line 220. The third drive lines 330 are arranged on the second face 110b of the substrate 100 such as to extend along, and overlap as viewed from the Z-direction side, the corresponding first detection lines 210. The third drive lines 330 each include a first end portion on the Y-direction side, a second end portion on the Y'-direction side, and an intermediate portion between the first and second end portions.

The drive electrode 300'' may further include at least one fourth drive line 340. The or each fourth drive line 340 is arranged on the second face 110b of the substrate 100 such as to extend generally along, overlap as viewed from the Z-direction side, the corresponding second detection line 220. The at least one fourth drive line 340 intersects the intermediate portions of the plurality of third drive lines 330 and is electrically connected to the plurality of third drive lines 330 at the intersections. In other words, the at least one fourth drive line 340, the first drive lines 310, and the third drive lines 330 are mutually connected electrically.

The plurality of fourth detection lines 240 of the detection electrode 200'' are made of a material that is the same or similar to that of the first detection lines 210, extend generally along the plurality of first drive lines 310, and are arranged such as to overlap the first drive lines 310 as viewed from the Z-direction side. The fourth detection lines 240 includes fourth detection lines 240 on the Y-direction side, which overlap the first drive lines 310 on the Y-direction side, and fourth detection lines 240 on the Y'-direction side, which overlap the first drive lines 310 on the Y'-direction side. More particularly, the fourth detection lines 240 on the Y-direction side include a fourth detection line 240 on the YX-direction side, which is the most X-direction side one of the fourth detection lines 240 on the Y-direction side, and a fourth detection line 240 on the YX'-direction side, which is the most X'-direction side one of the fourth detection lines 240 on the Y-direction side. The fourth detection lines 240 on the Y'-direction side include a fourth detection line 240 on the Y'X-direction side, which is the most X-direction side one of the fourth detection lines 240 on the Y'-direction side, and a fourth detection line 240 on the Y'X'-direction side, which is the most X'-direction side one of the fourth detection lines 240 on the Y'-direction side.

The plurality of fourth detection lines 240 on the Y-direction side and the first end portions of the plurality of third drive lines 330 are alternately arranged one by one at spaced intervals in the X-X' direction, and the plurality of fourth detection lines 240 on the Y'-direction side and the second end portions of the plurality of third drive lines 330 are alternately arranged one by one at spaced intervals in the X-X' direction. Accordingly, the fourth detection lines 240 are not electrically connected to the third drive lines 330. Each of the fourth detection lines 240 has a first end and a second end on the opposite side, and each first end being located closer to the at least one fourth drive line 340 than the corresponding second end is. The first ends of the fourth detection lines 240 are located in spaced relation to the at least one fourth drive line 340 in the Y-Y' direction. Accordingly, the fourth detection lines 240 are not electrically connected to the at least one fourth drive line 340. The fourth detection lines 240 are connected to the plurality of first detection lines 210 and the at least one second detection line 220. The at least one fourth drive line 340 can be omitted.

The detection electrode 200'' may further include a plurality of fifth detection lines 250 on the second face 110b of the substrate 100. The fifth detection lines 250 are made of a material that is the same or similar to that of the first detection lines 210 and extend in the X-X' direction. The fifth detection lines 250 include a fifth detection line 250 on the Y-direction side and a fifth detection line 250 on the Y'-direction side. The fifth detection line 250 on the Y-direction side is coupled to the second ends of the fourth detection lines 240 on the Y-direction side and is electrically connected to the fourth detection lines 240 on the Y-direction side. However, the fifth detection line 250 on the Y-direction side is arranged in spaced relation to the first end potions of the third drive lines 330 in the Y-Y' direction, and accordingly is not electrically connected to the third drive lines 330. The fifth detection line 250 on the Y'-direction side is coupled to the second ends of the fourth detection lines 240 on the Y'-direction side and is electrically connected to the fourth detection lines 240 on the Y'-direction side. However, the fifth detection line 250 on the Y'-direction side is arranged in spaced relation to the second end potions of the third drive lines 330 in the Y-Y' direction, and accordingly is not electrically connected to the third drive lines 330. The plurality of fifth detection lines 250 is electrically connected to the plurality of first detection lines 210 and the at least one second detection line 220 via through-hole electrodes of the substrate 100. As a result, the fifth detection line 250 on the Y-direction side are electrically connected to the fifth detection line 250 on the Y'-direction side. The fifth detection line 250 on the Y-direction side may intersect the fourth detection line 240 on the Y-direction side. The fifth detection line 250 on the Y'-direction side may intersect the fourth detection line 240 on the Y'-direction side. The plurality of fifth detection lines 250 can be omitted.

The drive electrode 300" may further include a sixth drive line 360. In this case, the sixth drive line 360 has a ring shape or a partially discontinuous ring shape, and is made of a material that is the same or similar to that of the first detection lines 210. The sixth drive line 360 is provided on the second face 110b of the substrate 100 such as to surround the plurality of third drive lines 330, the at least one fourth drive line 340, the plurality of fourth detection lines 240, and the plurality of fifth detection lines 250. The sixth drive line 360 is arranged in spaced relation to the fourth detection line 240 on the YX-direction side, the fourth detection line 240 on the YX'-direction side, the fourth detection line 240 on the Y'X-direction side, the fourth detection line 240 on the Y'X'-direction side, the fifth detection line 250 on the Y-direction side, and the fifth detection line 250 on the Y'-direction side. Accordingly, the sixth drive line 360 is not electrically connected to the plurality of fourth detection lines 240 nor the plurality of fifth detection lines 250. The sixth drive line 360 may, but is not required to, be coupled to the at least one fourth drive line 340. Also, where the fifth drive line 350 is provided, the sixth drive line 360 is electrically connected to the fifth drive line 350 via another through-hole electrode of the substrate 100. The fifth drive line 350 and/or the sixth drive line 360 can be omitted.

Similarly to the controller 500 of the sensor S1, a controller 500 of the sensor S3 is configured to charge and discharge the detection electrode 200" and supply drive pulses to the drive electrode 300". When a detection target approaches the detection electrode 200" while the detection electrode 200" is being charged and discharged, the approach causes a change in a first capacitance between the detection electrode 200" and the detection target. When a detection target approaches the detection electrode 200" and the drive electrode 300" while drive pulses are being supplied to the drive electrode 300" (which may be referred to simply as "during drive pulses supply"), the approach causes a change in a second capacitance between the detection electrode 200" and the drive electrode 300". Similarly to the controller 500 of the sensor S1, the controller 500 of the sensor S3 is further configured to detect the detection target on the basis of the change in the first capacitance between the detection electrode 200" and the detection target and the change in the second capacitance between the detection electrode 200" and the drive electrode 300".

A second capacitance CTXRX of the sensor S3 includes at least a first mutual capacitance, a sixteenth mutual capacitance, and a seventeenth mutual capacitance. The first mutual capacitance is as described above. Since the plurality of fourth detection lines 240 and the plurality of third drive lines 330 are alternately arranged one by one at spaced intervals, during drive pulses supply, a sixteenth mutual capacitance is formed between the third drive lines 330 and the fourth detection lines 240 adjacent thereto. Since the first drive lines 310 are arranged in spaced relation to the at least one second detection line 220 in the Y-Y' direction, during drive pulses supply, a seventeenth mutual capacitance is formed between the first drive lines 310 and the second detection line 220(s).

Where the at least one fourth drive line 340 is provided, the second capacitance CTXRX further includes an eighteenth mutual capacitance. Since the plurality of fourth detection lines 240 are arranged in spaced relation to the at least one fourth drive line 340 in the Y-Y' direction, during drive pulses supply, an eighteenth mutual capacitance is formed between the fourth detection lines 240 and the fourth drive line(s) 340.

Where the fifth drive line 350 is provided, the second capacitance CTXRX further includes a nineteenth mutual capacitance. Since the fifth drive line 350 surrounds the plurality of first detection lines 210 in spaced relation to each other, during drive pulses supply, a nineteenth mutual capacitance is formed between the fifth drive line 350 and the first detection lines 210.

Where the plurality of fifth detection lines 250 are provided, the second capacitance CTXRX further includes a twentieth mutual capacitance. Of the plurality of fifth detection lines 250, the fifth detection line 250 on the Y-direction side is arranged in spaced relation to the first ends of the plurality of third drive lines 330 in the Y-Y' direction, and the fifth detection line 250 on the Y'-direction side is arranged in spaced relation to the second ends of the third drive lines 330 in the Y-Y' direction. Accordingly, during drive pulses supply, a twentieth mutual capacitance is formed between the fifth detection line 250 on the Y-direction side and the first ends of the third drive lines 330 and between the fifth detection line 250 on the Y'-direction side and the second ends of the third drive lines 330.

Where the sixth drive line 360 is provided, the second capacitance CTXRX further includes a twenty-first mutual capacitance. The sixth drive line 360 is arranged in spaced relation to the fourth detection lines 240 on the YX-, YX'-, Y'X- and Y'X'-direction sides and the fifth detection line 250 on the Y- and Y'-direction sides. Accordingly, during drive pulses supply, a twenty-first mutual capacitance is formed between the sixth drive line 360 and the fourth detection line 240 on the YX-direction side, between the sixth drive line 360 and the fourth detection line 240 on the YX'-direction side, between the sixth drive line 360 and the fourth detection line 240 on the Y'X-direction side, between the sixth drive line 360 and the fourth detection line 240 on the Y'X'-direction side, between the sixth drive line 360 and the fifth detection line 250 on the Y-direction side, and between the sixth drive line 360 and the fifth detection line 250 on the Y'-direction side.

The sensor S3 as described above provides the following technical features and effects.

Technical Feature and Effect (1): Each of the first drive lines 310 of the drive electrode 300" is located between adjacent two of the first detection lines 210 of the detection electrode 200" as viewed from the Z-direction side. With this arrangement, a conductor deposit adhering to the detection face is located substantially on the Z-direction side relative to the at least one of the first drive lines 310 and one of the first detection lines 210 adjacent thereto, making it possible to change the first mutual capacitance of the second capacitance CTXRX, formed between the at least one of the first drive lines 310 and the first detection line(s) 210 adjacent thereto. Such change in the first mutual capacitance increases the possibility that the conductor deposit adhering to the detection face changes the second capacitance CTXRX, thereby reducing the possibility that the controller 500 erroneously detects the conductor deposit as a detection target.

Since the plurality of fourth detection lines 240 and the plurality of third drive lines 330 are alternately arranged one by one at spaced intervals, a conductor deposit adhering to the detection face is located substantially on the Z-direction side relative to at least one of the third drive lines 330 and the fourth detection line(s) 240 adjacent thereto, making it possible to change the sixteenth mutual capacitance of the second capacitance CTXRX, formed between the at least one of the third drive lines 330 and the fourth detection line(s) 240 adjacent thereto. Such change in the sixteenth mutual capacitance increases the possibility that the conductor deposit adhering to the detection face changes the second capacitance CTXRX, thereby reducing the possibility that the controller 500 erroneously detects the conductor deposit as a detection target.

Since the plurality of first drive lines 310 are arranged in spaced relation to the at least one second detection line 220 in the Y-Y' direction, a conductor deposit adhering to the detection face is located substantially on the Z-direction side relative to the at least one of the first drive lines 310 and the second detection line or one of the detection lines 220 adjacent thereto, making it possible to change the seventeenth mutual capacitance of the second capacitance CTXRX, formed between the at least one of the first drive line 310 and the second detection line or one of the detection lines 220 adjacent thereto. Such change in the seventeenth mutual capacitance increases the possibility that the conductor deposit adhering to the detection face changes the second capacitance CTXRX, thereby reducing the possibility that the controller 500 erroneously detects the conductor deposit as a detection target.

Where the at least one fourth drive line 340 is provided, the plurality of fourth detection lines 240 are arranged in spaced relation to the at least one fourth drive line 340 in the Y-Y' direction. Accordingly, a conductor deposit adhering to the detection face is located substantially on the Z-direction side relative to at least one of the fourth detection lines 240 and the fourth drive line or one of the fourth drive lines 340 adjacent thereto, making it possible to change the eighteenth mutual capacitance of the second capacitance CTXRX, formed between the at least one of the fourth detection lines 240 and the fourth drive line or one of the fourth drive lines 340 adjacent thereto. Such change in the eighteenth mutual capacitance increases the possibility that the conductor deposit adhering to the detection face changes the second capacitance CTXRX, thereby reducing the possibility that the controller 500 erroneously detects the conductor deposit as a detection target.

Where the fifth drive line 350 is provided, the fifth drive line 350 surrounds the plurality of first detection lines 210 in spaced relation to each other. With this arrangement, a conductor deposit adhering to the detection face is located substantially on the Z-direction side relative to at least one of the first detection lines 210 and the fifth drive line 350, making it possible to change the nineteenth mutual capacitance of the second capacitance CTXRX, formed between the at least one of the first detection line 210 and the fifth drive line 350. Such change in the nineteenth mutual capacitance increases the possibility that the conductor deposit adhering to the detection face changes the second capacitance CTXRX, thereby reducing the possibility that the controller 500 erroneously detects the conductor deposit as a detection target.

Where the plurality of fifth detection lines 250 is provided, of the plurality of fifth detection lines 250, the fifth detection line 250 on the Y-direction side is arranged in spaced relation to the first end portions of the plurality of third drive lines 330 in the Y-Y' direction, and the fifth detection line 250 on the Y'-direction side is arranged in spaced relation to the second end portions of the plurality of third drive lines 330 in the Y-Y' direction. With this arrangement, a conductor deposit adhering to the detection face is located substantially on the Z-direction side relative to at least one of the first end portions of the third drive lines 330 and the fifth detection line 250 on the Y-direction side, and/or relative to at least one of the second end portions of the third drive lines 330 and the fifth detection line 250 on the Y'-direction side. This makes it possible to change the twentieth mutual capacitance of the second capacitance CTXRX, formed between the at least one first end portion of the third drive lines 330 and the fifth detection line 250 on the Y-direction side, and/or between the at least one second end portion of the third drive lines 330 and the fifth detection line 250 on the Y'-direction side. Such change(s) in the twentieth mutual capacitance increases the possibility that the conductor deposit adhering to the detection face changes the second capacitance CTXRX, thereby reducing the possibility that the controller 500 erroneously detects the conductor deposit as a detection target.

Where the sixth drive line 360 is provided, the sixth drive line 360 is arranged in spaced relation to the fourth detection lines 240 on the YX-, YX'-, Y'X- and Y'X'-direction sides and the fifth detection line 250 on the Y- and Y'-direction sides. With this arrangement, a conductor deposit adhering to the detection face is located substantially on the Z-direction side relative to the sixth drive line 360 and at least one line of the fourth detection lines 240 on the YX-, YX'-, Y'X- and Y'X'-direction sides and the fifth detection line 250 on the Y- and Y'-direction sides, making it possible to change the twenty-first mutual capacitance of the second capacitance CTXRX, formed between the sixth drive line 360 and the at least one detection line. Such change(s) in the twenty-first mutual capacitance(s) increases the possibility that the conductor deposit adhering to the detection face changes the second capacitance CTXRX, thereby reducing the possibility that the controller 500 erroneously detects the conductor deposit as a detection target.

Technical Feature and Effect (2): Each of the third drive lines 330 on the second face 110*b* of the substrate 100 overlap a corresponding one of the first detection lines 210 on the first face 110*a* of the substrate 100 and thereby function as an electromagnetic shield to shield the corresponding first detection line 210 from the Z'-direction side. Therefore, the first detection lines 210 are less susceptible to electromagnetic influence from the Z'-direction side. Each of the fourth detection lines 240 on the second face 110*b* of the substrate 100 overlaps the corresponding of first drive lines 310 on the first face 110*a* of the substrate 100 and thereby function as function as an electromagnetic shield to shield the first drive lines 310 from the Z'-direction side. Therefore, the first drive lines 310 are less susceptible to electromagnetic influence from the Z'-direction side. Further, where the at least one fourth drive line 340 is provided, the at least one fourth drive line 340 on the second face 110*b* of the substrate 100 overlaps the at least one second detection line 220 on the first face 110*a* of the substrate 100 and thereby function as an electromagnetic shield to shield the at least one second detection line 220 from the Z'-direction side. Therefore, the at least one second detection line 220 is less susceptible to electromagnetic influence from the Z'-direction side.

Fourth Embodiment

Figure 15A:
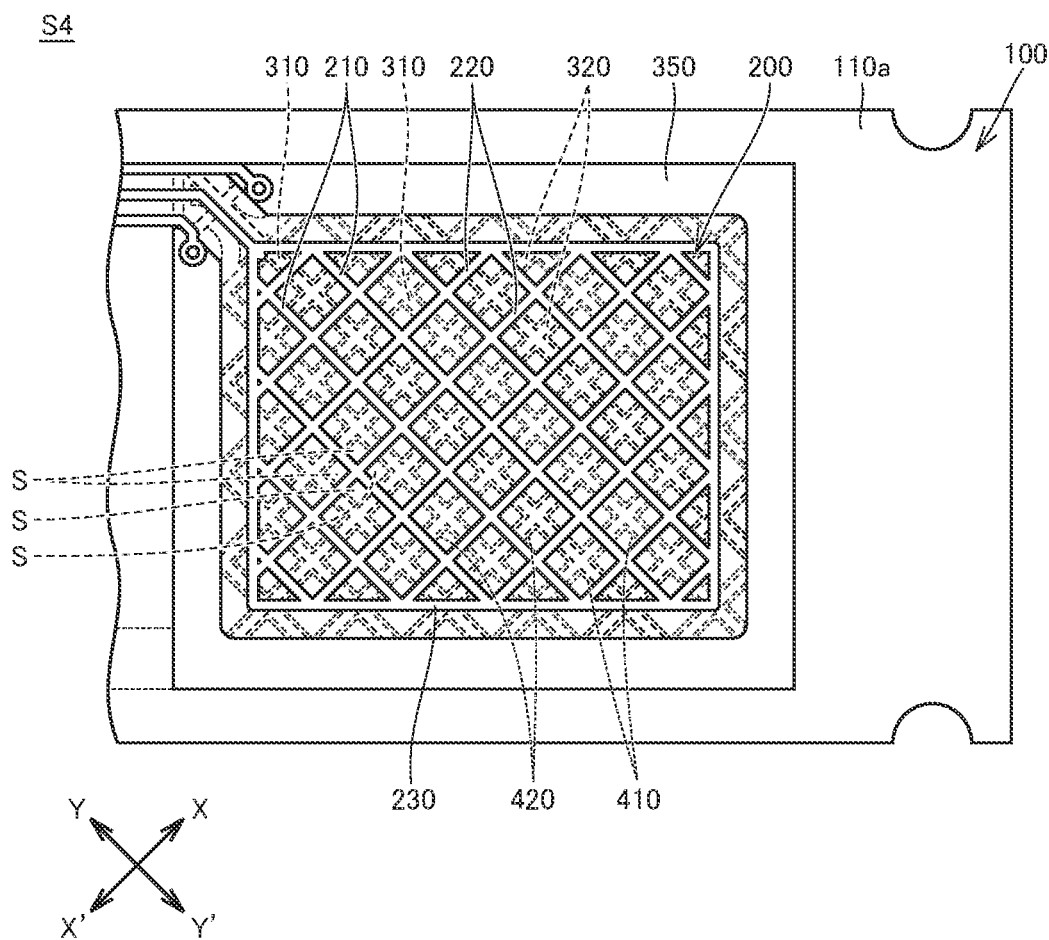
FIG. 15A is a schematic plan view of a capacitive sensor according to a fourth embodiment of the invention, with a substrate of the capacitive sensor shown as transparent, showing a superposition relationship between a detection electrode, a drive electrode, and a ground electrode.
Figure 15B:
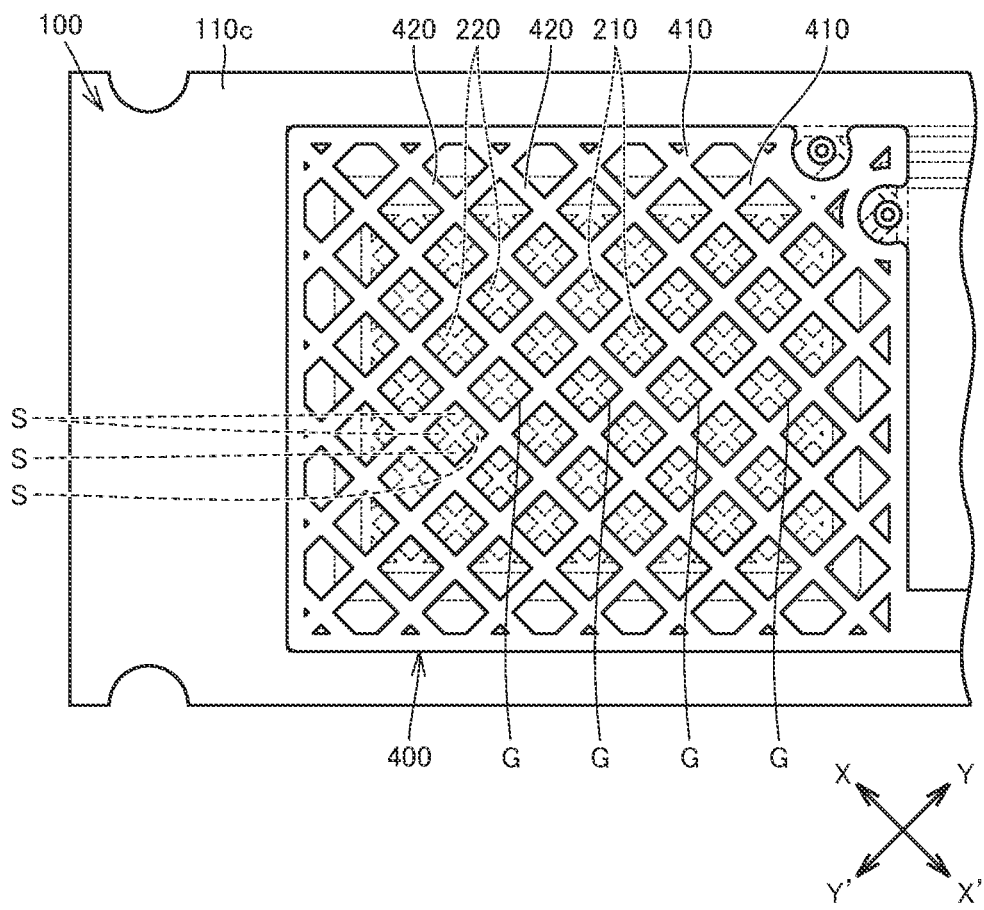
FIG. 15B is a schematic bottom view of the capacitive sensor of the fourth embodiment, with the substrate of the capacitive sensor shown as transparent, showing a superposition relationship between the detection electrode, the drive electrode, and the ground electrode.

Hereinafter described is a capacitive sensor S4 (which may be referred to simply as a sensor S4) according to a plurality of embodiments, including a fourth embodiment and variants thereof, of the invention, with reference to FIGS. 15A and 15B. FIGS. 15A and 15B show the capacitive sensor S4 of the fourth embodiment.

The sensor S4 has a configuration similar to that of the sensor S1 but different in the following points: the first ground lines 410 of the ground electrode 400 overlap the plurality of first drive lines 310 of a drive electrode 300, rather than the plurality of first detection lines 210 of the detection electrode 200, as viewed from the Z-direction side; and the second ground lines 420 of the ground electrode 400 overlap the plurality of second drive lines 320 of the drive electrode 300, rather than the plurality of second detection lines 220 of the detection electrode 200, as viewed from the Z-direction side. These differences will be described in detail, omitting descriptions of the sensor S3 on overlaps with the sensor S1.

The mesh constituted by the plurality of first drive lines 310 and the plurality of second drive lines 320 as viewed from the Z direction has a plurality of clearances (the third clearances), each of which include four spaces S. In other words, there are a plurality of sets of four spaces S. The four spaces S of each set are defined by adjacent two of the first drive lines 310, adjacent two of the second drive lines 320 that intersect the adjacent two first drive lines 310, one of the first detection lines 210 that is located between the adjacent two first drive lines 310, and one of the second detection lines 220 that is located between the adjacent two second drive lines 320.

The mesh constituted the plurality of first ground lines 410 and the plurality of second ground lines 420 has a plurality of clearances (the fourth clearances) being a plurality of gaps G. Each gap G is defined by adjacent two of the first ground lines 410 and adjacent two of the plurality of second ground lines 420 which intersect the adjacent two first ground lines 410. Each gap G is located on the Z'-direction side relative to the four spaces S of the corresponding set.

The sensor S4 as described above provides the same technical features and effects as the technical features and effects (1) and (2) of the sensor S1.

Technical Feature and Effect (3): The plurality of first ground lines 410 and the plurality of second ground lines 420 on the third face 110c of the substrate 100 respectively overlap the plurality of first drive lines 310 and the plurality of second drive lines 320 on the second face 110b of the substrate 100 and thereby function as electromagnetic shields to shield the first and second drive lines 310 and 320 from the Z'-direction side. Therefore, the first and second drive lines 310 and 320 are less susceptible to electromagnetic influence from the Z'-direction side.

Technical Feature and Effect (4): Each gap G is present on the Z'-direction side relative to the four spaces S of the corresponding set. With such arrangement, during drive pulses supply, part of the electric charge from the first and second drive lines 310 and 320 does not move to the gaps G but moves to the adjacent first and second detection lines 210 and 220, suppressing the reduction in the first to fourth mutual capacitances.

It should be appreciated that the capacitive sensor of the invention is not limited to the embodiments described above, but may be modified as appropriate within the scope of the claims (within the disclosure of the invention). Some examples of modification are described below.

The ground electrode 400 of the sensor S1 may further include the at least one fourth ground line 440. The ground electrode 400 of the sensor S1 may further include the plurality of fifth ground lines 450. The ground electrode of any of the above aspects may be connected to the ground of the substrate 100 as described above, but it may electrically float. The sensor S3 may further include the ground electrode 400 or a ground electrode 400'.

The plurality of first ground lines 410 of the sensor S1 or S2 may be provided on the third face 110c of the substrate 100 such as to overlap the plurality of first drive lines 310, rather than the plurality of first detection lines 210, as viewed from the Z-direction side. In this case, two spaces may be provided between adjacent two of the first drive lines 310 and one of the first detections line 210 located therebetween, and a gap between two adjacent first ground lines 410 may be arranged on the Z'-direction side related to the corresponding two spaces.

Means to electrically connect between the detection lines of any of the above aspects are not limited to examples described above, but may be internal lines, such as through-hole electrodes in the substrate or conductive line of the substrate, or external lines, such as lead wires. Means to electrically connect between the drive lines of any of the above aspects are not limited to examples described above, but may be internal lines, such as through-hole electrodes in the substrate or conductive line of the substrate, or external lines, such as lead wires. Means to electrically connect between the ground lines of any of the above aspects are not limited to examples described above, but may be internal lines, such as through-hole electrodes in the substrate or conductive line of the substrate, or external lines, such as lead wires. The detection lines, the drive lines, and/or the ground lines of any of the above aspects are not required to be elongated but may be of any shape.

The controller 500 described above may be only configured to charge and discharge the detection electrode of any of the above aspects, or only configured to supply drive pulses to the drive electrode of any of the above aspects. In this case, the controller 500 may be further configured to detect a detection target on the basis of a change in the first capacitance between the detection electrode of any of the above aspects and the detection target, or on the basis of a change in the second capacitance between the detection electrode of any of the above aspects and the drive electrode of any of the above aspects.

The capacitive sensor of any of the above aspects may include a plurality of detection electrodes and a plurality of drive electrodes of any of the above aspects. In other words, the capacitive sensor of the invention may a touch sensing panel to detect a coordinate position of a touch on a detection face by a detection target. Also, the capacitive sensor of any of the above aspects may be configured to detect the approach of a detection target, rather than detecting a touch on a detection face by a detection target. In this case, the detection face is omitted.

REFERENCE SIGNS LIST

S1, S2, S3, S4: capacitive sensor
100: substrate
110: layer; 110a: first face; 110b: second face; 110c: third face; 130 to 140: through-hole electrode
200, 200', 200": detection electrode
210: first detection line; 220: second detection line; 230: third detection line; 240: fourth detection line; 250: fifth detection line
300, 300', 300": drive electrode
310: first drive line; 320: second drive line; 330: third drive line; 340: fourth drive line; 350: fifth drive line; 360: sixth drive line
400, 400': ground electrode
410: first ground line; 420: second ground line; 430: third ground line; 440: fourth ground line; 450: fifth ground line; 460: sixth ground line; 470: seventh ground line
500: controller
510: analog-to-digital converter (ADC); 520: I/O port; 530 to 550: external pin; CADC: internal capacitor; CRX: external capacitor

What is claimed is:

1. A capacitive sensor comprising:
a substrate including one or a plurality of layers including a first face and a second face that are different from each other in a first direction, the first direction being a thickness direction of the substrate, the or each layer being insulating;
a detection electrode including a plurality of first detection lines, the first detection lines being electrically connected to each other and arrayed at spaced intervals on the first face;
a drive electrode including a plurality of first drive lines electrically connected to each other, each of the first drive lines being arranged on one of the first and second faces such as to be located between adjacent two of the first detection lines as viewed from one side in the first direction; and
a controller being configured to charge and discharge the detection electrode and supply drive pulses to the drive electrode, wherein
when a detection target approaches the detection electrode while the detection electrode is being charged and discharged, the approach causes a change in a first capacitance between the detection electrode and the detection target,
when a detection target approaches the detection electrode and the drive electrode while drive pulses are being supplied to the drive electrode, the approach causes a change in a second capacitance between the detection electrode and the drive electrode, and
the controller is further configured to detect the detection target on the basis of changes in the first and second capacitances.

2. The capacitive sensor according to claim 1, wherein
the detection electrode further includes at least one second detection line electrically connected to the first detection lines, and
the at least one second detection line is arranged on one of the first and second faces.

3. The capacitive sensor according to claim 2, wherein
the drive electrode further includes at least one second drive line electrically connected to the first drive lines, and
the at least one second drive line is arranged on one of the first and second faces.

4. The capacitive sensor according to claim 3, wherein
the first detection lines extend in a second direction and are arrayed at spaced intervals in a third direction, the second direction being substantially orthogonal to the first direction, the third direction being substantially orthogonal to the first direction and intersecting the second direction,
the at least one second detection line comprises a plurality of second detection lines extending in the third direction, being arranged on the first face at spaced intervals in the second direction, and intersecting the first detection lines,
the first drive lines extend in the second direction and are arranged on the second face at spaced intervals in the third direction, and
the at least one second drive line comprises a plurality of second drive lines extending in the third direction and being arranged on the second face such as to be each located between adjacent two of the second detection lines as viewed from the one side in the first direction and intersect the first drive lines.

5. The capacitive sensor according to claim 1, wherein
the drive electrode further includes at least one third drive line electrically connected to the first drive lines and the at least one second drive line, and
the at least one third drive line are arranged on the second face such as to extend along, and overlap as viewed from the one side in the first direction, at least one of the first detection lines.

6. The capacitive sensor according to claim 5, wherein
the drive electrode further includes at least one fourth drive line electrically connected to the first drive lines, the at least one second drive line, and the at least one third drive line,
the at least one second detection line is arranged on the first face, and
the at least one fourth drive line is arranged on the second face such as to overlap at least one of the at least one second detection line as viewed from the one side in the first direction.

7. The capacitive sensor according to claim 5, wherein
the at least one third drive line comprises a plurality of third drive lines arranged on the second face such as to overlap the corresponding first detection lines as viewed from the one side in the first direction, and
the third drive lines and the first drive lines are arranged alternately in an array direction thereof.

8. The capacitive sensor according to claim 6, wherein
the at least one second detection line comprises a plurality of second detection lines,
the at least one fourth drive line comprises a plurality of fourth drive lines arranged on the second face such as to overlap the corresponding second detection lines as viewed from the one side in the first direction, and
the fourth drive lines and the second drive lines are arranged alternately in an array direction thereof.

9. The capacitive sensor according to claim 3, wherein
the first detection lines extend in a second direction and are arrayed at spaced intervals in a third direction, the second direction being substantially orthogonal to the first direction, the third direction being substantially orthogonal to the first direction and intersecting the second direction,
each of the first detection lines includes a first end on one side in the second direction and a second end on the other side in the second direction, the first detection lines include a first detection line on one side in the third direction, which is one of the first detection lines that is located on the most one side in the third direction, and a first detection line on the other side in the third direction, which is one of the first detection lines that is located on the most other side in the third direction, the at least one second detection line comprises a pair of second detection lines being arranged on the first face and including one second detection line and the other second detection line, the one second detection line is coupled to the first end of each of the first detection lines, and the other second detection line is coupled to the second ends of the first detection lines, the at least one second drive line includes a main body having a ring shape or a partially discontinuous ring shape and being provided on the second face, the main body includes a first portion being an inner perimeter portion of the main body, and the first portion of the main body is located such as to overlap the first detection line on the one side in the third direction, the first detection line on the other side in the third direction, and the pair of second detection lines as viewed from the one side in the first direction.

10. The capacitive sensor according to claim 9, wherein the first drive lines are arranged on the first face and each have a first end on the one side in the second direction and a second end on the other side in the second direction, the at least one second drive line further includes a plurality of first connecting portions and a plurality of second connecting portions, each of the first connecting portions extends on the second face, from the first portion of the main body to a position on the other side in the first direction relative to the first end of a corresponding one of the first drive lines, and a distal end of each of the first connecting portions is connected to the first end of the corresponding first drive line via a through-hole electrode of the substrate, and each of the second connecting portions extends on the second face, from the first portion of the main body to a position on the other side in the first direction relative to the second end of a corresponding one of the first drive lines, and a distal end of each of the second connecting portions is connected to the second end of the corresponding first drive line via another through-hole electrode of the substrate.

11. The capacitive sensor according to claim 1, wherein the layers of the substrate further include a third face, the third face being different from the first and second faces in the first direction and arranged on the other side in the first direction relative to the second face, the detection electrode further includes a plurality of second detection lines, the first detection lines and the second detection lines mutually intersect forming a mesh pattern on the first face and are mutually electrically connected at intersections thereof, the mesh constituted by the first detection lines and the second detection lines has a plurality of first clearances as viewed from the one side in the first direction, each of the first clearances including four spaces, the four spaces of each first clearance are defined by adjacent two of the first detection lines, adjacent two of the second detection lines that intersect the adjacent two first detection lines, one of the first drive lines that is located between the adjacent two first detection lines, and one of the second drive lines that is located between the adjacent two second detection lines, the capacitive sensor further comprises a ground electrode including a plurality of first ground lines and a plurality of second ground lines, the first ground lines and the second ground lines mutually intersect forming a mesh pattern on the third face and are mutually electrically connected at intersections thereof, the first ground lines are arranged such as to overlap the respective first detection lines as viewed from the one side in the first direction, and the second ground lines are arranged such as to overlap the respective second detection lines as viewed from the one side in the first direction, the mesh constituted by the first ground lines and the second ground lines has a plurality of second clearances being a plurality of gaps, and each gap is defined by adjacent two of the first ground lines and adjacent two of the second ground lines that intersect the adjacent two first ground lines, and is located on the other side in the first direction relative to the four spaces of a corresponding one of the first clearances.

12. The capacitive sensor according to claim 1, wherein the layers of the substrate further include a third face, the third face being different from the first and second faces in the first direction and arranged on the other side in the first direction relative to the second face, the detection electrode further includes a plurality of second detection lines, the first detection lines and the second detection lines mutually intersect forming a mesh pattern on the first face and are mutually electrically connected at intersections thereof, the mesh constituted by the first drive lines and the second drive lines has a plurality of third clearances as viewed from the one side in the first direction, each of the third clearances including four spaces, the four spaces of each third clearance are defined by adjacent two of the first drive lines, adjacent two of the second drive lines that intersect the adjacent two first drive lines, one of the first detection lines that is located between the adjacent two first drive lines, and one of the second detection lines that is located between the adjacent two second drive lines, the capacitive sensor further comprises a ground electrode including a plurality of first ground lines and a plurality of second ground lines, the first ground lines and the second ground lines mutually intersect forming a mesh pattern on the third face and are mutually connected electrically at intersections thereof, the first ground lines are arranged such as to overlap the respective first drive lines as viewed from the one side in the first direction, and the second ground lines are arranged such as to overlap the respective second drive lines as viewed from the one side in the first direction, the mesh constituted by the first ground lines and the second ground lines has a plurality of fourth clearances being a plurality of gaps, and each gap is defined by adjacent two of the first ground lines and adjacent two of the second ground lines that intersect the adjacent two first ground lines, and is located on the other side in the first direction relative to the four spaces of a corresponding one of the third clearances.

13. The capacitive sensor according to claim 1, wherein
two spaces are provided between adjacent two of the first detection lines and one of the first drive lines that is located between the adjacent two first detection lines, or alternatively between adjacent two of the first drive lines and one of the first detection lines that is located between the adjacent two first drive lines, as viewed from the one side in the first direction,
the layers of the substrate further include a third face, the third face being different from the first and second faces in the first direction and arranged on the other side in the first direction relative to the second face,
the capacitive sensor further comprises a ground electrode including a plurality of first ground lines electrically connected to each other,
the first ground lines are arranged on the third face such as to overlap the respective first detection lines or the respective first drive lines as viewed from the one side in the first direction,
a gap is provided between adjacent two of the first ground lines and located on the other side in the first direction relative to the corresponding two spaces.

14. The capacitive sensor according to claim 1, wherein
the detection electrode further includes a third detection line,
the third detection line has a ring shape or a partially discontinuous ring shape, is arranged on the first face such as to surround at least the first detection lines, and is coupled to opposite ends in a longitudinal direction of the first detection lines,
the drive electrode further includes a fifth drive line,
the fifth drive line has a ring shape or a partially discontinuous ring shape, is electrically connected to the first drive lines, and is arranged on the first face such as to surround the third detection line,
the capacitive sensor further comprises a ground electrode including a third ground line,
the third ground line has a ring shape or a partially discontinuous ring shape, and is arranged on the first face such as to surround the fifth drive line.

15. The capacitive sensor according to claim 1, wherein
the layers of the substrate further include a third face, the third face being different from the first and second faces in the first direction and arranged on the other side in the first direction relative to the second face,
two spaces are provided between adjacent two of the first detection lines and one of the first drive lines that is located between the adjacent two first detection lines,
the capacitive sensor further comprises a ground electrode, the ground electrode includes:
  a plurality of first ground lines arranged on the third face such as to overlap the respective first detection lines as viewed from the one side in the first direction, and
  at least one fourth ground line electrically connected to the first ground lines and arranged on the third face such as to overlap at least one of the first drive lines as viewed from the one side in the first direction, the or each fourth ground line being located between adjacent two of the first ground lines with gaps between the or each fourth ground line and two of the first ground lines adjacent thereto, and
the gaps are located on the other side in the first direction relative to the spaces.

16. The capacitive sensor according to claim 1, wherein
the layers of the substrate further include a third face, the third face being different from the first and second faces in the first direction and arranged on the other side in the first direction relative to the second face,
the capacitive sensor further comprises a ground electrode including a plurality of sixth ground lines and a plurality of seventh ground lines,
the sixth ground lines and the seventh ground lines mutually intersect forming a mesh pattern on the third face and are mutually connected electrically at intersections thereof,
the sixth ground lines include:
  a plurality of first ground lines arranged on the third face such as to overlap the respective first detection lines as viewed from the one side in the first direction, and
  a plurality of fourth ground lines arranged on the third face such as to overlap the respective first drive lines as viewed from the one side in the first direction,
two spaces are provided between adjacent two of the first detection lines and one of the first drive lines that is located between the adjacent two first detection lines as viewed from the one side in the first direction, and
the mesh constituted by the sixth ground lines and the seventh ground lines has a plurality of clearances being a plurality of gaps, and
the gaps include a plurality of gaps located between adjacent two of the first and fourth ground lines and located on the other side in the first direction relative to the spaces.

17. The capacitive sensor according to claim 13, wherein
the detection electrode further includes at least one second detection line,
the at least one second detection line is electrically connected to the first detection lines and arranged on one of the first and second faces,
the ground electrode further includes at least one second ground line, and
the at least one second ground line electrically connected to the first ground lines and arranged on the third face such as to overlap the at least one second detection line as viewed from the one side in the first direction.

18. The capacitive sensor according to claim 14, wherein
the detection electrode further includes at least one second detection line,
the at least one second detection line is electrically connected to the first detection lines and arranged on one of the first and second faces,
the ground electrode further includes at least one second ground line, and
the at least one second ground line electrically connected to the first ground lines and arranged on the third face such as to overlap the at least one second detection line as viewed from the one side in the first direction.

19. The capacitive sensor according to claim 15, wherein
the detection electrode further includes at least one second detection line,
the at least one second detection line is electrically connected to the first detection lines and arranged on one of the first and second faces,
the ground electrode further includes at least one second ground line, and
the at least one second ground line electrically connected to the first ground lines and arranged on the third face such as to overlap the at least one second detection line as viewed from the one side in the first direction.

20. The capacitive sensor according to claim 2, wherein
the first detection lines extend in a second direction and are arrayed at spaced intervals in a third direction, the second direction being substantially orthogonal to the first direction, the third direction being substantially orthogonal to the first direction and intersecting the second direction, the at least one second detection line extends in the third direction and intersects the first detection lines on the first face, the first drive lines are arranged on the first face and extend in the second direction, the detection electrode further includes a plurality of fourth detection lines and at least one fifth detection line, the first detection lines, the at least one second detection line, the fourth detection lines, and the at least one fifth detection line are mutually connected electrically, the fourth detection lines extend in the second direction and are arranged on the second face such as to overlap the respective first drive lines as viewed from the one side in the first direction, and the at least one fifth detection line extends in the third direction and intersects the fourth detection lines on the second face.

21. The capacitive sensor according to claim 20, wherein the drive electrode further includes at least one third drive line, and the at least one third drive line are electrically connected to the first drive lines, extends along at least one of the first detection lines, and is arranged on the second face such as to overlap the at least one first detection line as viewed from the one side in the first direction.

22. The capacitive sensor according to claim 21, wherein the drive electrode further includes at least one fourth drive line, and the at least one fourth drive line is electrically connected to the first drive lines and the at least one third drive line and arranged on the second face such as to overlap at least one of the at least one second detection line as viewed from the one side in the first direction.

* * * * *